(12) United States Patent
Thendean et al.

(10) Patent No.: US 7,870,182 B2
(45) Date of Patent: Jan. 11, 2011

(54) DIGITAL SIGNAL PROCESSING CIRCUIT HAVING AN ADDER CIRCUIT WITH CARRY-OUTS

(75) Inventors: John M. Thendean, Berkeley, CA (US); Jennifer Wong, Fremont, CA (US); Bernard J. New, Carmel Valley, CA (US); Alvin Y. Ching, Sunnyvale, CA (US); James M. Simkins, Park City, UT (US); Anna Wing Wah Wong, Santa Clara, CA (US); Vasisht Mantra Vadi, San Jose, CA (US)

(73) Assignee: Xilinx Inc., San Jose, CA (US)

( * ) Notice: Subject to any disclaimer, the term of this patent is extended or adjusted under 35 U.S.C. 154(b) by 1063 days.

(21) Appl. No.: 11/433,517

(22) Filed: May 12, 2006

(65) Prior Publication Data

US 2006/0230096 A1    Oct. 12, 2006

Related U.S. Application Data

(63) Continuation-in-part of application No. 11/408,364, filed on Apr. 21, 2006, which is a continuation-in-part of application No. 11/019,783, filed on Dec. 21, 2004, now Pat. No. 7,472,155.

(60) Provisional application No. 60/533,280, filed on Dec. 29, 2003.

(51) Int. Cl.
*G06F 7/50* (2006.01)

(52) U.S. Cl. ..................................... 708/708

(58) Field of Classification Search ........................ None
See application file for complete search history.

(56) References Cited

U.S. PATENT DOCUMENTS

| 4,041,461 | A |   | 8/1977 | Kratz et al. |
| 4,075,688 | A |   | 2/1978 | Lynch et al. |
| 4,541,048 | A | * | 9/1985 | Propster et al. ............... 712/32 |

(Continued)

FOREIGN PATENT DOCUMENTS

GB    2 365 636 A    2/2002

(Continued)

OTHER PUBLICATIONS

U.S. Appl. No. 11/019,518, filed Dec. 21, 2004, Simkins et al.
U.S. Appl. No. 11/059,967, filed Feb. 17, 2005, Vadi.
Altera; "Using PLDs for High-Performance DSP Applications"; White Paper, WP-STXDSP-1.0; Feb. 2002, Ver. 1.0; Preliminary Information; pp. 1-6.

(Continued)

*Primary Examiner*—David H Malzahn

(57) ABSTRACT

An integrated circuit having a digital signal processing (DSP) circuit is disclosed. The DSP circuit includes: a plurality of multiplexers receiving a first set, second set, and third set of input data bits, where the plurality of multiplexers are coupled to a first opcode register; a bitwise adder coupled to the plurality of multiplexers for generating a sum set of bits and a carry set of bits from bitwise adding together the first, second, and third set of input data bits; and a second adder coupled to the bitwise adder for adding together the sum set of bits and carry set of bits to produce a summation set of bits and a plurality of carry-out bits, where the second adder is coupled to a second opcode register.

20 Claims, 43 Drawing Sheets

U.S. PATENT DOCUMENTS

| | | | |
|---|---|---|---|
| 4,638,450 A | 1/1987 | Stoffers |
| 4,639,888 A | 1/1987 | Nussbaecher |
| 4,665,500 A | 5/1987 | Poland |
| 4,680,628 A | 7/1987 | Wojcik et al. |
| 4,755,962 A | 7/1988 | Mor |
| 4,779,220 A | 10/1988 | Nukiyama |
| 4,780,842 A | 10/1988 | Morton et al. |
| 5,095,523 A | 3/1992 | Delaruelle et al. |
| 5,317,530 A | 5/1994 | Toriumi |
| 5,329,460 A | 7/1994 | Agrawal et al. |
| 5,339,264 A | 8/1994 | Said et al. |
| 5,349,250 A | 9/1994 | New |
| 5,359,536 A | 10/1994 | Agrawal et al. |
| 5,388,062 A | 2/1995 | Knutson |
| 5,450,056 A | 9/1995 | Jens |
| 5,450,339 A | 9/1995 | Chester et al. |
| 5,455,525 A | 10/1995 | Ho et al. |
| 5,506,799 A | 4/1996 | Nakao |
| 5,524,244 A | 6/1996 | Robinson et al. |
| RE35,311 E | 8/1996 | Vassiliadis et al. |
| 5,570,306 A | 10/1996 | Soo |
| 5,572,207 A | 11/1996 | Harding et al. |
| 5,600,265 A | 2/1997 | El Gamal et al. |
| 5,606,520 A | 2/1997 | Gove et al. |
| 5,630,160 A | 5/1997 | Simpson et al. |
| 5,642,382 A | 6/1997 | Juan |
| 5,724,276 A | 3/1998 | Rose et al. |
| 5,727,225 A | 3/1998 | Guttag et al. |
| 5,732,004 A | 3/1998 | Brown |
| 5,754,459 A | 5/1998 | Telikepalli |
| 5,805,913 A | 9/1998 | Guttag et al. |
| 5,809,292 A | 9/1998 | Wilkinson et al. |
| 5,828,229 A | 10/1998 | Ahanin et al. |
| 5,835,393 A | 11/1998 | Melanson et al. |
| 5,838,165 A | 11/1998 | Chatter |
| 5,880,671 A | 3/1999 | Ranson et al. |
| 5,883,525 A | 3/1999 | Tavana et al. |
| 5,896,307 A | 4/1999 | Volkonsky |
| 5,905,661 A | 5/1999 | Volkonsky |
| 5,914,616 A | 6/1999 | Young et al. |
| 5,923,579 A * | 7/1999 | Widigen et al. ............. 708/706 |
| 5,933,023 A | 8/1999 | Young |
| 5,943,250 A * | 8/1999 | Kim et al. .................. 708/625 |
| 5,948,053 A | 9/1999 | Kamiya |
| 6,000,835 A | 12/1999 | Pan et al. |
| 6,014,684 A | 1/2000 | Hoffman |
| 6,038,583 A | 3/2000 | Oberman et al. |
| 6,044,392 A | 3/2000 | Anderson et al. |
| 6,069,490 A | 5/2000 | Ochotta et al. |
| 6,100,715 A | 8/2000 | Agrawal et al. |
| 6,108,343 A | 8/2000 | Cruickshank et al. |
| 6,112,019 A | 8/2000 | Chamdani et al. |
| 6,125,381 A | 9/2000 | Paysan |
| 6,131,105 A | 10/2000 | Pajarre et al. |
| 6,134,574 A | 10/2000 | Oberman et al. |
| 6,154,049 A | 11/2000 | New |
| 6,204,689 B1 | 3/2001 | Percey et al. |
| 6,223,198 B1 | 4/2001 | Oberman et al. |
| 6,243,808 B1 | 6/2001 | Wang |
| 6,249,144 B1 | 6/2001 | Agrawal et al. |
| 6,260,053 B1 | 7/2001 | Maulik et al. |
| 6,269,384 B1 | 7/2001 | Oberman |
| 6,282,627 B1 | 8/2001 | Wong et al. |
| 6,282,631 B1 | 8/2001 | Arbel |
| 6,288,566 B1 | 9/2001 | Hanrahan et al. |
| 6,298,366 B1 | 10/2001 | Gatherer et al. |
| 6,298,472 B1 | 10/2001 | Phillips et al. |
| 6,311,200 B1 | 10/2001 | Hanrahan et al. |
| 6,323,680 B1 | 11/2001 | Pedersen et al. |
| 6,341,318 B1 | 1/2002 | Dakhil |
| 6,347,346 B1 | 2/2002 | Taylor |
| 6,349,346 B1 | 2/2002 | Hanrahan et al. |
| 6,362,650 B1 | 3/2002 | New et al. |
| 6,366,943 B1 | 4/2002 | Clinton |
| 6,370,596 B1 | 4/2002 | Dakhil |
| 6,374,312 B1 | 4/2002 | Pearce et al. |
| 6,385,751 B1 | 5/2002 | Wolf |
| 6,389,579 B1 | 5/2002 | Phillips et al. |
| 6,392,912 B1 | 5/2002 | Hanrahan et al. |
| 6,397,238 B2 | 5/2002 | Oberman et al. |
| 6,405,298 B1 | 6/2002 | Zeng |
| 6,421,698 B1 | 7/2002 | Hong |
| 6,434,584 B1 | 8/2002 | Henderson et al. |
| 6,438,570 B1 | 8/2002 | Miller |
| 6,448,808 B2 | 9/2002 | Young et al. |
| 6,449,708 B2 | 9/2002 | Dewhurst et al. |
| 6,457,116 B1 | 9/2002 | Mirsky et al. |
| 6,483,343 B1 | 11/2002 | Faith et al. |
| 6,496,918 B1 | 12/2002 | DeHon et al. |
| 6,519,674 B1 | 2/2003 | Lam et al. |
| 6,526,430 B1 | 2/2003 | Hung et al. |
| 6,526,557 B1 | 2/2003 | Young et al. |
| 6,530,010 B1 | 3/2003 | Hung et al. |
| 6,538,470 B1 | 3/2003 | Langhammer et al. |
| 6,539,477 B1 | 3/2003 | Seawright |
| 6,556,044 B2 | 4/2003 | Langhammer et al. |
| 6,567,835 B1 | 5/2003 | Blomgren et al. |
| 6,573,749 B2 | 6/2003 | New et al. |
| 6,631,508 B1 | 10/2003 | Williams |
| 6,693,455 B2 | 2/2004 | Langhammer et al. |
| 6,732,132 B2 | 5/2004 | Sogo |
| 6,742,013 B2 | 5/2004 | Griesemer |
| 6,745,319 B1 | 6/2004 | Balmer et al. |
| 6,754,689 B2 | 6/2004 | Bhushan et al. |
| 6,820,102 B2 | 11/2004 | Aldrich et al. |
| 6,864,714 B2 | 3/2005 | Digari |
| 6,873,182 B2 | 3/2005 | Mohan et al. |
| 6,904,446 B2 | 6/2005 | Dibrino |
| 6,920,627 B2 | 7/2005 | Blodget et al. |
| 6,925,480 B2 | 8/2005 | Duborgel |
| 6,947,916 B2 | 9/2005 | Luo et al. |
| 7,116,663 B2 | 10/2006 | Liao |
| 7,124,156 B2 | 10/2006 | Yang et al. |
| 7,124,160 B2 | 10/2006 | Saulsbury et al. |
| 7,129,762 B1 | 10/2006 | Vadi |
| 7,142,010 B2 | 11/2006 | Langhammer et al. |
| 7,174,432 B2 | 2/2007 | Howard et al. |
| 7,178,130 B2 | 2/2007 | Chuang et al. |
| 7,193,433 B1 | 3/2007 | Young |
| 7,194,598 B2 | 3/2007 | Jacob |
| 7,194,605 B2 | 3/2007 | Ramchandran |
| 7,197,686 B2 | 3/2007 | Box et al. |
| 7,218,139 B1 | 5/2007 | Young et al. |
| 7,225,279 B2 | 5/2007 | Scheuermann |
| 7,249,242 B2 | 7/2007 | Ramchandran |
| 7,340,562 B2 | 3/2008 | Ramchandran |
| 7,353,243 B2 | 4/2008 | Scheuermann |
| 7,353,516 B2 | 4/2008 | Heidari-Bateni et al. |
| 7,433,909 B2 | 10/2008 | Scheuermann |
| 7,467,175 B2 | 12/2008 | Simkins et al. |
| 7,467,177 B2 | 12/2008 | Simkins et al. |
| 7,472,155 B2 | 12/2008 | Simkins et al. |
| 7,480,690 B2 | 1/2009 | Simkins et al. |
| 7,483,420 B1 | 1/2009 | Esposito |
| 7,502,915 B2 | 3/2009 | Jacob |
| 7,580,963 B2 | 8/2009 | Kawano et al. |
| 7,689,640 B2 | 3/2010 | Renno et al. |
| 2002/0019925 A1 | 2/2002 | Dewhurst et al. |
| 2002/0138538 A1 | 9/2002 | Talwar et al. |
| 2002/0138716 A1 | 9/2002 | Master et al. |
| 2003/0033342 A1 | 2/2003 | Griesemer |
| 2003/0055861 A1 | 3/2003 | Lai et al. |
| 2003/0105793 A1 | 6/2003 | Guttag et al. |
| 2003/0105949 A1 | 6/2003 | Master et al. |

| | | | |
|---|---|---|---|
| 2003/0140077 | A1 | 7/2003 | Zaboronski et al. |
| 2003/0154357 | A1 | 8/2003 | Master et al. |
| 2004/0083250 | A1 | 4/2004 | Kiuchi et al. |
| 2004/0158600 | A1 | 8/2004 | Markstein et al. |
| 2004/0181614 | A1 | 9/2004 | Furtek |
| 2005/0038984 | A1 | 2/2005 | Heidari-Bateni et al. |
| 2005/0144210 | A1 | 6/2005 | Simkins et al. |
| 2005/0187998 | A1 | 8/2005 | Zheng et al. |
| 2006/0004902 | A1 | 1/2006 | Simanapalli et al. |
| 2006/0015701 | A1 | 1/2006 | Hogenanauer |
| 2006/0064449 | A1 | 3/2006 | Nakamura et al. |
| 2006/0190516 | A1 | 8/2006 | Simkins et al. |
| 2006/0190518 | A1 | 8/2006 | Ekner et al. |
| 2006/0195496 | A1 | 8/2006 | Vadi et al. |
| 2006/0206557 | A1 | 9/2006 | Wong et al. |
| 2006/0212499 | A1 | 9/2006 | New et al. |
| 2006/0218216 | A1 | 9/2006 | Langhammer et al. |
| 2006/0230092 | A1 | 10/2006 | Ching et al. |
| 2006/0230093 | A1 | 10/2006 | New et al. |
| 2006/0230094 | A1 | 10/2006 | Simkins et al. |
| 2006/0230095 | A1 | 10/2006 | Simkins et al. |
| 2006/0253516 | A1 | 11/2006 | Gangwal et al. |
| 2006/0269054 | A1 | 11/2006 | Dror et al. |
| 2006/0288069 | A1 | 12/2006 | Simkins et al. |
| 2006/0288070 | A1 | 12/2006 | Vadi et al. |
| 2006/0294175 | A1 | 12/2006 | Koob et al. |

FOREIGN PATENT DOCUMENTS

| | | | |
|---|---|---|---|
| GB | 2 373 883 | A | 10/2002 |
| GB | 2 383 435 | A | 6/2003 |
| WO | WO 01/89091 | A3 | 11/2001 |
| WO | WO 2005/066832 | A3 | 7/2005 |
| WO | WO 2005/110049 | A1 | 11/2005 |

OTHER PUBLICATIONS

Leitung: Prof. Dr. Miroslaw Malek; Humbolt-Universitat Zu Berlin, Institut for Informatik; Lecture 12; "ALU (3)—Division Algorithms"; Sommersemester 2002; available from www.informatik.hu-berlin.ed/tok/ca; pp. 1-15.

Xilinx, Inc.; "FPGAs and DSP"; available from Xilinx, Inc., 2100 Logic Drive, San Jose, CA 95124, pp. 1-8.

Gary Harmon; "Silicon Arithmetic with a 40% Advantage"; White Paper; AutoPD; pp. 1-3.

Herma Dhanesha et al.; "Array-of-arrays Architecture for Parallel Floating Point Multiplication"; Center for Integrated Systems, Stanford University, Stanford, CA; pp. 1-8.

"Computer Representation of Numbers" pp. 1-4.

Yong Chgin Lim; "An Efficient Bit-Serial FIR Filter Architecture"; supported by Office of Naval Research under Grant N00014-89-J1327, NSF Grant ECS87-13598, by an AT&T Bell Laboratories Graduate Fellowship and by University of Kansas General Research Allocation 3775-20-0038; Presented at ICASSp-90 in Albuquerque, New Mexico; pp. 1-13.

Alliance Core; "ARC 32-Bit Configurable RISC/DSP Processor"; Jul. 3, 2000; Product Specification; ARC International; AR House, United Kingdom; pp. 1-7.

Satish Mohanakrishnan et al.; "Automatic Implementation of FIR Filters on Field Programmable Gate Arrays"; Oct. 7, 1993; supported by Kansas Technology Enterprise Corp; pp. 1-12.

Zhijun Huang et al.; "Low Power Array Multiplier Design by Topology Optimization"; pp. 1-12.

Robert McIlhenny et al.; "On the Implementation of a Three-Operand Multiplier"; pp. 1-5.

M. Nicolaidis et al.; "Design of Fault-Secure Parity-Prediction Booth Multipliers"; pp. -18.

BDTi, Berkeley Design Technology, Inc.; "Choosing a DSP Processor"; 1996-2000 Berkeley Design Technology, Inc.; pp. 1-8.

Joseph B. Evans; "Efficient FIR Filter Architectures Suitable for FPGA Implementation"; presented at ISCAS '93 in Chicago, Illinois; pp. 1-6.

BDTi; "Evaluating FPGAs for Communication Infrastructure Applications"; 2002 Berkeley Design Technology, Inc.; SDR Forum; Nov. 2002 Conference; pp. 1-6.

Jennifer Eyre et al..; "The Evolution of DSP Processors"; a BDTi Whtie Paper; Copyright 2000 Berkeley Design Technology, Inc.; pp. 1-9.

Arithmatica; "A+ Fast Carry-Propagate for Adders"; downloaded from http://www.arithmatica.com/aplus.html on Nov. 10, 2003; pp. 1-2.

Arithmatica; "Contact Arithmatica"; downloaded from http://www.arithmatica.com/aplus.html on Nov. 10, 2003; pp. 1.

Rafael Fried; "Algorithms for Power Consumption Reduction and Speed Enhancement in High-Performance Parallel Multipliers"; PATMOS-97; Seventh International Workshop Program; downloaded from http://www.dice.uci.ac.be/anmarie/patmos/papers/S2/2_1.html on Nov. 10, 2003; pp. 1-11.

Drew Wilson; "Chameleon Takes on FPGAs, ASICs"; Electronic News; Oct. 29, 2004; downloaded from http://www.reed-electronics.com/electronicnews/article/CA50551?pubdate=10%2F16%2... on Oct. 29, 2004; pp. 1-6.

Jim Simkins et al.; "A Reconfigurable VME Spread-Spectrum LPI (Low Probability of Intercept) Datalink Receiver/Transmitter Implemented via Reconfigurable DSP Hardware"; IEEE Transactions on Acoustics, Speech, and Signal Processing, vol: ASSP-29, No. 2; Apr. 1981; pp. 1-14.

Chi-Jui Chou et al.; "FPGA Implementation of Digital Filters"; ICSPAT '93; pp. 1-9.

Gregory Ray Goslin; "A Guide to Using Field Programmable Gate Arrays (FPGAs) for Application-Specific Digital Signal Processing Performance"; 1995 Xilinx, Inc.; V.1.0; pp. 1-11.

Stephen J. Bradshaw; "Building a Better DSP Mousetrap: FPGAs, DSP Processors, or a combination of both?"; Copyright 2001 Traquair Data Systems, Inc.; rev. 1.1; Nov. 1, 2001; available from www.traquair.com.; pp. 1-6.

Hyeong Seok Yu et al.; "Low Area CMOS Multiplication Using Booth Algorithm for IEEE 754 Floating Point Standard"; pp. 1-5.

Robert D. Tumey et al.; "Modeling and Implementation of DSP FPGA Solutions"; pp. 1-16.

University of Patras—DCT-Hellas; "ESD Best Practice: Pilot Action for Low Power Design—SOFLOPO Low Power Software Development for Embedded Applications"; May 1998; pp. 1-100.

Behrooz Parhami et al.; "Parallel Architectures and Adaptation Algorithms for Programmable FIR Digital Filters with Fully Pipelined Data and Control Flows"; Journal of Information Science and Engineering 19, 59-74 (2003); Received Sep. 28, 2001; accepted Apr. 15, 2002; pp. 59-74.

Edward A. Lee; "Programmable DSP Architectures: Part II"; IEEE ASSP Magazine; Jan. 1989; pp. 4-14.

Keith Reeves et al.; "Reconfigurable Hardware Accelerator for Embedded DSP"; pp. 929-933.

Guy Even et al.; "A Comparison of Three Rounding Algorithms for IEEE Floating-Point Multiplication"; Aug. 29, 1998; pp. 1-28.

Gordana Jovanovic-Dolecek et al.; "Design of FIR Lowpass Filters Using Stepped Triangular Approximation"; pp. 1-4.

Naji s. Ghazal et al.; "Retargetable Estimation for DSP Architecture Selection"; Tampere Technology Seminar—Nov. 1999; available from http://www-cad.eecs.berkeley.edu/~naji/Research/; pp. 1-33.

Altera; "FPGAs Provide Reconfigurable DSP Solutions"; White Paper; WP-FPGA/DSP-1.0; Aug. 2002, ver. 1.0; pp. 1-6.

Russell J. Peterson; "An Assessment of the Suitability of Reconfigurable Systems for Digital Signal Processing"; A Thesis Submitted to the Department of Electrical and Computer Engineering Brigham Young University; Sep. 27, 1995; pp. 1-138.

Steven K. Knapp; "Using Programmable Logic to Accelerate DSP Functions"; Copyright 1995 by Xilinx, Inc.; available from http://www.xilinx.com; pp. 1-8.

Bill Allaire et al.; "Block Adaptive Filter"; Application Note; XAPP 055; Jan. 9, 1997 (Version 1.1); pp. 1-10.

Advanced Micro Devices "The Am29500 Family"; Bipolar Microprocessor Logic and Interface Data Book; Copyright 1985 Advanced Micro Devices, Inc.; pp. 7-1 through 7-96.

Advanced Micro Devices; "Bipolar Microprocessor Logic and Interface Data Book"; Copyright 1981 Advanced Micro Devices, Inc.; pp. 8-3 through 8-20.

Raphael David et al.; "DART: A Dynamically Reconfigurable Architecture Dealing with Future Mobile Telecommunications Constraints"; Copyright 2002 IEEE; pp. 1-8.

Xilinx, Inc.; "Virtex-4 FPGA Handbook"; published Aug. 2004; Chapter 10; available from Xilinx, Inc., 2100 Logic Drive, San Jose, California 95124; pp. 461-508.

Yoshichika Filioka et al.; "Design of a Reconfigurable Parallel Processor for Digital Control Using FPGAs"; IEICE Transacations on Electronics, Institute fo Electronics Information and Communications; vol. E77-C, No. 7; Jul. 1994; pp. 1123-1129.

U.S. Appl. No. 11/019,518, filed Dec. 21, 2004, Simkins, James M. et al., Applications of Cascading DSP Slices, Xilinx, Inc. 2100 Logic Drive, San Jose, California 95124.

Xilinx, Inc., "The Programmable Logic Data Book 1999," pp. 1-62, available from Xilinx, Inc., 2100 Logic Drive, San Jose, California 95124.

Mirsky, E., Dehon, A., "MATRIX: A Reconfigurable Computing Device with Configurable Instruction Distribution (Extended Abstract)", In Proc. IEEE Workshop on FPGAs for Custom Computing Machines, 1996, pp. 1-3.

Mirsky, E., Dehon, A.,"MATRIX: A Reconfigurable Computing Architecture with Configurable Instruction Distribution and Deployable Resources", In Proc. IEEE Workshop on FPGAs for Custom Computing Machines, Apr. 17-19, 1996, pp. 1-10.

Palacharla, S., Jouppi N, P., Smith, J. E. "Complexity-effective superscalar processors ", In Proc. The 24th Annual Int. Symp. Computer Architecture, Denver, CO, Jun. 1997, pp. 206-218.

Altera; "Using PLDs for High-Performance DSP Applications"; White Paper, WP-STXDSP-1.0; Feb. 2002, Ver. 1.0; Preliminary Information; pp. 1-6.

Leitung: Prof. Dr. Miroslaw Malek; Humbolt-Universitat Zu Berlin, Institut for Informatik; Lecture 12; "ALU (3) - Division Algorithms"; Sommersemester 2002; available from www.informatik.hu-berlin.ed/tok/ca; pp. 1-15. 1-8.

Alliance Core; "ARC 32-Bit Configurable RISC/DSP Processor"; Jul. 3, 2000; Product Specification; ARC International; AR House, United Kingdom; pp. 1-7.

Joseph B. Evans; "Efficient FIR Filter Architectures Suitable for FPGA Implementation"; presented at ISCAS '93 in Chicago, Illinois; pp. 1-6.

BDTi; "Evaluating FPGAs for Communication Infrastructure Applications"; 2002 Berkeley Design Technology, Inc.; SDR Forum; Nov. 2002 Conference; pp. 1-6.

Jennifer Eyre et al..; "The Evolution of DSP Processors"; a BDTi Whtie Paper; Copyright 2000 Berkeley Design Technology, Inc.; pp-1-9.

Arithmatica; "A+ Fast Carry-Propagate for Adders"; downloaded from http://www.arithmatica.com/aplus.html on Nov. 10, 2003; pp. 1-2.

Arithmatica; "Contact Arithmatica"; downloaded from http://www.arithmatica.com/aplus.html on Nov. 10, 2003; pp. 1.

Rafael Fried; "Algorithms for Power Consumption Reduction and Speed Enhancement in High-Performance Parallel Multipliers"; PATMOS-97; Seventh International Workshop Program; downloaded from http://www.dice.uci.ac.be/'anmarie/patmos/papers/S2/2_1.html on Nov. 10, 2003; pp. 1-11.

Drew Wilson; "Chameleon Takes on FPGAs, ASICs"; Electronic News; Oct. 29, 2004; downloaded from http://www.reed-electronics.com/electronicnews/article/CA50551?pubdate=10,%2F16%2... On Oct. 29, 2004; pp. 1-6.

Jim Simkins et al.; "A Reconfigurable VME Spread-Spectrum LPI (Low Probability of Intercept) Datalink Receiver/Transmitter Implemented via Reconfigurable DSP Hardware"; IEEE Transactions on Acoustics, Speech, and Signal Processing, vol. ASSP-29, No. 2; Apr. 1981; pp-1-14.

Chi-Jui Chou et al.; "FPGA Implementation of Digital Filters"; ICSPAT '93; pp. 1-9.

Gregory Ray Goslin; "A Guide to Using Field Programmable Gate Arrays (FPGAs) for Application-Specific Digital Signal Processing Performance"; 1995 Xilinx, Inc.; V.1.0; pp. 1-11.

Stephen J. Bradshaw; "Building a Better DSP Mousetrap: FPGAs, DSP Processors, or a combination of both?"; Copyright 2001 Traquair Data Systems, Inc.; rev. 1.1; Nov. 1, 2001; available from www.traquair.com.; pp. 1-6.

University of Patras - DCT-Hellas; "ESD Best Practice: Pilot Action for Low Power Design - SOFLOPO Low Power Software Development for Embedded Applications"; May 1998; pp. 1-100.

Behrooz Parhami et al.; "Parallel Architectures and Adaptation Algorithms for Programmable FIR Digital Filters with Fully Pipelined Data and Control Flows"; Journal of Information Science and Engineering 19, 59-74 (2003); Received Sep. 28, 2001; accepted Apr. 15, 2002; pp. 59-74.

Edward A. Lee; "Programmable DSP Architectures: Part II"; IEEE ASSP Magazine; Jan. 1989; pp. 4-14.

Guy Even et al.; "A Comparison of Three Rounding Algorithms for IEEE Floating-Point Multiplication"; Aug. 29, 1998; pp. 1-28.

Naji S. Ghazal et al.; "Retargetable Estimation for DSP Architecture Selection"; Tampere Technology Seminar - Nov. 1999; available from http://www-cad.eecs.berkeley.edu/-naji/Research/; pp. 1-33.

BDTi, Berkeley Design Technology, Inc.; "Choosing a DSP Processor", 1996-2000 Berkeley Design Technology, Inc., Oct. 1996, pp. 1-8.

Dhanesha, Hema et al., "Array-of-arrays Architecture for Parallel Floating Point Multiplication", Center for Integrated Systems, Stanford University, 1995 Conference on Advanced Research in VLSI Chapel Hill, NC Advanced Research in VLSI, Proceedings, Sixteenth Conference on Volume, Issue, 27-29 Mar. 1995, pp. 150-157.

Computer Representation of Numbers, pp. 1-4. (Date Unavailable).

Harmon, Gary, "Silicon Arithmetic with a 40% Advantage", White Paper, AutoPD; Mar. 19, 2003, pp. 1-3.

Huang, Zhijun, et al., "Low Power Array Multiplier Design by Topology Optimization" Proceeding -SPIE the International Society for Engineering, Dec. 6, 2002, ISSU, Proceeding vol. 4791, pp. 424-435.

Jovanovic-Dolecek, Gordana, et al., "Design of FIR Lowpass Filters Using Stepped Triangular Approximation", $5^{th}$ Nordic Signal Processing Symposium, NORSIG 2002, Oct. 4-7, 2002, from Tromso to Trondheim, Norway, pp. 1-4.

Lim, Y.C., An Efficient Bit-Serial FIR filter Architecture, supported by Office of Naval Research under Grant N000 14-89-J1327, NSF Grant ECS87-13598 by an At&T Bell Laboratories Graduate Fellowship and by University of Kansas General Research Allocation 3775-20-0038; Presented at ICASSP '90, Apr. 3-6, 1990, Albuquerque, New Mexico, pp. 1-13.

Mciihenny, Robert, et al., "On the Implementation of a Three-Operand Multiplier", pp. 1-5, $31^{st}$ Asilomar Conference on Signals, Systems and Computers, Pacific Grove, CA, Nov. 2-5, 1997.

Monhanakrishnan, Satish, et al., "Automatic Implementation of FIR Filters on Field Programmable Gate Arrays", Oct. 7, 1993; supported by Kansas Technology Enterprise Corp; pp. 1-12.

Nicolaidis, M., et al., "Design of Fault-Secure Parity-Prediction Booth Multipliers", Design, Automation and Test in Europe, 1998, Proceedings, vol., Issue , Feb. 23-26, 1998, pp. 7-14.

Reeves, Keith et al., "Reconfigurable Hardware Accelerator for Embedded DSP", High-Speed Computing Digital Signal Processing and Filtering Using Reconfigurable Logic, Proc. SPIE, vol. 2914, 332, Nov. 20, 1996, Boston MA, pp. 929-933.

Turney, Robert D. et al., "Modeling and Implementation of DSP FPGA Solutions", 1999 International Conference on Signal Processing Applications and Technology ICSPAT, Nov. 3, 1999, pp. 1-16.

Xilinx, Inc., "FPGAs and DSP", Nov. 1996, pp. 1-8, available from Xilinx, Inc., 2100 Logic Drive, San Jose, California 95124.

Yu, Hyeong Seok, et al., "Low Area CMOS Multiplication Using Booth Algorithm for IEEE 754 Floating Point Standard", $6^{th}$ Korean Semiconductor Conference, D-48, Feb. 9, 1999, pp. 1-16.

* cited by examiner

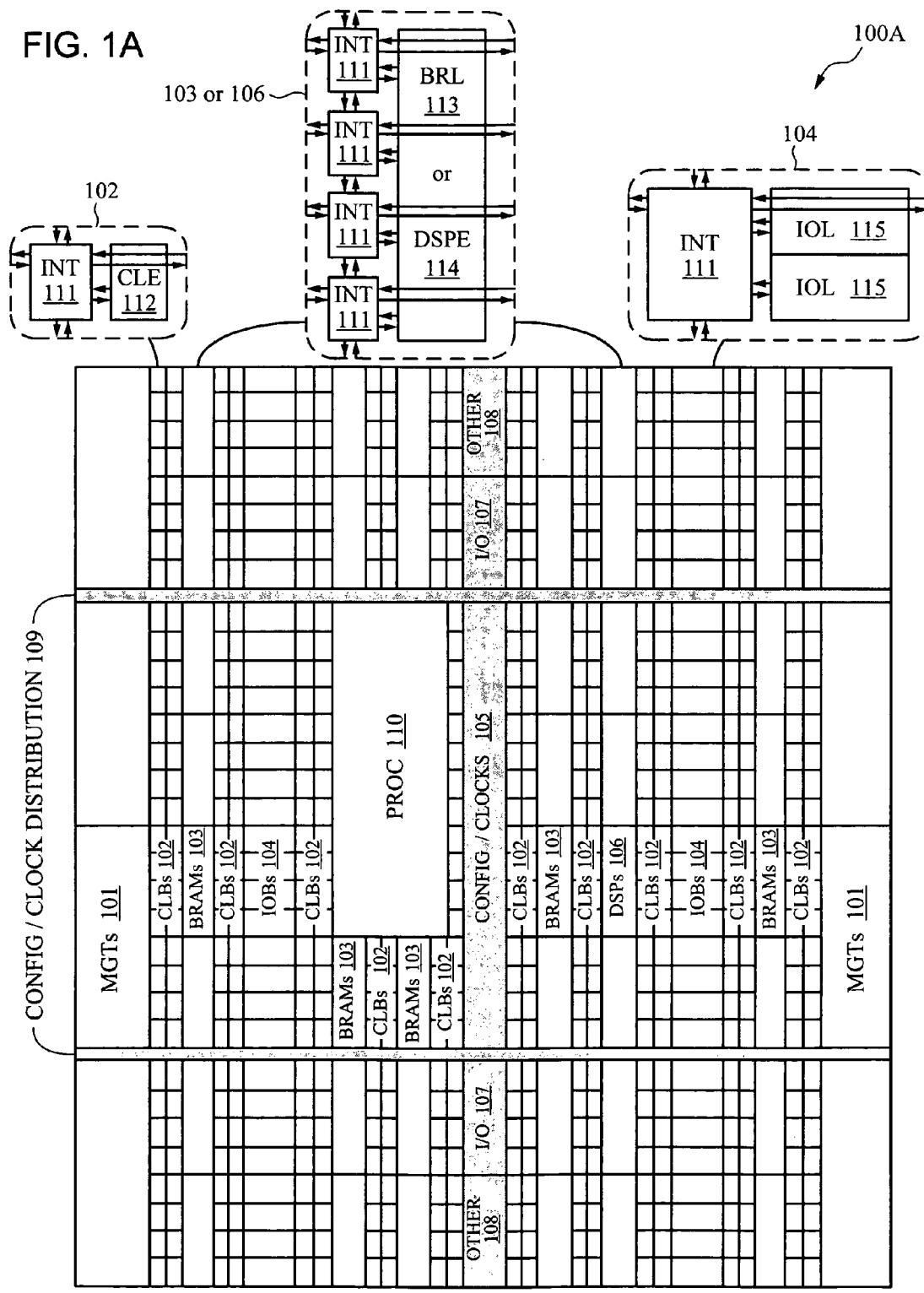

301

| Pipeline Registers | | MC[2:0] |
|---|---|---|
| To Current DSPE | To Cascade DSPE | |
| 0 | 0 | 101 |
| 1 | 0 | 000 |
| 1 | 1 | 100 |
| 2 | 1 | 010 |
| 2 | 2 | 110 |

DIGITAL SIGNAL PROCESSING CIRCUIT HAVING AN ADDER CIRCUIT WITH CARRY-OUTS

CROSS REFERENCE

This patent application is a continuation-in-part of and incorporates by reference, U.S. patent application Ser. No. 11/019,783, entitled "Integrated Circuit With Cascading DSP Slices", by James M. Simkins, et al., filed Dec. 21, 2004, and is a continuation-in-part of and incorporates by reference, U.S. Patent Application, entitled "A Digital Signal Processing Element Having An Arithmetic Logic Unit" by James M. Simkins, et al., filed Apr. 21, 2006, and claims priority to and incorporates by reference, U.S. Provisional Application Ser. No. 60/533,280, "Programmable Logic Device with Cascading DSP Slices", filed Dec. 29, 2003.

FIELD OF THE INVENTION

The present invention relates generally to integrated circuits and more specifically, an integrated circuit having one or more digital signal processing elements.

BACKGROUND

The introduction of the microprocessor in the late 1970's and early 1980's made it possible for Digital Signal Processing (DSP) techniques to be used in a wide range of applications. However, general-purpose microprocessors such as the Intel x86 family were not ideally suited to the numerically-intensive requirements of DSP, and during the 1980's the increasing importance of DSP led several major electronics manufacturers (such as Texas Instruments, Analog Devices and Motorola) to develop DSP chips—specialized microprocessors with architectures designed specifically for the types of operations required in DSP. Like a general-purpose microprocessor, a DSP chip is a programmable device, with its own native instruction set. DSP chips are capable of carrying out millions or more of arithmetic operations per second, and like their better-known general-purpose cousins, faster and more powerful versions are continually being introduced.

Traditionally, the DSP chip included a single DSP microprocessor. This single processor solution is becoming inadequate, because of the increasing demand for more arithmetic operations per second in, for example, the 3G base station arena. The major problem is that the massive number of arithmetic operations required are concurrent and must be done in real-time. The solution of adding more DSP microprocessors to run in parallel has the same disadvantage of the past unsuccessful solution of adding more general-purpose microprocessors to perform the DSP applications.

One solution to the increasing demand for more real-time, concurrent arithmetic operations, is to configure the programmable logic and interconnect in a Programmable Logic Device (PLD) with multiple DSP elements, where each element includes one or more multipliers coupled to one or more adders. The programmable interconnect and programmable logic, are sometimes referred to as-the PLD fabric, and are typically programmed by loading a stream of configuration data into SRAM configuration memory cells that define how the programmable elements are configured.

While the multiple DSP elements configured in the programmable logic and programmable interconnect of the PLD allow for concurrent DSP operations, the bottleneck, then becomes the fabric of the PLD. Thus in order to further improve DSP operational performance, there is a need to replace the multiple DSP elements that are programmed in the PLD by application specific circuits.

SUMMARY

The present invention relates generally to integrated circuits and more specifically, a digital signal processing circuit having an adder circuit with carry-outs. An embodiment of the present invention includes an integrated circuit (IC) having a digital signal processing (DSP) circuit. The DSP circuit includes: a plurality of multiplexers receiving a first set, second set, and third set of input data bits, where the plurality of multiplexers are coupled to a first opcode register; a bitwise adder coupled to the plurality of multiplexers for generating a sum set of bits and a carry set of bits from bitwise adding together the first, second, and third set of input data bits; and a second adder coupled to the bitwise adder for adding together the sum set of bits and carry set of bits to produce a summation set of bits and a plurality of carry-out bits, where the second adder is coupled to a second opcode register.

An aspect of the invention has an integrated circuit (IC) having two cascaded digital signal processing elements (DSPEs). A first DSPE includes: a first set of multiplexers controlled by a first opcode; and a first arithmetic logic unit (ALU) coupled to the first set of multiplexers and controlled by a second opcode, where the first ALU has a first adder that generates a first set of sum bits and a first set of carry-out bits. A second DSPE includes: a second set of multiplexers controlled by a third opcode; and a second arithmetic logic unit (ALU) coupled to the second set of multiplexers and controlled by a fourth opcode, where the second ALU has a second adder configured to receive at least one carry-out bit of the first set of carry-out bits and to generate a second set of sum bits and a second set of carry-out bits.

Another aspect of the invention an IC having a plurality of digital signal processing (DSP) circuits for performing an extended multiply accumulate operation. The IC includes: 1) a first DSP circuit having: a multiplier coupled to a first set of multiplexers; and a first adder coupled to the first set of multiplexers, the first adder producing a first set of sum bits and a first and a second carry-out bit, the first set of sum bits stored in a first output register, the first output register coupled to a multiplexer of the first set of multiplexers; and 2) a second DSP circuit having: a second set of multiplexers coupled to a second adder, the second adder coupled to a second output register and the first carry-out bit, the second out put register coupled to a first subset of multiplexers of the second set of multiplexers; a second subset of multiplexers of the second set of multiplexers receiving a first constant input; and a third subset of multiplexers of the second set of multiplexers, wherein a multiplexer of the third subset of multiplexers is coupled to an AND gate, the AND gate receiving a special opmode and the second carry-out bit, and the other multiplexers of the third subset receiving a second constant input.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples in accordance with the invention.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 1A and 1B illustrate FPGA architectures, each of which can be used to implement embodiments of the present invention;

FIG. 6 shows a table giving different configuration memory cell settings for FIG. 4 in order to have a selected number of pipeline registers in the A register block;

FIGS. 14-1 to 14-4 are SIMD schematics having the adders of FIG. 13;

FIG. 16-1 is a simplified diagram of a SIMD circuit for an ALU of another embodiment of the present invention;

FIG. 16-2 is a block diagram of two cascaded SIMD circuits;

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

While some of the data buses are described using big-endian notation, e.g., A[29:0], B[17:0], C[47:0], or P[47:0], in one embodiment of the present invention. In another embodiment, the data buses can use little-endian notation, e.g., P[0:47]. In yet another embodiment, the data buses can use a combination of big-endian and little-endian notation.

Figure 1B:
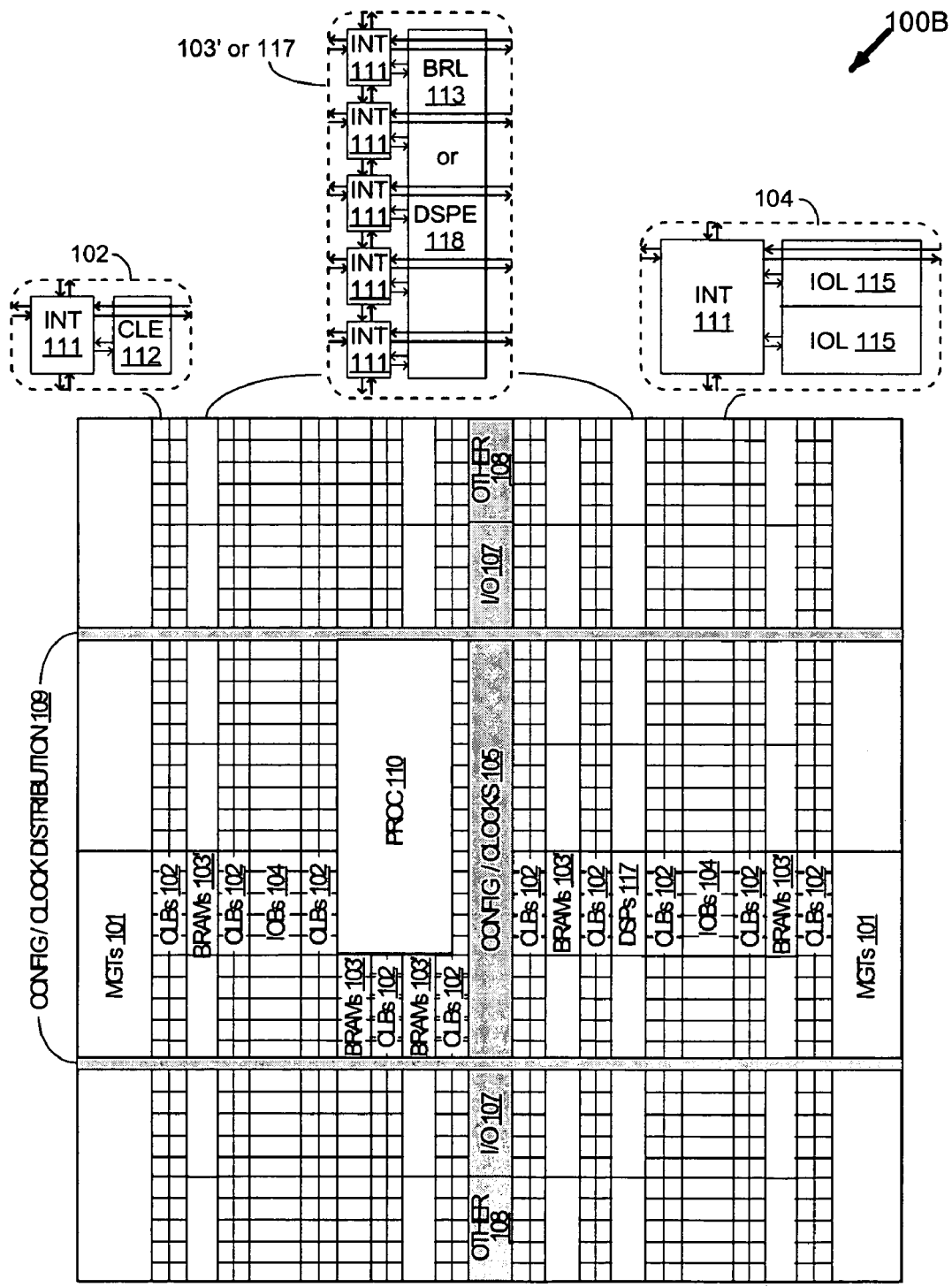

FIGS. 1A and 1B illustrate FPGA architectures 100A and 100B, each of which can be used to implement embodiments of the present invention. Each of FIGS. 1A and 1B illustrate an FPGA architecture that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106/117), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106/117 can include a DSP logic element (DSPE 114/118) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIGS. 1A/B) is used for configuration, clock, and other control logic. Horizontal areas 109 extending from this column are used to distribute the clocks and configuration signals across the breadth of the FPGA.

Some FPGAs utilizing the architecture illustrated in FIGS. 1A/B include additional logic blocks that disrupt the regular columnar structure making up a large part of the FPGA. The additional logic blocks can be programmable blocks and/or dedicated logic. For example, the processor block PROC 110 shown in FIGS. 1A/B spans several columns of CLBs and BRAMs.

Note that FIGS. 1A and 1B are intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIGS. 1A/B are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
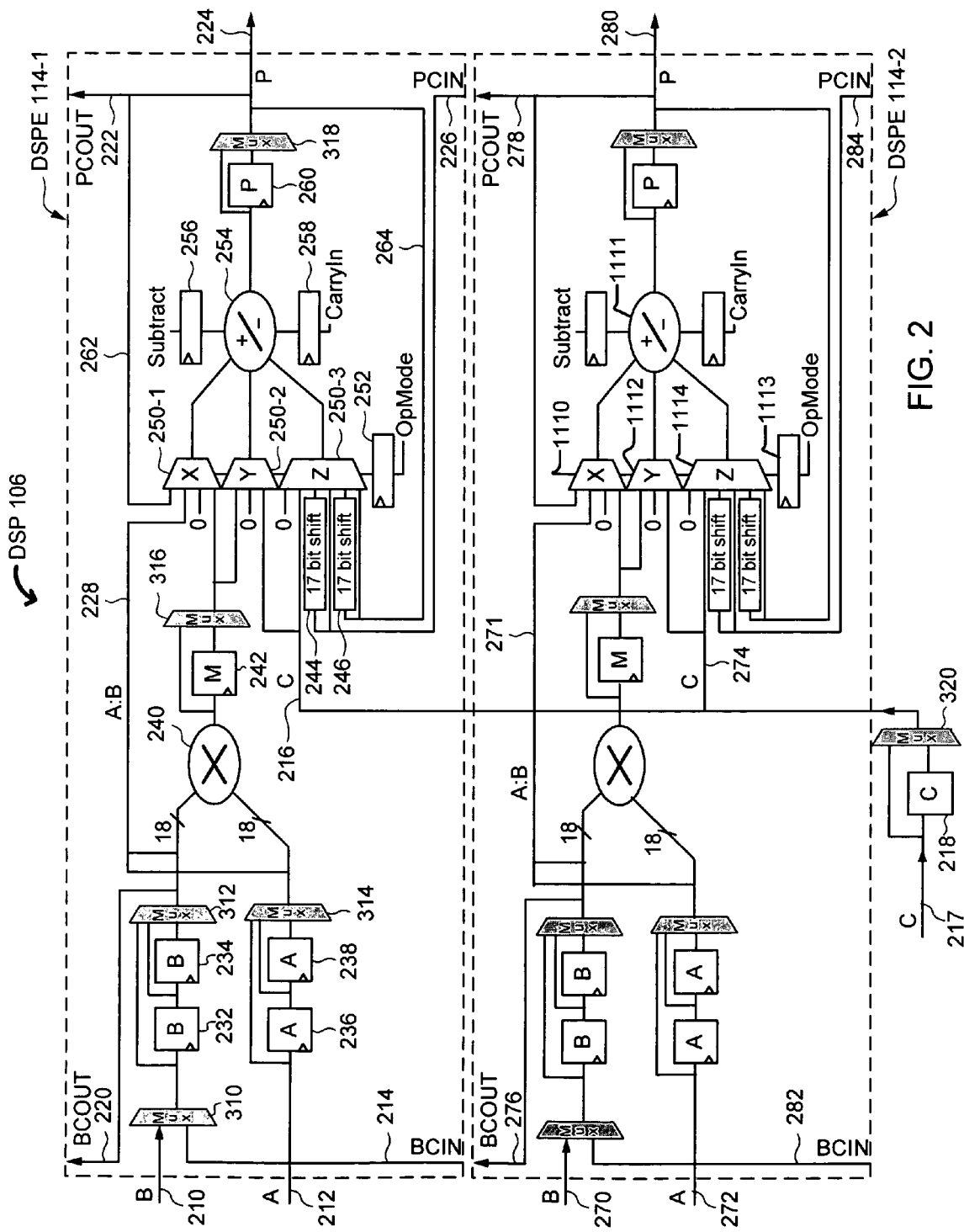
FIG. 2 illustrates a DSP block of FIG. 1A having two cascaded DSP elements.

FIG. 2 illustrates a DSP block 106 having two cascaded DSP elements (DSPE 114-1 and 114-2). In one embodiment DSP block 106 is a tile on an FPGA such as that found in the Virtex-4 FPGA from Xilinx, Inc. of San Jose, Calif. The tile includes two DSPE (114-1/2) and four programmable interconnection elements INT 111 coupled to two DSPE 114-1 and 114-2 (see as shown in FIG. 1A). The DSP elements, DSPE 114-1 and DSPE 114-2, have the same or similar structure, so only DSPE 114-1 will be described in detail. DSPE 114-1 is basically a multiplier 240 coupled to an adder/subtracter, hereinafter also referred to as adder 254, via programmable multiplexers (hereinafter, also referred to as Muxs): X-Mux, 250-1, Y-Mux 250-2, and Z-Mux 250-3 (collective multiplexers 250). The multiplexers 250 are dynamically controlled by an opmode stored in opmode register 252. A subtract register 256 controls whether the adder 254 does an addition (sub=0) or a subtraction (sub=1), e.g., C+A*B (sub=0) or C−A*B (sub=1). There is also a CarryIn register 258 connected to the adder 254 which has one carry in bit. (In another embodiment, there can be more than one carry in bit). The output of adder 254 goes to P register 260, which has output P 224 and PCOUT 222 via multiplexer 318. Output P 224 is also a feedback input to X-Mux 250-1 and to Z-Mux 250-3 either directly or via a 17-bit right shifter 246.

There are three external data inputs into DSPE 114-1, port A 212, port B 210, and port C 217. Mux 320 selects either the output of register C 218 or port C 217 by bypassing register C 218. The output 216 of Mux 320 is sent to Y-Mux 250-2 and Z-Mux 250-3. There are two internal inputs, BCIN 214 (from BCOUT 276) and PCIN 226 (from PCOUT 278) from DSPE 114-2. Port B 210 and BCIN 214 go to multiplexer 310. The output of multiplexer 310 is coupled to multiplexer 312 and can either bypass both B registers 232 and 234, go to B register 232 and then bypass B register 234 or go to B register 232 and then B register 234. The output of Mux 312 goes to multiplier 240 and X-Mux 250-1 (via A:B 228) and BCOUT 220. Port A 212 is coupled to multiplexer 314 and can either bypass both A registers 236 and 238, go to A register 236 and then bypass A register 238, or go to A register 236 and then A register 238. The output of Mux 314 goes to multiplier 240 or X-Mux 250-1 (via A:B 228). The 18 bit data on port A and 18 bit data on port B can be concatenated into A:B 228 to go to X-Mux 250-1. There is one external output port P 224 from the output of Mux 318 and two internal outputs BCOUT 220 and PCOUT 222, both of which go to another DSP element (not shown).

The multiplier 240, in one embodiment, receives two 18 bit 2's complement numbers and produces the multiplicative product of the two inputs. The multiplicative product can be in the form of two partial products, each of which may be stored in M registers 242. The M register can be bypassed by multiplexer 316. The first partial product goes to the X-Mux 250-1 and the second partial product goes to Y-Mux 250-2. The X-Mux 250-1 also has a constant 0 input. The Y-Mux 250-2 also receives a C input 216 and a constant 0 input. The Z-Mux receives C input 216, constant 0, PCIN 226 (coupled to PCOUT 278 of DSPE 114-2), or PCIN 226 shifted through a 17 bit, two's complement, right shifter 244, P 264, and P shifted through a 17 bit, two's complement, right shifter 246. In another embodiment either the right shifter 244 or right shifter 246 or both, can be a two's complement n-bit right shifter, where n is a positive integer. In yet another embodiment, either the right shifter 244 or right shifter 246 or both, can be an m-bit left shifter, where m is a positive integer. The X-Mux 250-1, Y-Mux 250-2, and Z-Mux 250-3 are connected to the adder/subtracter 254. In adder mode, A:B 228 is one input to adder 254 via X-Mux 250-1 and C input 216 is the second input to adder 254 via Z-Mux 250-3 (the Y-Mux 250-2 inputs 0 to the adder 254). In multiplier mode (A*B), the two partial products from M registers 242 are added together in adder 254 (via X-Mux 250-1 and Y-Mux 250-2). In addition, in multiplier mode A*B can be added or subtracted from any of the inputs to Z-Mux 250-3, which included, for example, the C register 218 contents.

The output of the adder/subtracter 254 is stored in P register 260 or sent directly to output P 224 via multiplexer 318 (bypassing P register 260). Mux 318 feeds back register P 260 to X-Mux 250-1 or Z-Mux 250-3. Also Mux-318 supplies output P 224 and PCOUT 222.

Listed below in Table 1 are the various opmodes that can be stored in opmode register 252. In one embodiment the opmode register is coupled to the programmable interconnect and can be set dynamically (for example, by a finite state machine configured in the programmable logic, or as another example, by a soft core or hard core microprocessor). In another embodiment, the opmode register is similar to any other register in a microprocessor. In a further embodiment the opmode register is an instruction register like that in a digital signal processor. In an alternative embodiment, the opmode register is set using configuration memory cells. In Table 1, the opmode code is given in binary and hexadecimal. Next the function performed by DSPE 114-1 is given in a pseudo code format. Lastly the DSP mode: Adder_Subtracter mode (no multiply), or Multiply_AddSub mode (multiply plus addition/subtraction) is shown.

TABLE 1

| Hex Opmode | Binary Opmode | Function | DSP Mode |
| --- | --- | --- | --- |
| 0x00 | 0000000 | P=Cin<br>P=−Cin | Adder_Subtracter |

TABLE 1-continued

| Hex Opmode | Binary Opmode | Function | DSP Mode |
|---|---|---|---|
| 0x02 | 0000010 | P=P+Cin<br>P=−P−Cin | Adder_Subtracter |
| 0x03 | 0000011 | P = A:B + Cin<br>P=−A:B−Cin | Adder_Subtracter |
| 0x05 | 0000101 | P = A*B + Cin<br>P = −A*B − Cin | Multiply_AddSub |
| 0x0c | 0001100 | P=C+Cin<br>P=−C−Cin | Adder_Subtracter |
| 0x0e | 0001110 | P=C+P+Cin<br>P=−C−P−Cin | Adder_Subtracter |
| 0x0f | 0001111 | P=A:B + C + Cin<br>P = −A:B −C−Cin | Adder_Subtracter |
| 0x10 | 0010000 | P = PCIN + Cin<br>P = PCIN −Cin | Adder_Subtracter |
| 0x12 | 0010010 | P=PCIN+P+Cin<br>P=PCIN−P−Cin | Adder_Subtracter |
| 0x13 | 0010011 | P=PCIN+A:B+Cin<br>P=PCIN−A:B−Cin | Adder_Subtracter |
| 0x15 | 0010101 | P=PCIN+A*B+Cin<br>P=PCIN−A*B−Cin | Multipy_AddSub |
| 0x1c | 0011100 | P=PCIN+C +Cin<br>P=PCIN−C −Cin | Adder_Subtracter |
| 0x1e | 0011110 | P=PCIN+C+P+Cin<br>P=PCIN−C−P−Cin | Adder_Subtracter |
| 0x1f | 0011111 | P=PCIN+A:B+C+Cin<br>P=PCIN−A:B−C−Cin | Adder_Subtracter |
| 0x20 | 0100000 | P=P−Cin<br>P=P+Cin | Adder_Subtracter |
| 0x22 | 0100010 | P=P+P+Cin<br>P=P−P−Cin | Adder_Subtracter |
| 0x23 | 0100011 | P=P+A:B+Cin<br>P=P−A:B−Cin | Adder_Subtracter |
| 0x25 | 0100101 | P=P+A*B+Cin<br>P=P−A*B−Cin | Multiply_AddSub |
| 0x2c | 0101100 | P=P+C+Cin<br>P=P−C−Cin | Adder_Subtracter |
| 0x2e | 0101110 | P=P+C+P+Cin<br>P=P−C−P−Cin | Adder_Subtracter |
| 0x2f | 0101111 | P=P+A:B+C+Cin<br>P=P−A:B−C−Cin | Adder_Subtracter |
| 0x30 | 0110000 | P=C+Cin<br>P=C−Cin | Adder_Subtracter |
| 0x32 | 0110010 | P=C+P+Cin<br>P=C−P−Cin | Adder_Subtracter |
| 0x33 | 0110010 | P=C+A:B+Cin<br>P=C−A:B−Cin | Adder_Subtracter |
| 0x35 | 0110101 | P=C+A*B+Cin<br>P=C−A*B−Cin | Multiply_AddSub |
| 0x3c | 0111100 | P=C+C+Cin<br>P=C−C−Cin | Adder_Subtracter |
| 0x3e | 0111110 | P=C+C+P+Cin<br>P=C−C−P−Cin | Adder_Subtracter |
| 0x3f | 0111111 | P=C+A:B+C+Cin<br>P=C−A:B−C−Cin | Adder_Subtracter |
| 0x50 | 1010000 | P=SHIFT17(PCIN)+Cin<br>P=SHIFT17(PCIN)−Cin | Adder_Subtracter |
| 0x52 | 1010010 | P=SHIFT17(PCIN)+P+Cin<br>P=SHIFT17(PCIN)−P−Cin | Adder_Subtracter |
| 0x53 | 1010011 | P=SHIFT17(PCIN)+A:B+Cin<br>P=SHIFT17(PCIN)−A:B−Cin | Adder_Subtracter |
| 0x55 | 1010101 | P=SHIFT17(PCIN)+A*B+Cin<br>P=SHIFT17(PCIN)−A*B−Cin | Multiply_AddSub |
| 0x5c | 1011100 | P=SHIFT17(PCIIN)+C+Cin<br>P=SHIFT17(PCIN)−C−Cin | Adder_Subtracter |
| 0x5e | 1011110 | P=SHIFT17(PCIN)+C+P+Cin<br>P=SHIFT17(PCIN)−C−P−Cin | Adder_Subtracter |
| 0x5f | 1011111 | P=SHIFT17(PCIN)+A:B+C+ Cin<br>P=SHIFT17(PCIN)−A:B−C−Cin | Adder_Subtracter |
| 0x60 | 1100000 | P=SHIFT17(P)+Cin<br>P=SHIFT17(P)−Cin | Adder_Subtracter |
| 0x62 | 1100010 | P=SHIFT17(P)+P+Cin<br>P=SHIFT17(P)−P−Cin | Adder_Subtracter |
| 0x63 | 1100011 | P=SHIFT17(P)+A:B+Cin<br>P=SHIFT17(P)−A:B−Cin | Adder_Subtracter |
| 0x65 | 1100101 | P=SHIFT17(P)+A*B+Cin<br>P=SHIFT17(P)−A*B−Cin | Multiply_AddSub |

TABLE 1-continued

| Hex Opmode | Binary Opmode | Function | DSP Mode |
|---|---|---|---|
| 0x6c | 1101100 | P=SHIFT17(P)+C+Cin<br>P=SHIFT17(P)−C−Cin | Adder_Subtracter |
| 0x6e | 1101110 | P=SHIFT17(P)+C+P+Cin<br>P=SHIFT17(P)−C−P−Cin | Adder_Subtracter |
| 0x6f | 1101111 | P=SHIFT17(P)+A:B+C+Cin<br>P=SHIFT17(P)−A:B−C−Cin | Adder_Subtracter |

Further details of DSP 106 in FIG. 2 can be found in the Virtex® V4 FPGA Handbook, August 2004, Chapter 10, pages 461-508 from Xilinx, Inc, and from U.S. patent application Ser. No. 11/019,783, filed Dec. 21, 2004, entitled "Integrated Circuit With Cascading DSP Slices", by James M. Simkins, et. al., both of which are herein incorporated by reference.

In FIG. 2 the multiplexers 310, 312, 314, 316, 318, and 320 in DSPE 114-1 can in one embodiment be set using configuration memory cells of a PLD. In another embodiment they can be set by one or more volatile or non-volatile memory cells that are not a configuration memory cells, but similar to BRAM cells in use. In addition in an alternative embodiment the Opmode and ALUmode are referred to as "opcodes," similar to the opcodes used for a digital signal processor, such as a digital signal processor from Texas Instruments, Inc., or a general microprocessor such as the PowerPC® from IBM, Inc. In a further embodiment the opmode and/or the ALUmode can be part of one or more DSP instructions.

FIG. 2 shows adder/subtracter 254 which can perform 48-bit additions, subtractions, and accumulations. In addition by inserting zeros/ones into the input data (e.g., A:B 228 and C 216) and skipping bits in the output P 224 of adder/subtracter 254, ALU operations such as 18-bit bitwise XOR, XNOR, AND, OR, and NOT, can be performed. Thus adder/subtracter 254 can be an ALU. For example, let A:B="11001" and C="01100", then A:B AND C="01000" and A:B XOR C="10101". Inserting zeros in A:B gives "1010000010" and inserting zeros in C gives "0010100000". Bitwise adding "1010000010"+"0010100000" gives the addition result "01100100010". By skipping bits in the addition result we can get the AND and XOR functions. As illustrated below the zero insertion is shown by a "<u>0</u>" and the bits that need to be selected from the P bitwise addition result for the AND and the XOR are shown by arrows.

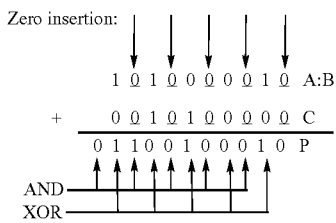

Figure 3:
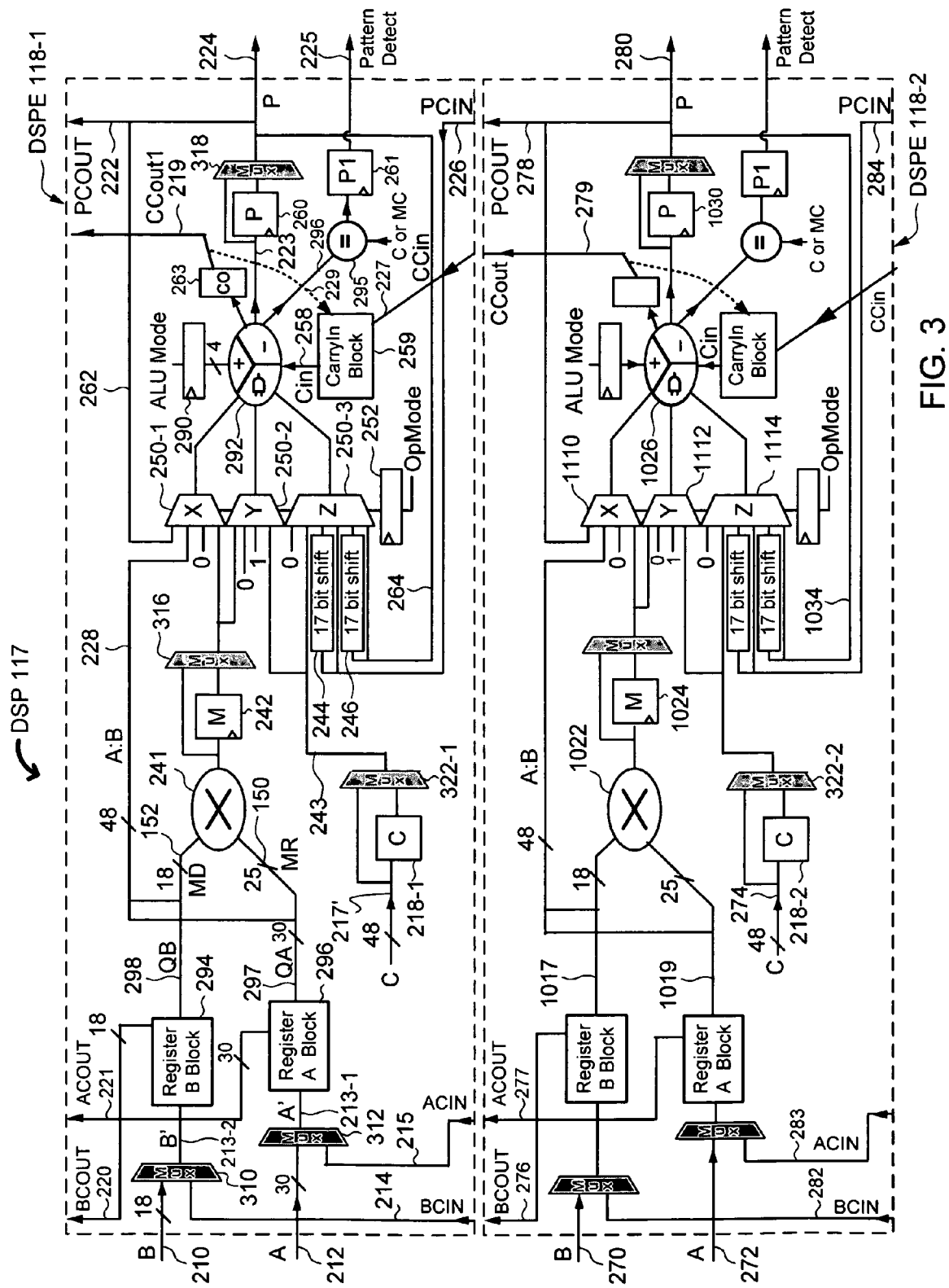
FIG. 3 illustrates a DSP block of FIG. 1B having two cascaded DSP elements of an embodiment of the present invention.

FIG. 3 illustrates a DSP block 117 of FIG. 1B having two cascaded DSP elements (DSPE 118-1 and 118-2) of an embodiment of the present invention. In one embodiment DSP block 117 is a tile on an FPGA. The tile includes two DSPE (118-1/2) and five programmable interconnection elements INT 111 coupled to two DSPE 118-1 and 118-2 (see as shown in FIG. 1B). The DSP elements, DSPE 118-1 and DSPE 118-2, have the same or similar structure, so only DSPE 118-1 will be described in detail. DSPE 118-1 is basically a multiplier 241 coupled to an arithmetic logic unit (ALU) 292, via input selection circuits such as programmable multiplexers (i.e., Muxs): X-Mux, 250-1, Y-Mux 250-2, and Z-Mux 250-3 (collectively multiplexers 250). In another embodiment the input selection circuits can include logic gates rather than multiplexers. In yet another embodiment the programmable multiplexers include logic gates. In yet a further embodiment the programmable multiplexers include switches, such as, for example, CMOS transistors and/or pass gates. In comparing FIGS. 2 and 3 there are some items which have the same or similar structure. In these cases the labels are kept the same in order to simplify the explanation and to not obscure the invention.

Figure 26:
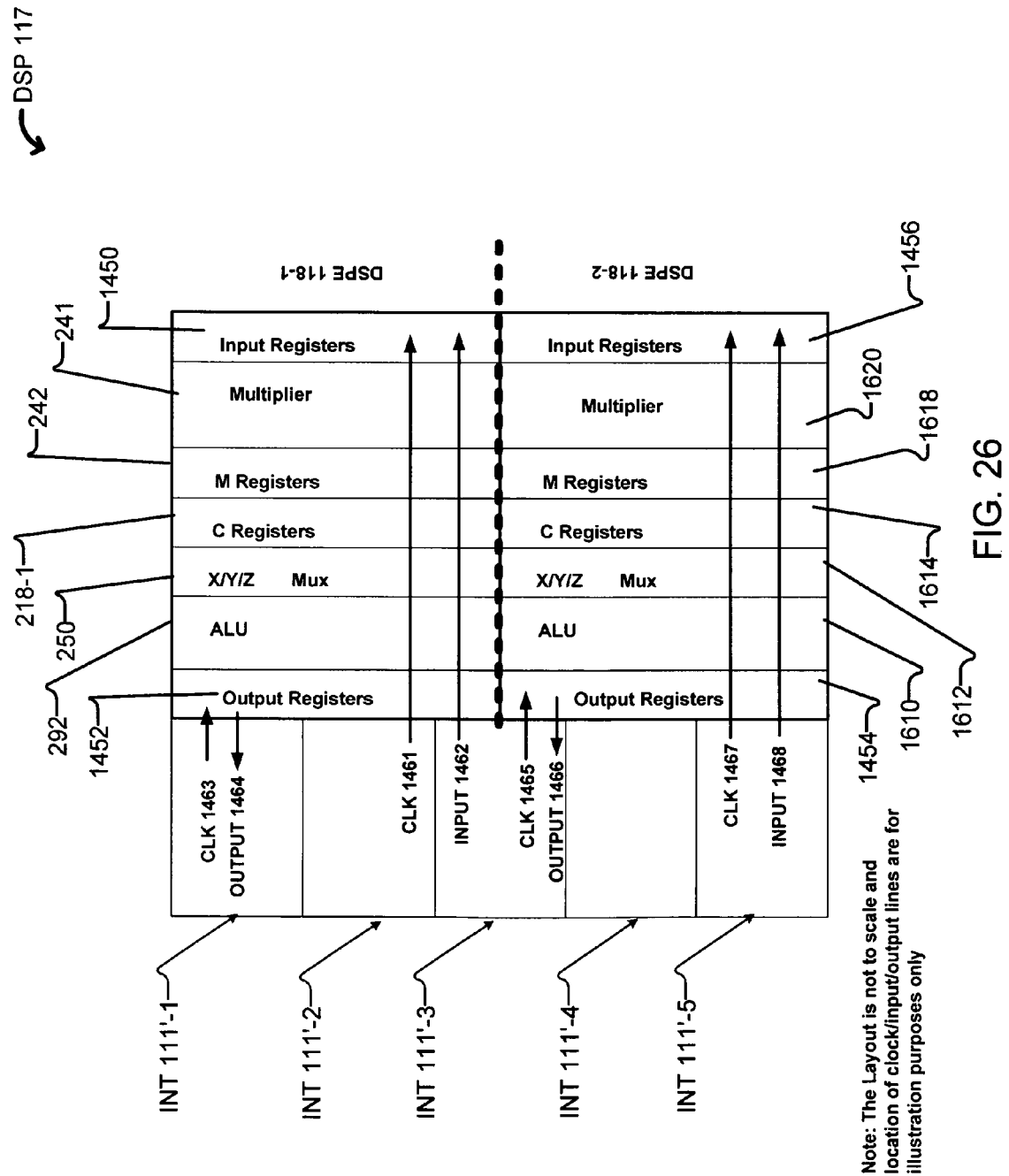
FIG. 26 is a simplified layout of a DSP of FIG. 1B of another embodiment of the present invention.
Figure 28:
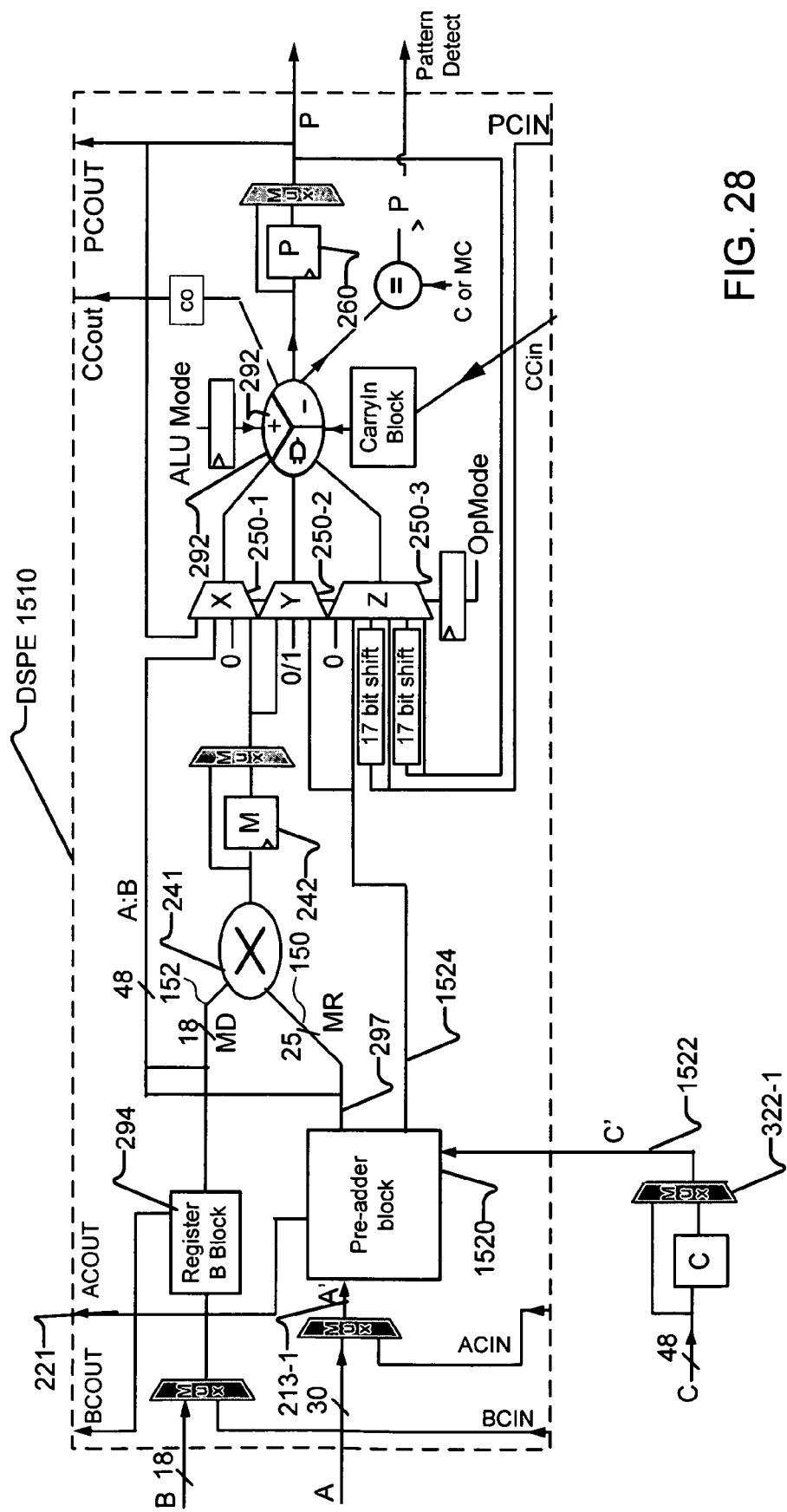
FIG. 28 is a schematic of a DSPE having a pre-adder block of an embodiment of the present invention.
Figure 29:
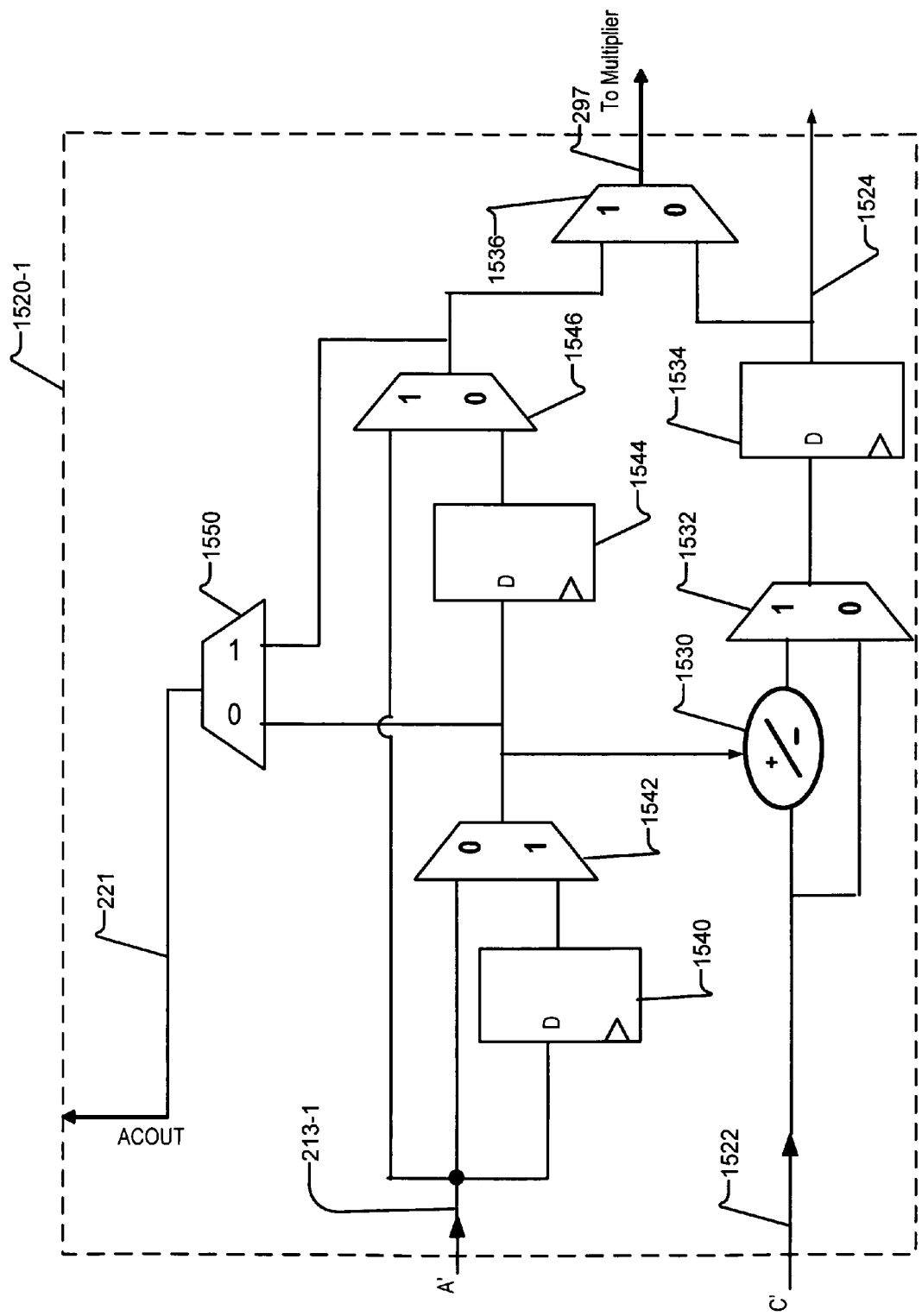
FIG. 29 is a schematic of a pre-adder block of an embodiment of the present invention.
Figure 30:
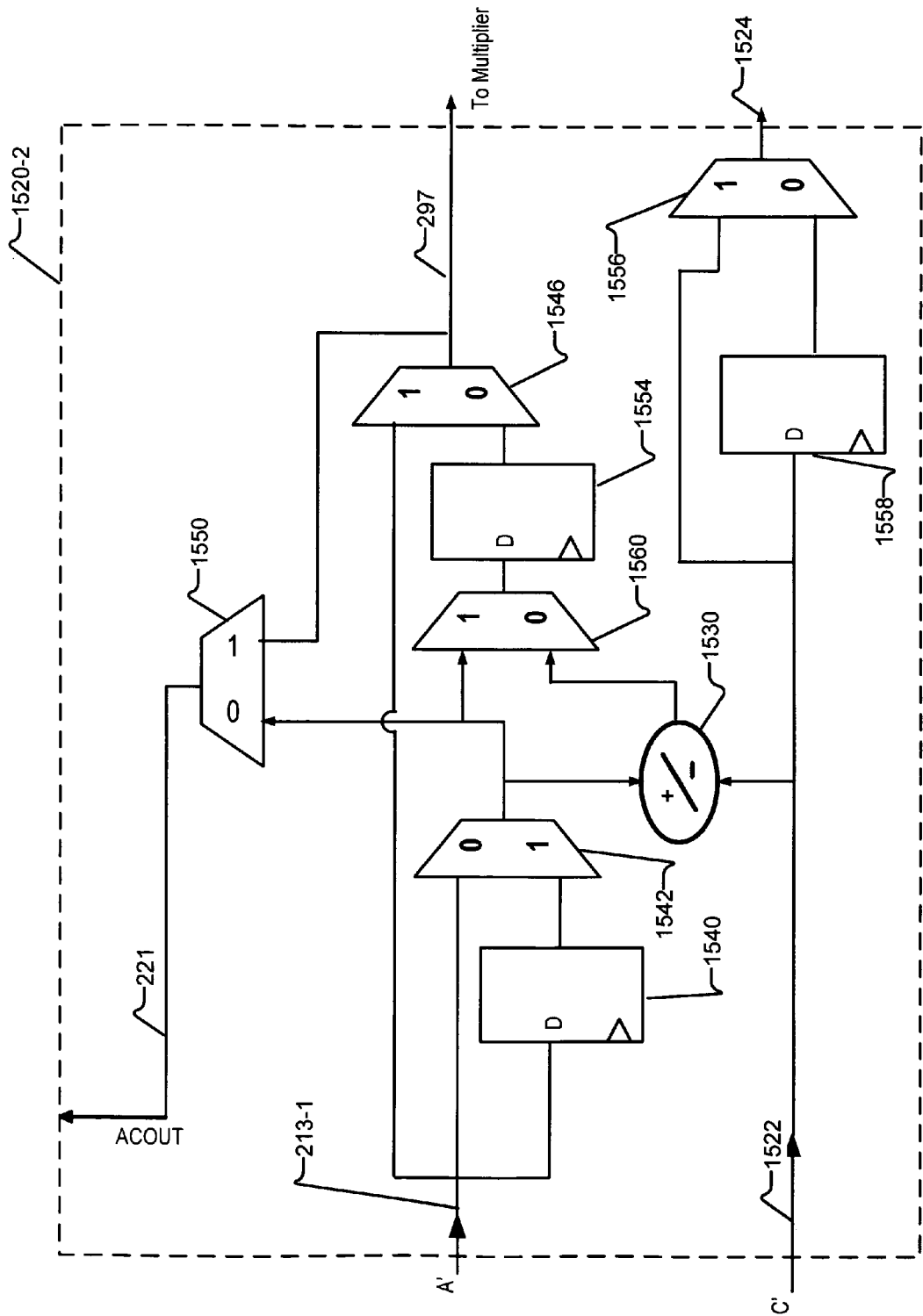
FIG. 30 is a schematic of a pre-adder block of another embodiment of the present invention.

In general in an exemplary embodiment, FIG. 3 is different from FIG. 2 in that: 1) there is a 25×18 multiplier 241 rather than a 18×18 multiplier 240; 2) each DSPE has its own C register (218-1 for DSPE 118-1, 218-2 for DSPE 118-2) and Mux (322-1 for DSPE 118-1 and 322-2 for DSPE 118-2), rather than both DSPE's sharing a C register 218 in FIG. 2; 3) there is an A cascade added between DSPEs (represented by ACIN 215, Mux 312, A Register block 296, and ACOUT 221) similar to the B cascade already existing (represented by BCIN 214, Mux 310, B Register block 294, and BCOUT 220); 4) Adder/subtracter 254 has been replaced by ALU 292, which in addition to doing the adding/subtracting of adder/subtracter 254 can also perform bitwise logic functions such as XOR, XNOR, AND, NAND, OR, NOR, and NOT; in one embodiment when ALU is used in logic mode (the multiplier 241 is not used), input A 212 and register A block 296 is extended to 30 bits so that A:B (A concatenated with B) is 48 bits wide (30+18); 5) there is one carryout bit (CCin/CCout) between DSPEs, when the ALU 292 is used in adder/subtracter mode, where the cascade carry out bit CCout1 219 is stored in register co 263 (which in another embodiment can be coupled to a multiplexer so that register co 263 can be configured to be bypassed); 6) when the multiplier 241 is not used, then there can be four 12-bit single-instruction-multiple-data (SIMD) addition/subtraction segments, each segment with a carryout, or two 24 bit SIMD segments, each segment with a carryout; 7) the SIMD K-bit segments (K is a positive integer) in one DSPE can be cascaded with the corresponding K-bit segments in an adjacent DSPE to provide cascaded SIMD segments; 8) a pattern detector, having a comparator 295 and P1 register 261, has been added; 9) the pattern detector can be used to help in determining arithmetical overflow or underflow, resetting the counter, and convergent rounding to even/odd; 10) as illustrated by FIG. 26 the layout for a DSP block has been modified so that the column of INT 111 are adjacent to both DSPE 118-1 and DSPE 118-2; and 11) in an alternative embodiment, a pre-adder block is added before the 25 bit A input to the multiplier 241 (FIGS. 28-30).

In another embodiment the 17-bit shifter 244 is replaced by an n-bit shifter and the 17-bit shifter 246 is replaced by an m-bit shifter, where "n" and "m" are integers. The n- and m-bit shifters can be either left or right shifters or both. In addition, in yet a further embodiment, these shifters can include rotation.

First, while the 25×18 multiplier 241 in FIG. 3 is different from the 18×18 multiplier 240 in FIG. 2, the 25×18 multiplier 241 has some similarity with the 18×18 multiplier 240 in that they both are Booth multipliers which use counters and compressors to produce two partial products PP2 and PP1, which must be added together to produce the product. In the case of multiplier 240, 11-to-4 and 7-to-3 counters are used. For multiplier 241 only improved 7-to-3 counters are used. The partial products from multiplier 240 are 36 bits. Both partial products from multiplier 241 are 43 bits: PP2[42:0] and PP1 [42:0]. PP2 is then extended with 5 ones to give [11111]||PP2 [42:0] (where the symbol "||" means concatenated) and PP1 is the extended with 5 zeros to give [00000]||PP1[42:0], so that each is 48 bits [47:0]. PP2[47:0] is sent via Y-Mux 250-2 to Y[47:0] of ALU 292 and PP1 [47:0] is sent via X-Mux 250-1 to X[47:0] of ALU 292.

The opmode settings of opmode register 252 for FIG. 3 are given in table 2 below:

TABLE 2

| Opmode [1:0] "X-Mux" | Opmode [3:2] "Y-Mux" | Opmode [6:4] "Z-Mux" |
| --- | --- | --- |
| 00 => zeros | 00 => zeros | 000 => zeros |
| 01 => PP1 | 01 => PP2 | 001 => PCIN |
| 10 => P (accumulate) | 10 => ones | 010 => P (accumulate) |
| 11 => A:B | 11 => C | 011 => C |
|  |  | 100 => MACC extend |
|  |  | 101 => Right shift 17 PCIN |
|  |  | 110 => Right shift 17 P |

Figure 17:
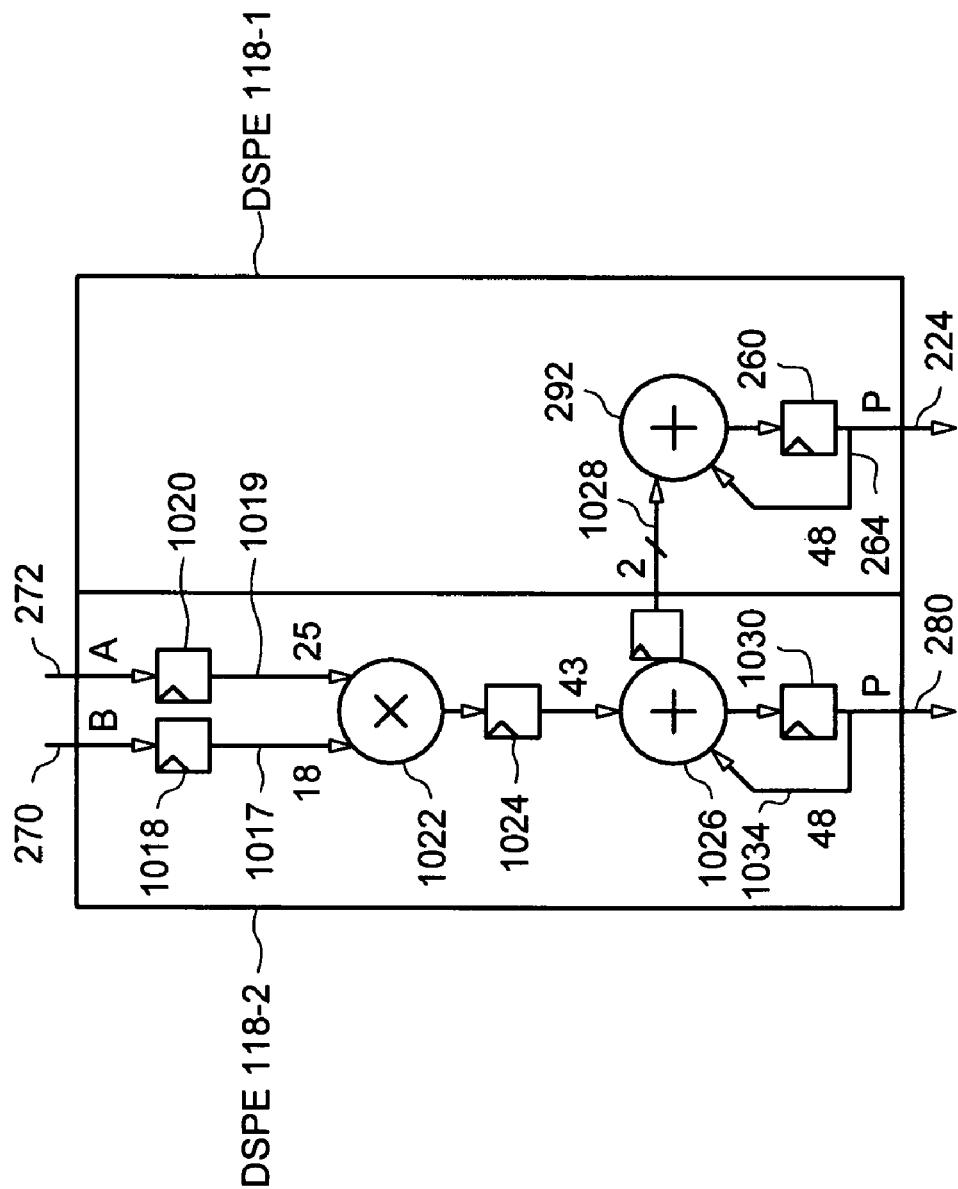
FIG. 17 is a simplified block diagram of an extended MACC operation using two digital signal processing elements (DSPE) of an embodiment of the present invention.
Figure 18:
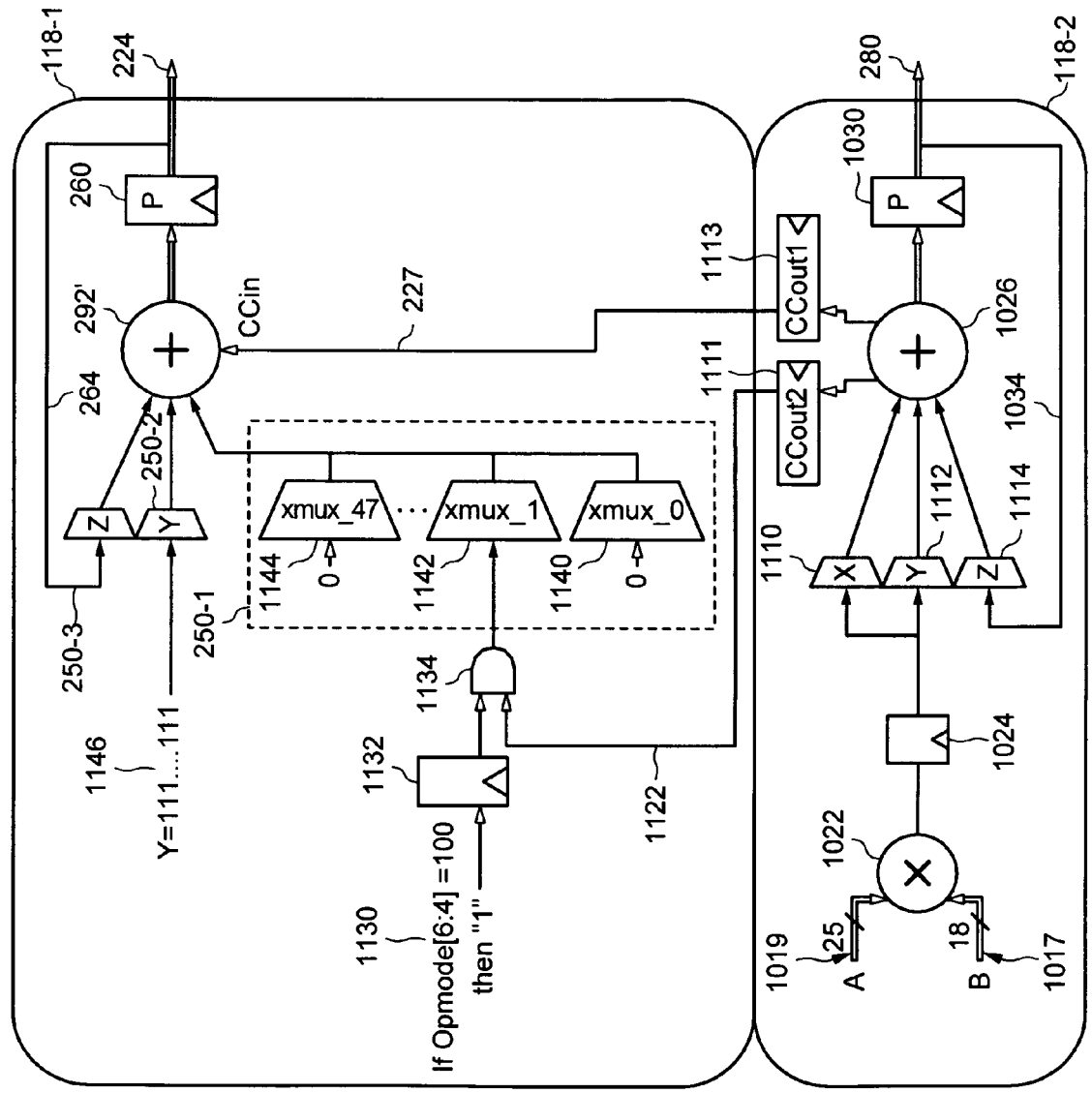
FIG. 18 is a more detailed schematic of the extended MACC of FIG. 17 of an embodiment of the present invention.

An Opmode [6:0] "1001000" for DSPE 118-2 is a special setting which automatically extends the multiply-accumulate (MACC) operation of DSPE 118-1 (e.g., DSPE 118-1 has opmode [6:0] 0100101) to form a 96 bit output (see FIGS. 17 and 18). Carryinsel 410 must also be set to choose CCin 227 (see FIG. 8).

Like in FIG. 2, the opmode register 252 in FIG. 3, in one embodiment of the invention, is coupled to the programmable interconnect and can be set dynamically. In another embodiment, the opmode register is similar to any other register in a microprocessor. In a further embodiment the opmode register is an instruction register like that in a digital signal processor and can be programmed by software. In an alternative embodiment, the opmode register is set using configuration memory cells.

Figures 1, 4A:
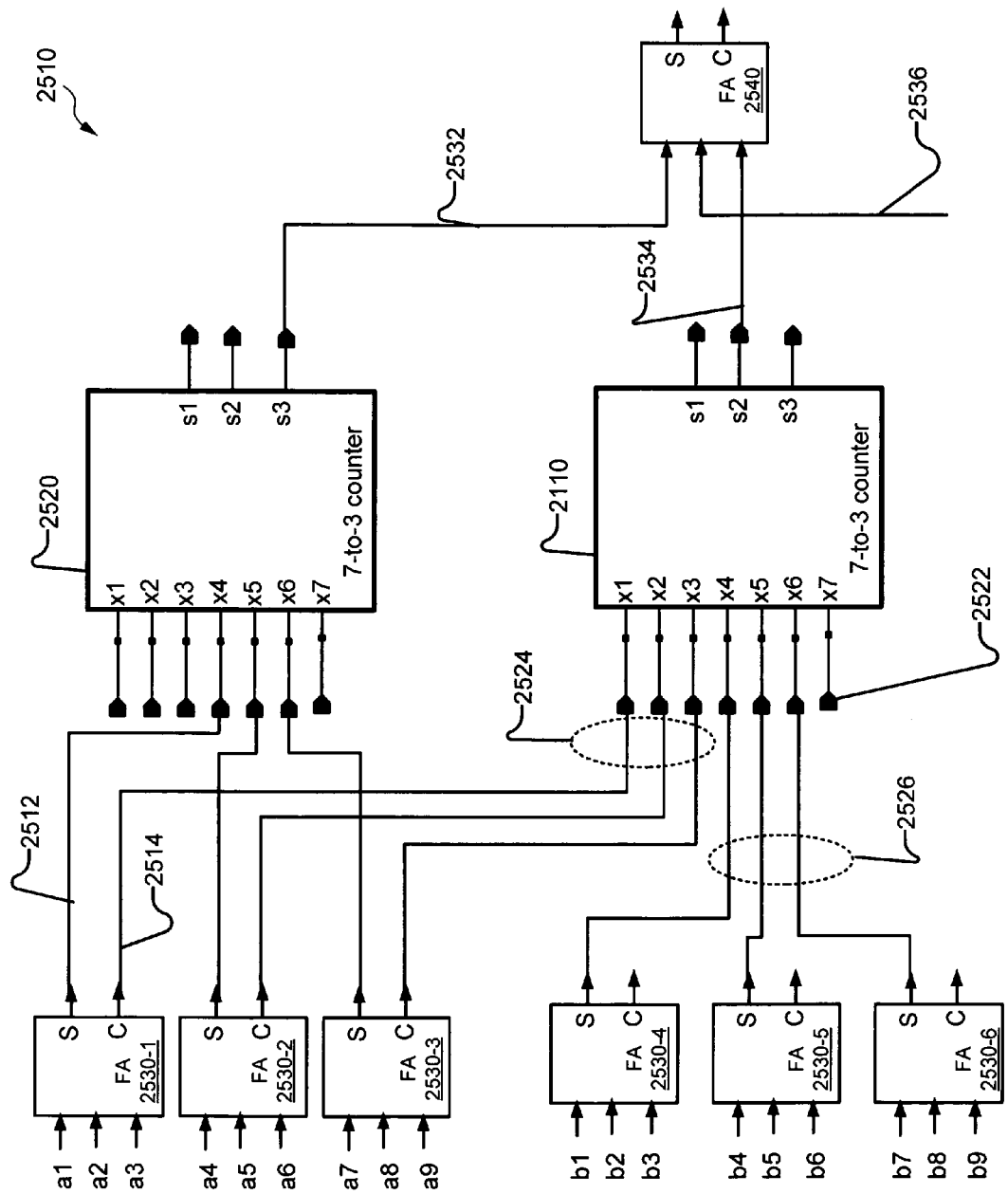
FIGS. 4A-1, A-2, B-F show examples of using an improved 7-to-3 counters for the multiplier of FIG. 3.
Figures 2, 4A:
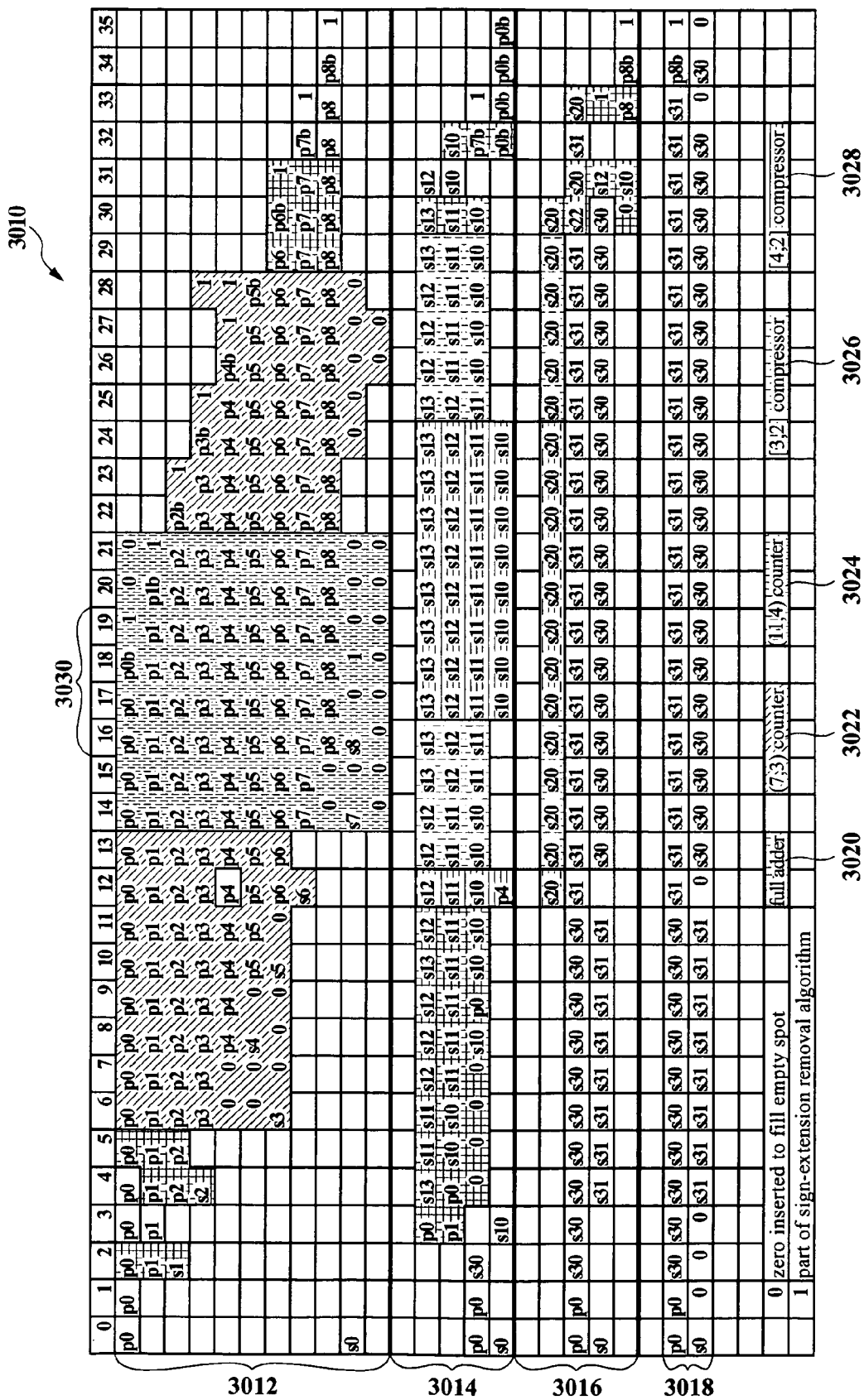

FIGS. 4A-1, A-2, B-F show examples of using an improved 7-to-3 counter for multiplier 241 of FIG. 3. Substantially, a 11-to-4 counter in multiplier 240 of FIG. 2 is replaced in multiplier 241 by an improved 7-to-3 counter and a full adder. FIG. 4A-1 is a schematic illustrating one portion of the multiple full adder to 7-to-3 counter connections that replace the 11-to-4 counters in FIG. 30 of U.S. patent application Ser. No. 11/019,783 (reproduced as FIG. 4A-2, the 11-to-4 counters are in columns 14-21). Nine bits a1 to a9 are input to three full adders FA 2530-1 to 2530-3. Each of these full adders produces a sum and carry output such as sum (S) 2512 and carry (C) 2514 of FA 1530-1. The sum bits of the three adders 2530-1 to 2530-3 are sent to 7-to-3 counter 2520. The carry bits of the three adders 2530-1 to 2530-3 are sent to second 7-to-3 counter 2110. Nine bits b1 to b9 are input to three full adders FA 2530-4 to 2530-6. The sum bits of the three adders 2530-4 to 2530-6 are sent to 7-to-3 counter 2110. The carry bits of the three adders 2530-4 to 2530-6 are sent to a downstream 7-to-3 counter (not shown). Thus for the 7-to-3 counter 2110, three bits, e.g., 2524, come from an upstream group of three FAs, and three bits, e.g., 2526, come from the three FAs associated with the 7-to-3 counter 2110, where the seventh bit is unused. The bit s2 2534 of 7-to-3 counter 2110, the bit s3 2532 of 7-to-3 counter 2520 and the bit s1 2536 of a downstream 7-to-3 counter (not shown) are added together in full adder 2540. The 7-to-3 counter layout in FIG. 4A-1 is repeated to form a column of 7-to-3 counters to replace the 11-to-3 counters.

Figure 4B:
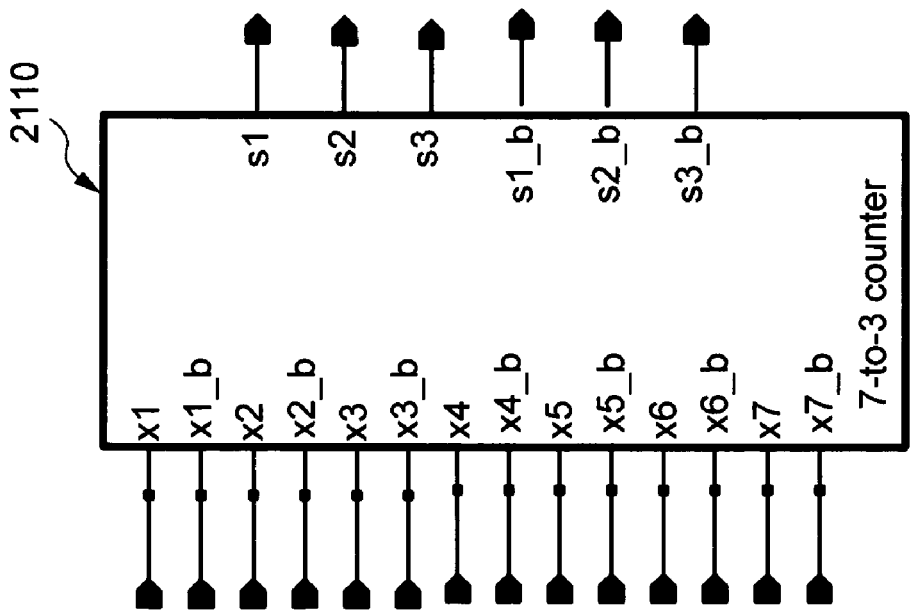

FIG. 4B is a symbol of 7-to-3 counter 2110 of an embodiment of the present invention. There are seven differential inputs x1, x1_*b*, x2, x2_*b*, x3, x3_*b*, x4, x4_*b*, x5, x5_*b*, x6, x6_*b*, x7, and x7_*b*, where "_*b*" means the inverse (e.g., x1_*b* is the inverse of x1). The counter 2110 has three differential outputs, s1, s1_*b*, s2, s2_*b*, s3, and s3_*b*. The 7-to-3 counter counts the number of ones in the bits x1 to x7 and outputs the 0 to 7 binary count using bits s1 to s3.

Figure 4C:
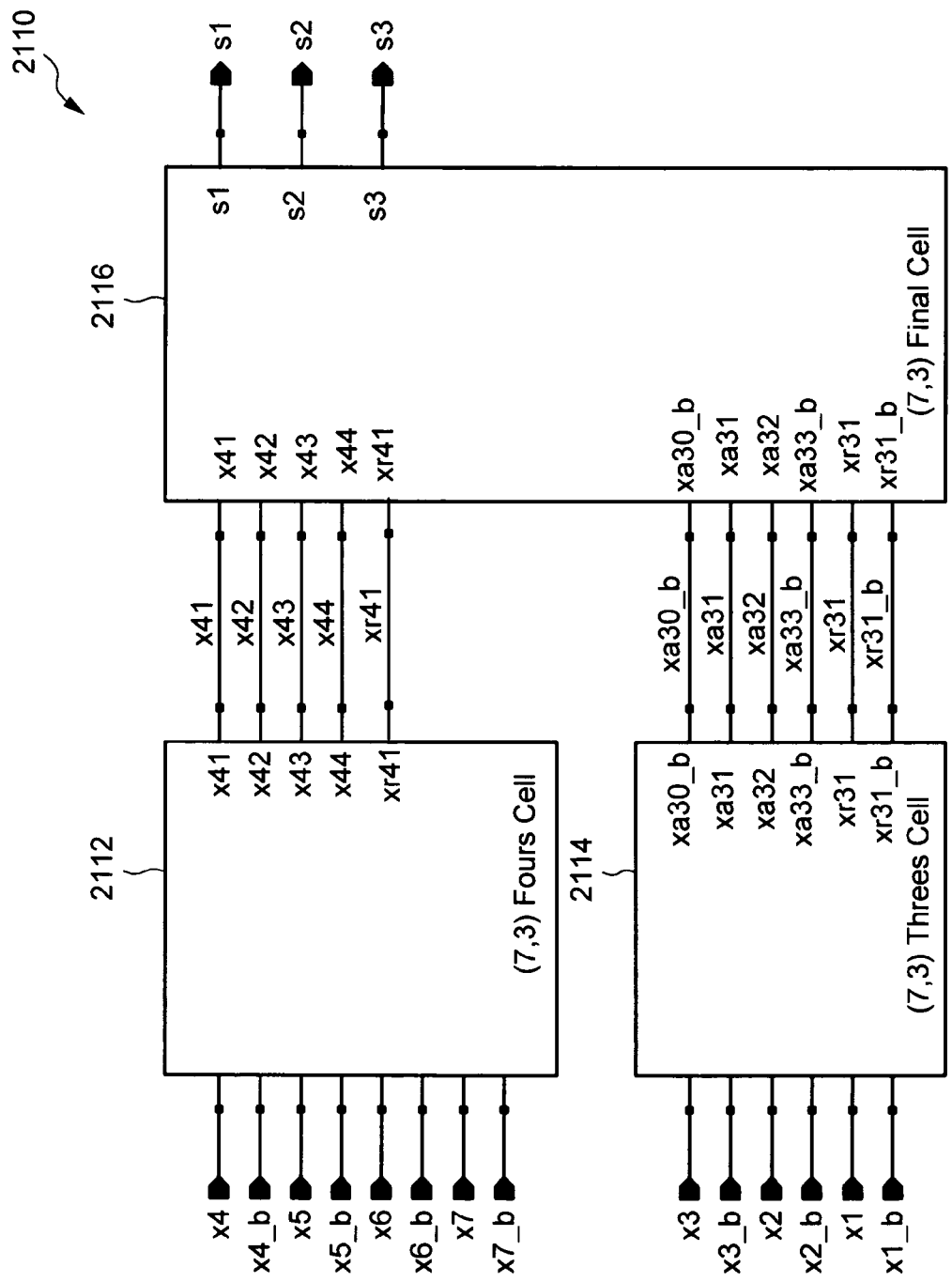

FIG. 4C shows a block diagram of 7-to-3 counter 2110. The diagram includes a fours cell 2112 and a threes cell 2114 coupled to a final cell 2116. The differential outputs s1, s2, and s3 and associated circuitry have been simplified for illustration purposes to show only the single ended outputs s1 to s3.

Figure 4D:
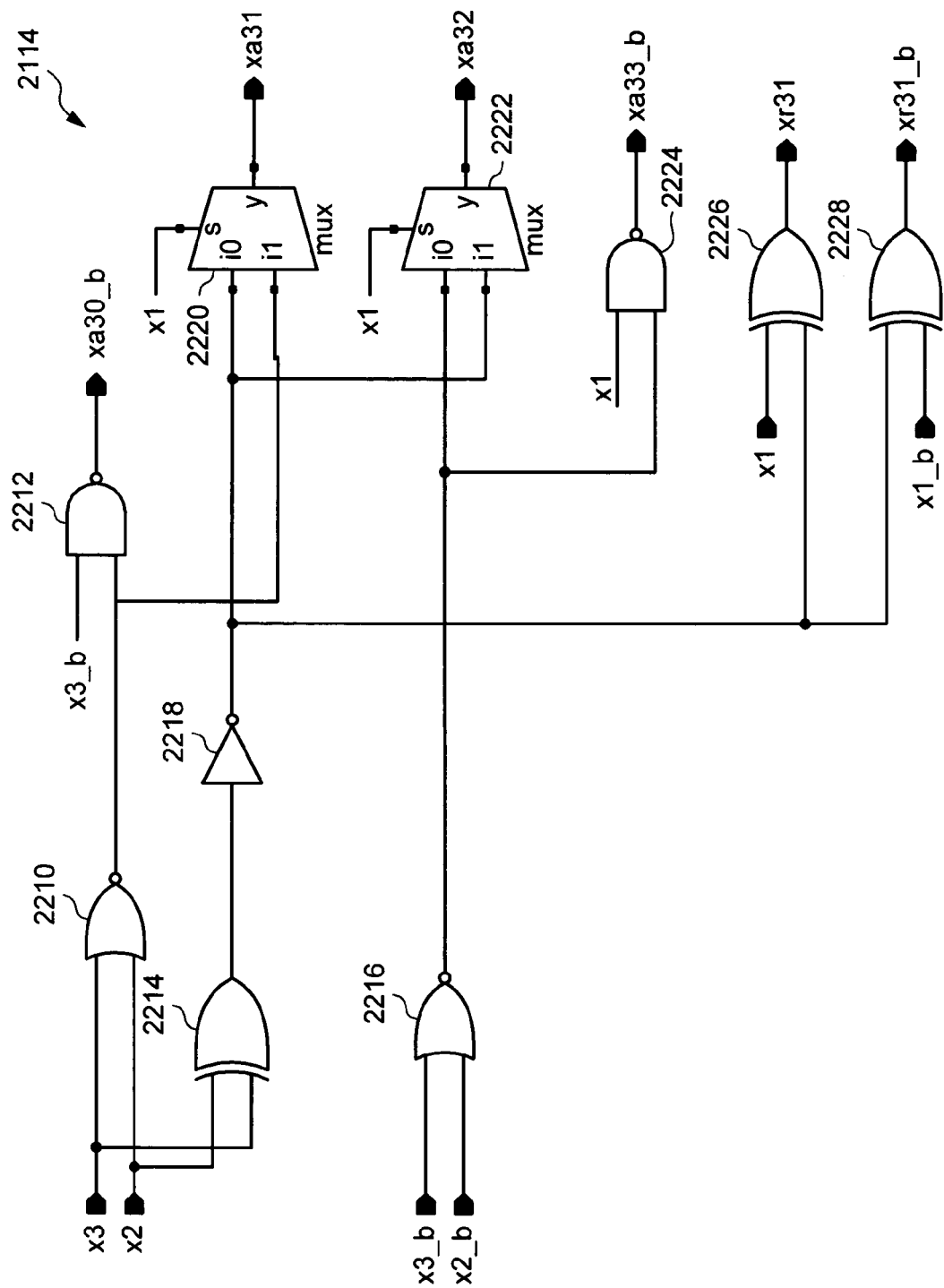

FIG. 4D is a schematic of the threes cell 2114. The inputs x1, x1_*b*, x2, x2_*b*, x3, and x3_*b* are coupled via NOR gates 2210 and 2216, XOR gates 2214, 2226, and 2228, inverter 2218, NAND gates 2212 and 2224, and multiplexers 2220 and 2222, to produce intermediate outputs xa30_*b*, xa31, xa32, xa33_*b*, xr31, and xr31_*b*.

Figure 4E:
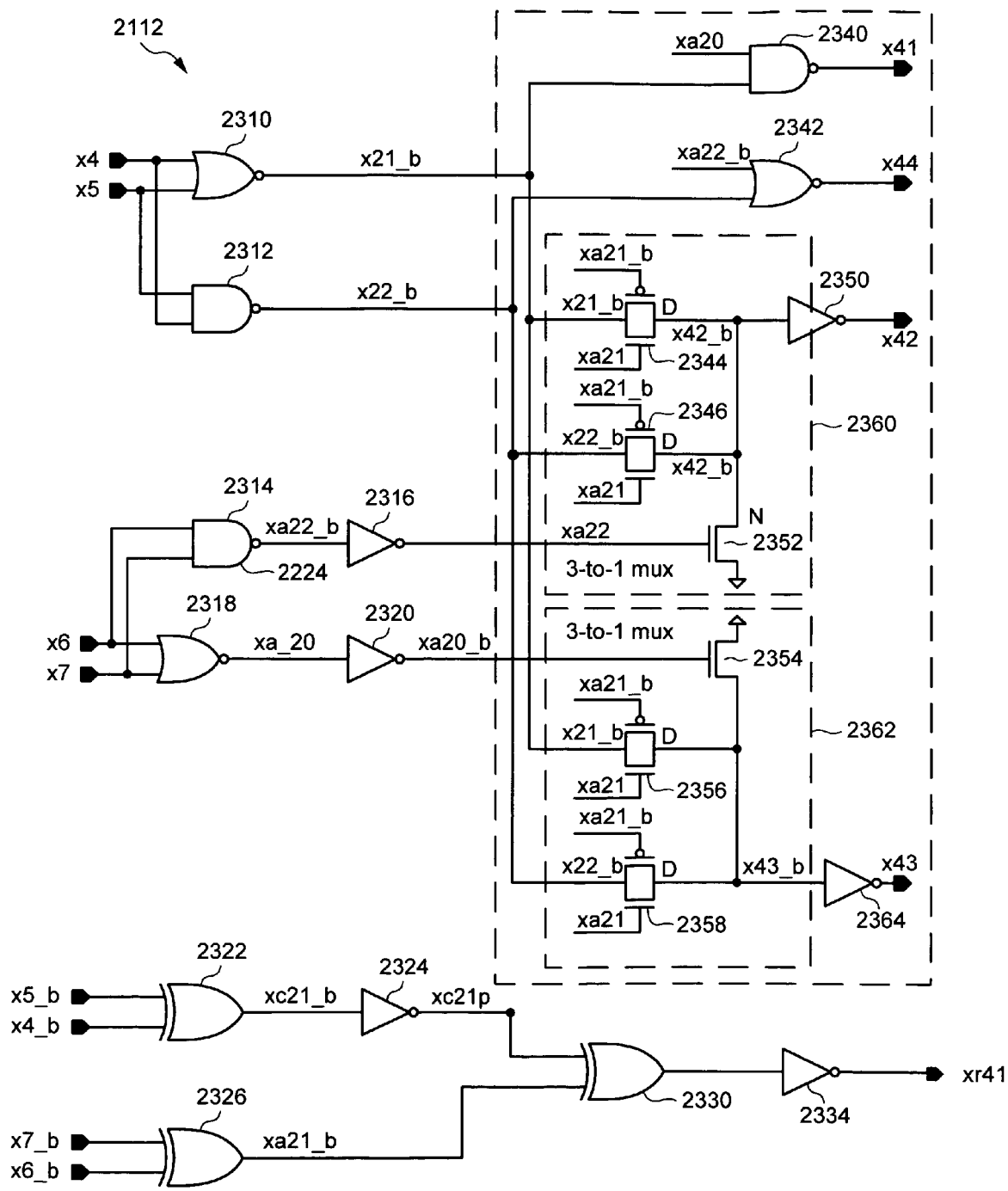

FIG. 4E is a schematic of the fours cell 2112. The inputs x4, x4_*b*, x5, x5_*b*, x6, x6_*b*, x7, and x7_*b* are coupled via NOR gates 2310, 2318, and 2342, XOR gates 2322, 2326, and 2330, inverters 2316, 2320, 2324, 2334, 2350, and 2364, NAND gates 2312, 2314 and 2340, and 3-to1 multiplexers 2360 and 2362, to produce intermediate outputs x41, x42, x43, x44, and xr41.

Figure 4F:
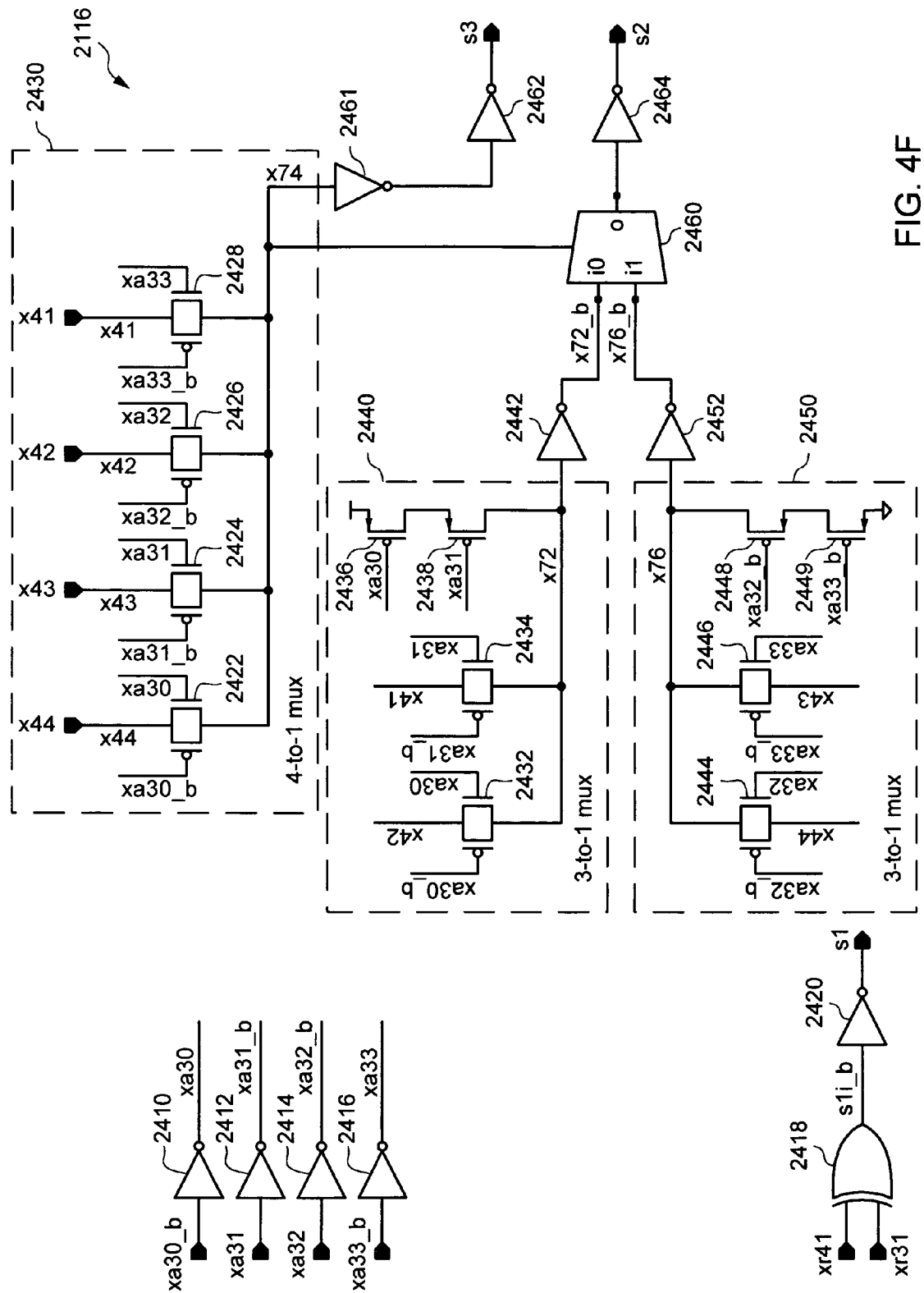

FIG. 4F is a schematic of the final cell 2116. The inputs xa30_*b*, xa31, xa32, xa33_*b*, xr31, x41, x42, x43, x44, and xr41 are coupled via XOR gate 2418, inverters 2410, 2412, 2414, 2416, 2420, 2442, 2452, 2461, 2462, and 2464, 2-to1 multiplexer 2460, 4-to1 multiplexer 2430, and 3-to1 multiplexers 2440 and 2450, to produce outputs s1, s2, and s3.

To continue with the differences between FIGS. 2 and 3, in FIG. 3, each DSPE 118-1 and 118-2 has its own C input registers 218-1 and 218-2, respectively. The C port 217' is 48 bits, which is input into the Y-Mux 250-2 and Z-Mux 250-3. The C input can be used with the concatenated A:B 228 signal for logic operations in the ALU 292, as will be discussed in more detail below.

Figure 5:
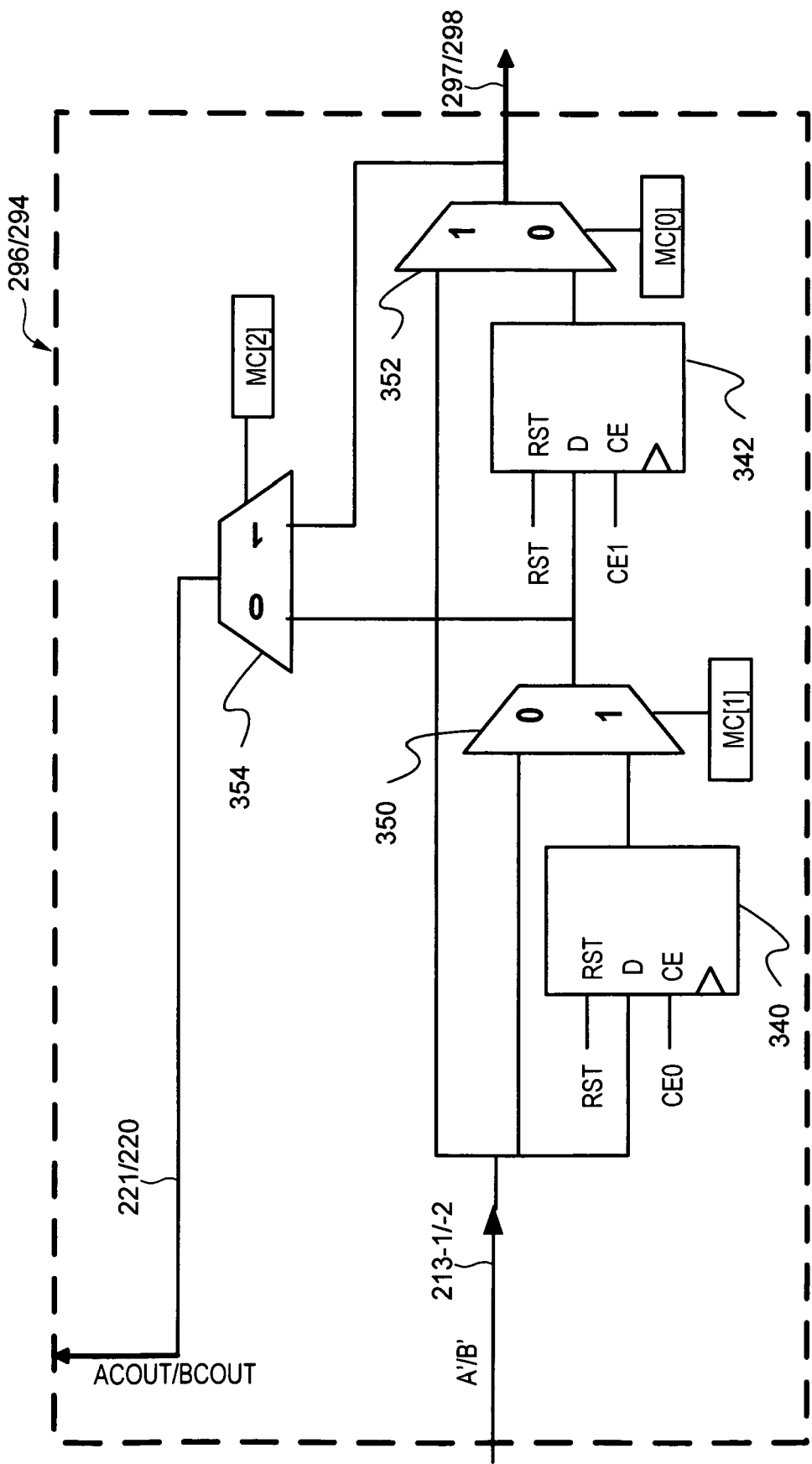
FIG. 5 shows a block diagram of the A register block and the similar B register block of FIG. 3 of an embodiment of the present invention.

In addition to the B cascade (BCIN 214, Mux 310, B register block 294, and BCOUT 220), there is an A cascade (ACIN 215, Mux 312, A register block 296, and ACOUT 221). FIG. 5 shows a block diagram of the A register block 296 and the similar B register block 294 of FIG. 3 of an embodiment of the present invention. As the A and B register blocks have the same or similar structure, only the A register block 296 will be described. Mux 312 (FIG. 3) selects between 30 bit A port input 212 and 30 bit ACIN 215 from DSPE 118-2. The output A' 213-1 of Mux 312 is input into D flip-flop 340, Mux 350 having select line connected to configuration memory cell MC[1], and Mux 352 having select line connected to configuration memory cell MC[0]. D flip-flop 340 has clock-enable CE0 and is connected to Mux 350. Mux 350 is connected to Mux 354, having select line connected to configuration memory cell MC[2], and to D flip-flop 342 having a clock-enable CE1. D flip-flop 342 is connected to Mux 352. Mux 352 is connected to Mux 354 and to output QA 297. The two different clock-enables CE0 and CE1 can be used to prevent D flip-flops 340 and 342, either separately, or together, from latching in any new data. For example flip-flops 340 or 342 can be used to store the previous data bit. In another example, data bits can be pipelined using flip-flops 340 and 342. In yet another example, the use of CE0 and CE1 can be used to store two sequential data bits. In a further example, the plurality of registers, i.e., flip-flops 340 and 342, can be configured for selective storage of input data for one or two clock cycles. In another embodiment the configuration memory cells MC[2:0] are replaced by bits in a registers, other types of memory or dynamic inputs, so that the multiplexers can be dynamically set.

FIG. 6 shows a table 301 giving different configuration memory cell settings for FIG. 5 in order to have a selected number of pipeline registers (e.g., D flip-flops 340 and/or 342) in the A register block 296 for QA 297 and for ACOUT 221 of FIG. 3. For zero registers, set MC[2]=1, MC[1]=0, and MC[0]=1. Hence for this setting, from FIG. 5, the signal A' 213-1 goes to Mux 352 and then from Mux 352 to QA 297 and ACOUT 221 via Mux 354. Both D flip-flops 340 and 342 are bypassed. For MC[2:0]=010, there are 2 pipeline registers 340 and 342 for the current DSPE (e.g., 118-1) from A' 213-1 to QA 297, and one pipeline register 340 via Muxs 350 and 354 to the cascade DSPE (e.g., the DSPE above 118-1 which is not shown in FIG. 3) from A' 213-1 to ACOUT. For MC[2:0]=010, the separate clock enables CE0 and CE1 facilitate the capability of clocking new data along the A/B cascade, yet not changing data input to the multiplier; when a new set of data has been clocked into cascade register via CE0, then CE1 assertion transfers cascade data to all multiplier inputs in the cascade of DSPEs. Other pipeline register variations can be determined from FIG. 6 by one of ordinary skill in the arts. While in one embodiment MC[2], MC[1], and MC[0] are configuration memory cells in other embodiments they may be coupled to a register like the opmode register 252 and may be changed dynamically rather than reconfigured or they be non-volatile memory cells or some combination thereof.

Figure 7:
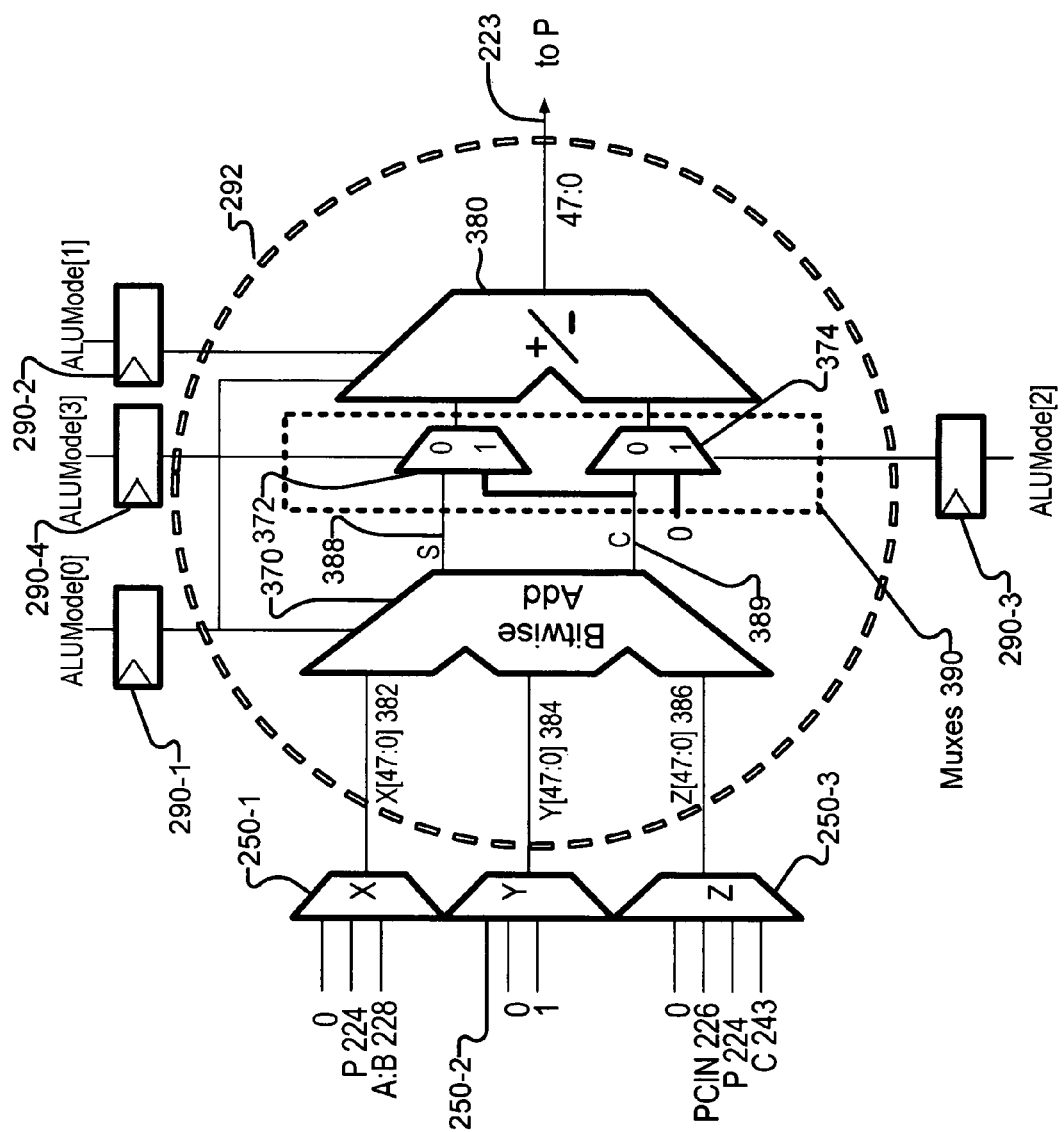
FIG. 7 is a block diagram of the ALU of FIG. 3 of an embodiment of the present invention.

FIG. 7 is a block diagram of the ALU 292 of FIG. 3 of an embodiment of the present invention. With reference to FIG. 3, the ALU 292 is shown for the case when the multiplier 241 is bypassed. The inputs to X-Mux 250-1 are P 224 and A:B 228. The output QA is 30 bits which are concatenated with the 18 bit output QB 298 to give 48 bit A:B 228. Y-Mux 250-2 has input of 48 bits of 1 or 48 bits of 0. Z-Mux 250-3 48 bits of 0, PCIN 226, P 224, and C 243. Bitwise Add 370 receives ALUMode[0] which can invert the Z-Mux input, when ALUMode[0]=1 (there is no inversion when ALUMode[0]=0). Bitwise Add 370 bitwise adds the bits from X-Mux 250-1 (i.e., X[47:0] 382), Y-Mux 250-2 (i.e., Y[47:0] 384), and Z-Mux 250-3 (i.e., Z[47:0] 386) to produce a sum (S) 388 and Carry (C) 389 for each three input add. For example, bitwise add 370 can add X[0]+Y[0]+Z[0] to give S[0] and C[1]. Concurrently, X[1]+Y[1]+Z[1] gives S[1] and C[2], X[2]+Y[2]+Z[2] gives S[2] and C[3], and so on.

The Sum (S) output 388 along with the Carry (C) output 389 is input to multiplexer 372 which is controlled by ALUMode[3]. Multiplexer 374 selects between the Carry (C) output 389 and a constant 0 input, via control ALUMode[2]. The outputs of multiplexers 372 and 374 are added together via carry propagate adder 380 to produce output 223 (which becomes P 224 via Mux 318). Carry lookahead adder 380 receives ALUMode[1], which inverts the output P 223, when ALUMode[1]=1 (there is no inversion, when ALUMode[1]=0). Because $$Z-(X+Y+Cin)=Z+(X+Y+Cin)$$  [Eqn 1]

Inverting Z[47:0] 386 and adding it to Y[47:0] 384 and X[47:0] 382 and then inverting the sum produced by adder 380 is equivalent to a subtraction.

The 4-bit ALUMode [3:0] controls the behavior of the ALU 292 in FIG. 3. ALUMode [3:0]=0000 corresponds to add operations of the form Z+(X+Y+Cin) in FIG. 3, which corresponds to Subtract register 256=0 in FIG. 2. ALUMode [3:0]=0011 also corresponds to subtract operations of the form Z−(X+Y+Cin) in FIG. 3, which is equivalent to Subtract register 256=1 in FIG. 2. ALUMode [3:0] set to 0010 or 0001 can implement −Z±(X+Y+Cin)−1.

Table 3 below gives the arithmetic (plus or minus) and logical (xor, and, xnor, nand, xnor, or, not, nor) functions that can be performed using FIG. 7. Note if ALUMode [3:0]= 0011 then (Z MINUS X), which is equivalent to NOT(X PLUS (NOT Z)).

TABLE 3

| If Opmode [3:2] = "00" and Y => zeros, then ALUMode [3:0]: | If Opmode [3:2] = "10" and Y => ones, then ALUMode [3:0]: |
|---|---|
| 0000 => X PLUS Z | 0100 => X XNOR Z |
| 0001 => X PLUS (NOT Z) | 0101 => X XOR Z |
| 0010 => NOT (X PLUS Z) | 0110 => X XOR Z |
| 0011 => Z MINUS X | 0111 => X XNOR Z |
| 0100 => X XOR Z | 1100 => X OR Z |
| 0101 => X XNOR Z | 1101 => X OR (NOT Z) |
| 0110 => X XNOR Z | 1110 => X NOR Z |
| 0111 => X XOR Z | 1111 => (NOT X) AND Z |
| 1100 => X AND Z | |
| 1101 => X AND (NOT Z) | |
| 1110 => X NAND Z | |
| 1111 => (NOT X) OR Z | |

As an example of how FIG. 7 and table 3 provide for logic functions let X=A:B[5:0]=11001 and Z=C[5:0]=01100. For Opmode [3:2]="00", Y=>zeros and ALUMode [3:0]=1100, the logic function is X AND Z. The bitwise add 370 gives:

```
 1  1  0  0  1     X = A:B
 0  1  1  0  0     Z = C reg
 0  0  0  0  0     Y
01 10 01 00 01     Carry Sum
```

As ALUMode [3]=1, Mux 372 selects C 389, and as ALUMode [2]=1, Mux 374 selects 0. Adding C 389+0 in carry look ahead adder 380 gives Sum=01000, which is the correct answer for 11001 AND 01100 (i.e. X AND Z).

As another example, for Opmode [3:2]="00", Y=>zeros and ALUMode [3:0]=0100, the logic function is X XOR Z. The bitwise add is the same as X AND Z above. As ALUMode [3]=0, Mux 372 selects S 388, and as ALUMode [2]=1, Mux 374 selects 0. Adding S 388+0 in carry look ahead adder 380 gives Sum=10101, which is the correct answer for 11001 XOR 01100.

The ALUmode register 290 in FIG. 3 and registers 290-1 to 290-4 (collectively, 290) in FIG. 7, in one embodiment of the invention, are coupled to the programmable interconnect and can be set dynamically. In another embodiment, the ALUmode register is similar to any other register in a microprocessor. In a further embodiment the ALUmode register is an instruction register like that in a digital signal processor and can be programmed by a user. In an alternative embodiment, the ALUmode register is set using configuration memory cells.

Figure 8:
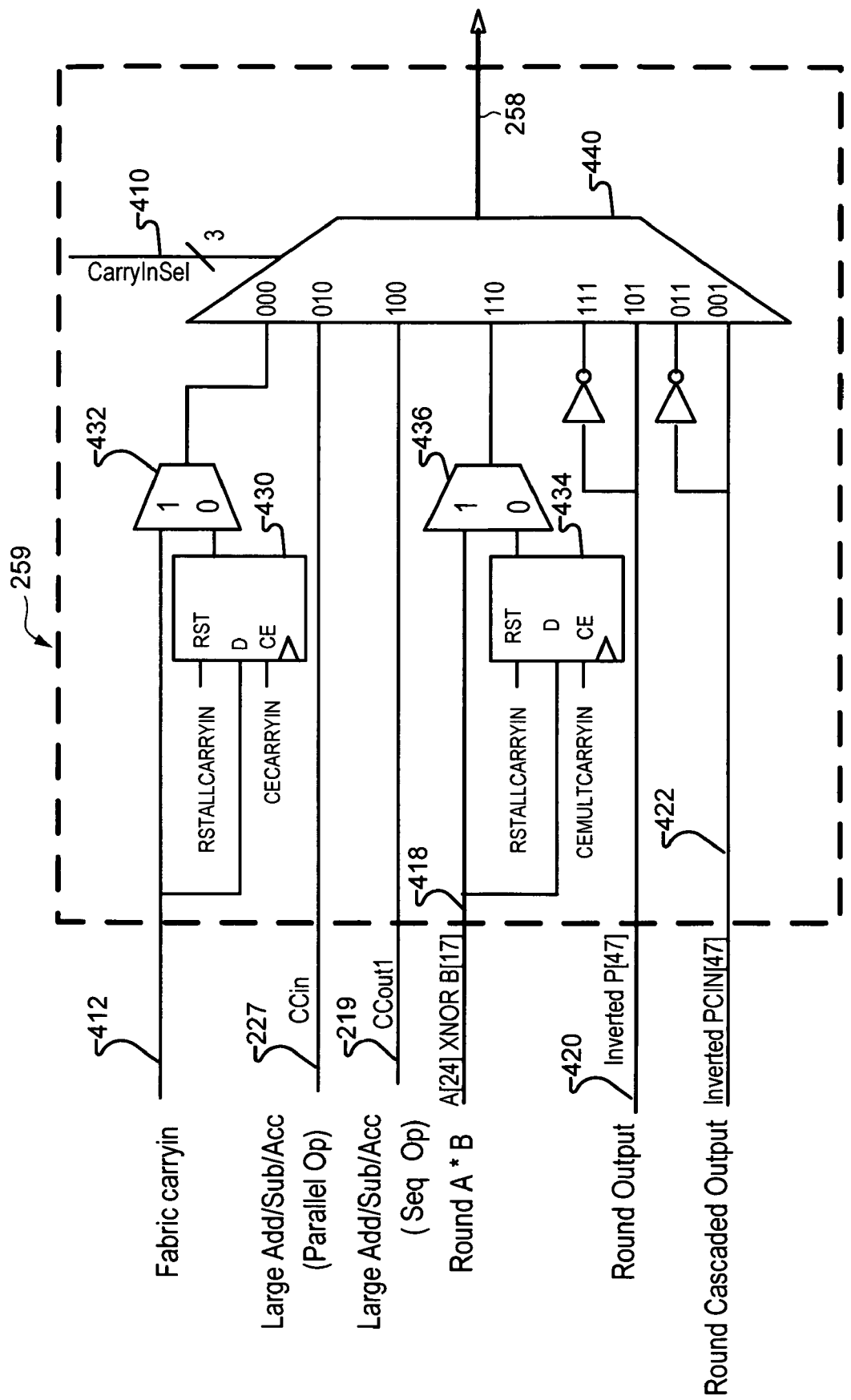
FIG. 8 is a block diagram of the CarryIn Block of FIG. 3 of an embodiment of the present invention.

FIG. 8 is a block diagram of the CarryIn Block 259 of FIG. 3 of an embodiment of the present invention. The CarryIn Block 259 includes a multiplexer (Mux) 440 with eight inputs [000] to [111], which are selected by a three bit CarryInSel line 410. The CarryInSel line 410 can be coupled to a register or to configuration memory cells or any combination thereof. The output 258 of CarryIn Block 259 is a bit that is the carryin (Cin) input to Carry Lookahead Adder 620 (see FIG. 11). A fabric carryin 412 from the programmable interconnect of, for example a PLD, is coupled to flip-flop 430 and Mux 432, where Mux 432 is coupled to the "000" input of Mux 440. Mux 432 being controlled by a configuration memory cell (in another embodiment Mux 432 can be controlled by a register). A cascade carry in (CCin) 227 from the CCout 279 of an adjacent DSPE 118-2 (see FIG. 3) is coupled to the "010" input of Mux 440. The cascade carry out (CCout1) from Carry Lookahead Adder 620 of the same DSPE 118-1 is coupled to the "100" input of Mux 440. Thus, as illustrated by the dotted line 229 in FIG. 3 the carryout CCout1 219 of ALU 292 is feed back to the ALU 292 via the CarryIn Block 259. The correction factor 418 (round A*B) is given by A[24] XNOR B[17] and is combined with rounding constant K to give the correct symmetric rounding of the result as described in U.S. patent application Ser. No. 11/019,783. Round A*B 418 is coupled to flip-flop 434 and Mux 436, where Mux 436 is coupled to the "110" input to Mux 440. Mux 436 being controlled by a configuration memory cell(in another embodiment Mux 436 can be controlled by a register). The round output bit 420 is the most significant P 224 bit inverted, i.e., inverted P[47]. The round output bit 420 is input to the "101" input of Mux 440 and in its inverted form to the "111" input of Mux 440. The round cascaded output bit 422 is the most significant bit of P 280 (PCIN 226) inverted, i.e., inverted PCIN[47]. The round cascaded output bit 422 is input to the "001" input of Mux 440 and in its inverted form to the "011" input of Mux 440. The selected output of Mux 440 is Cin 258 which is coupled to ALU 292.

Table 4 below gives the settings for CarryInSel 410 and their functions according to one embodiment of the present invention. Note for rounding, the C register has a rounding constant.

TABLE 4

| CarryIn Sel | | | | |
|---|---|---|---|---|
| 2 | 1 | 0 | Select | Notes |
| 0 | 0 | 0 | carryin from fabric 412 | Default - |
| 0 | 0 | 1 | PCIN_b[47] 422 | for rounding PCIN (round towards infinity) |
| 0 | 1 | 0 | CCin 227 | for larger add/sub/acc (parallel operation) |
| 0 | 1 | 1 | PCIN[47] 422 | for rounding PCIN (round towards zero) |
| 1 | 0 | 0 | CCout1 219 | for larger add/sub/acc (sequential operation) |
| 1 | 0 | 1 | P_b[47] 420 | for rounding P (round towards infinity) |
| 1 | 1 | 0 | A[24] XNOR B[17] 418 | for symmetric rounding A*B; |
| 1 | 1 | 1 | P[47] 420 | for rounding P (round towards zero) |

Figure 9:
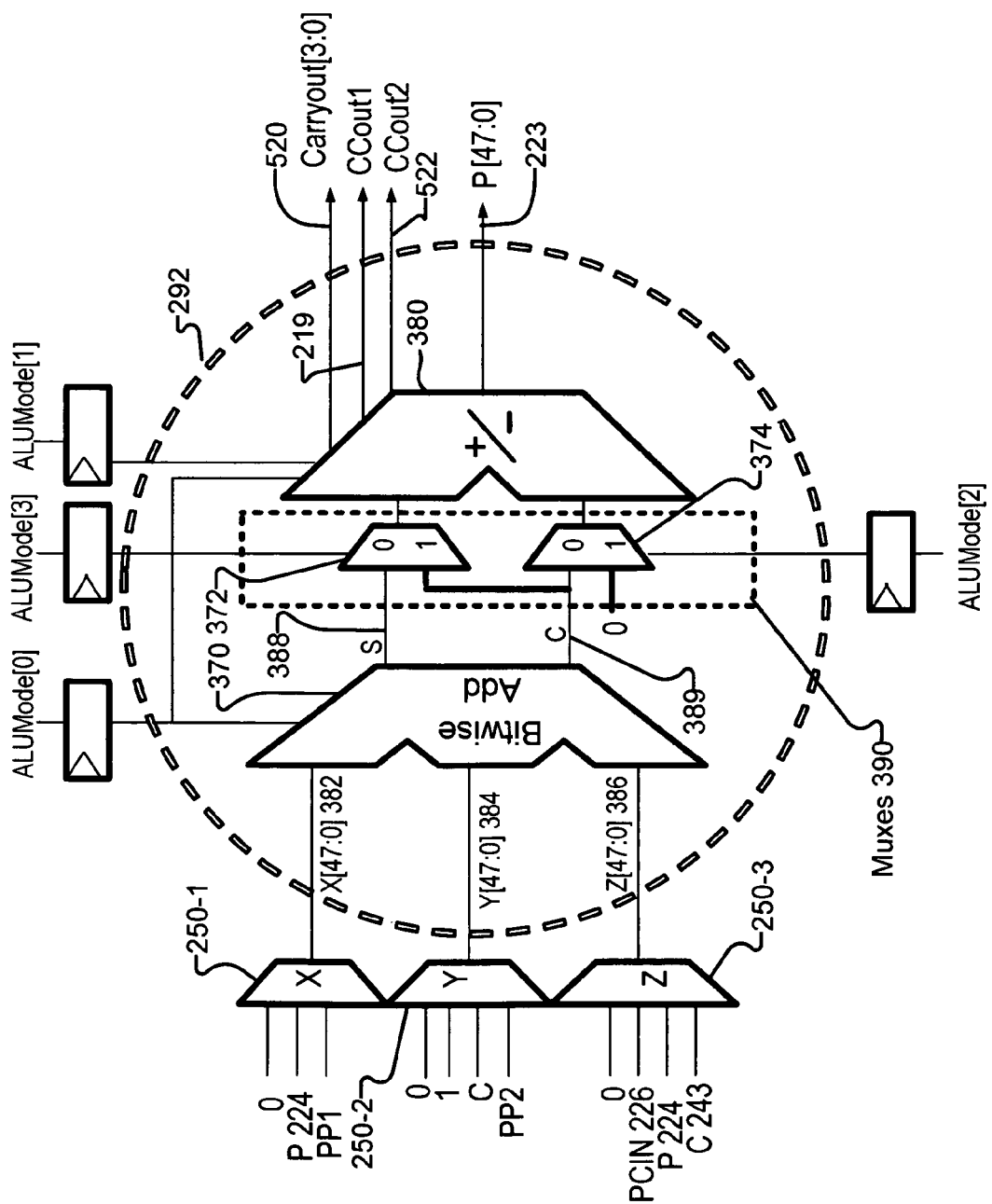
FIG. 9 is a block diagram of the ALU of another embodiment of the present invention.

FIG. 9 is a block diagram of the ALU 292 of another embodiment of the present invention. FIG. 9 is similar to FIG. 7 except the carryouts, i.e., Carryout[3:0] 520, CCout1 219, and CCout2 522, of adder 380 are shown. In addition, the multiplier 241 is used to produce partial products PP1 and PP2. The four carryout bits Carryout[3:0] are for the users use in single instruction multiple data (SIMD) addition such as that illustrated in FIGS. 15 and 16 (discussed below). CCout1 219 is the carryout of ALU 292 in FIG. 3 that is sent to an ALU of an upstream DSPE (not shown). CCout2 552 is a special multiply_accumulate carryout used for expanding word width for the multiply-accumulate function of adder 380 using an adjacent DSPE adder as illustrated in FIGS. 17 and 18 (discussed below).

Figure 10:
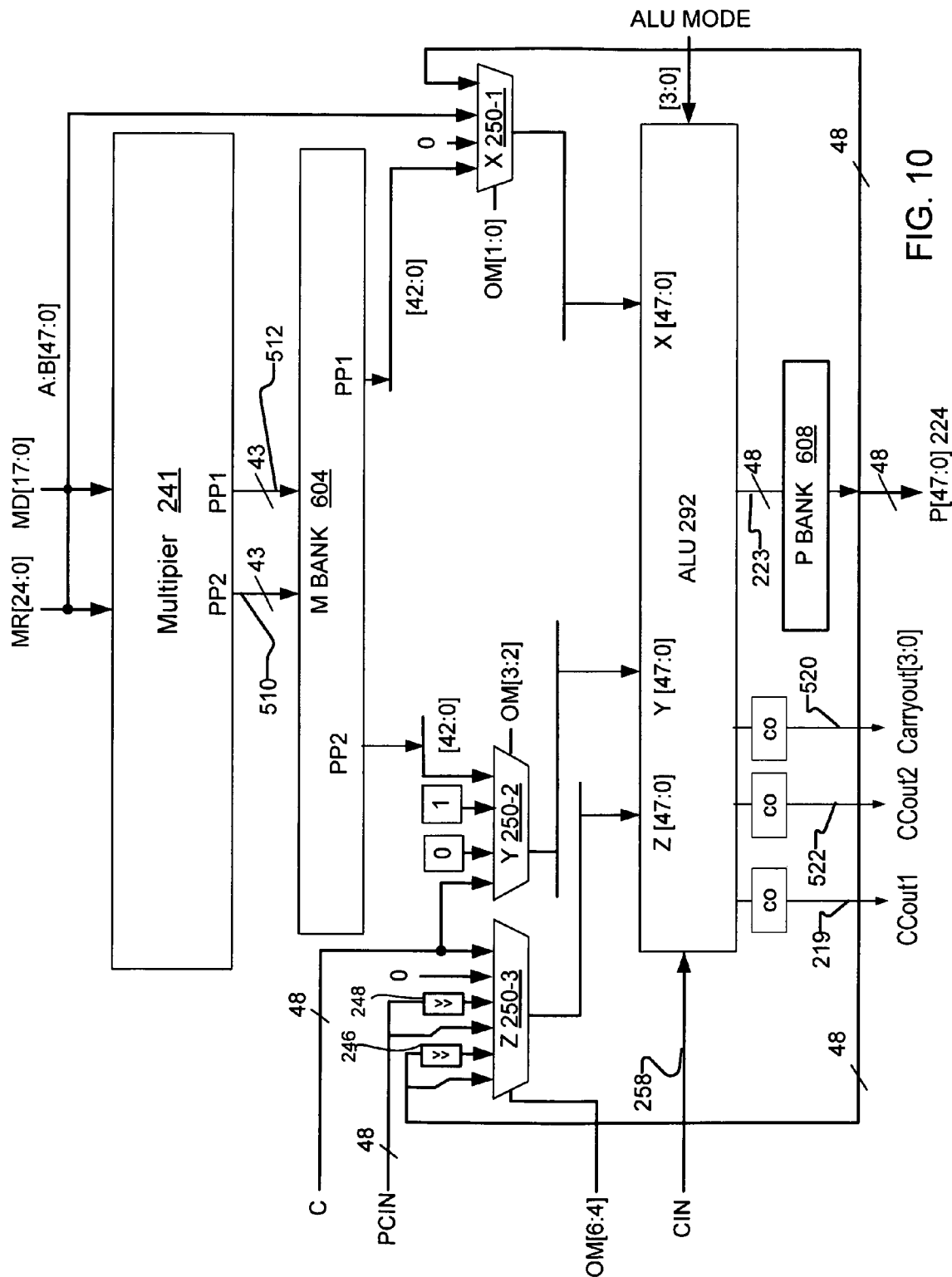
FIG. 10 is a schematic of part of a DSPE in accordance with one embodiment.

FIG. 10 is a schematic of part of a DSPE in accordance with one embodiment of the present invention. FIG. 10 has similar elements to DSPE 118-1 of FIG. 3, including multiplier 241, M bank 604 (which includes M register 242 and Mux 316), multiplexing circuitry 250, ALU 292, and P bank 608 (which includes P register 260 and Mux 318). ALU 292 can optionally output carry out bits, e.g., CCout1 219 from a first co register, CCout2 522 from a second co register, and Carryout [3:0] 520 from a plurality of co registers. Also, where applicable, the same labels are used in FIG. 3 as in FIG. 10 for ease of illustration.

The multiplexing circuitry 250 includes an X multiplexer 250-1 dynamically controlled by two low-order OpMode bits OM[1:0], a Y multiplexer 250-2 dynamically controlled by two mid-level OpMode bits OM[3:2], and a Z multiplexer 250-3 dynamically controlled by the three high-order OpMode bits OM[6:4]. OpMode bits OM[6:0] thus determine which of the various input ports present data to ALU 292. The values for OpMode bits are give in table 2 above.

Figure 11:
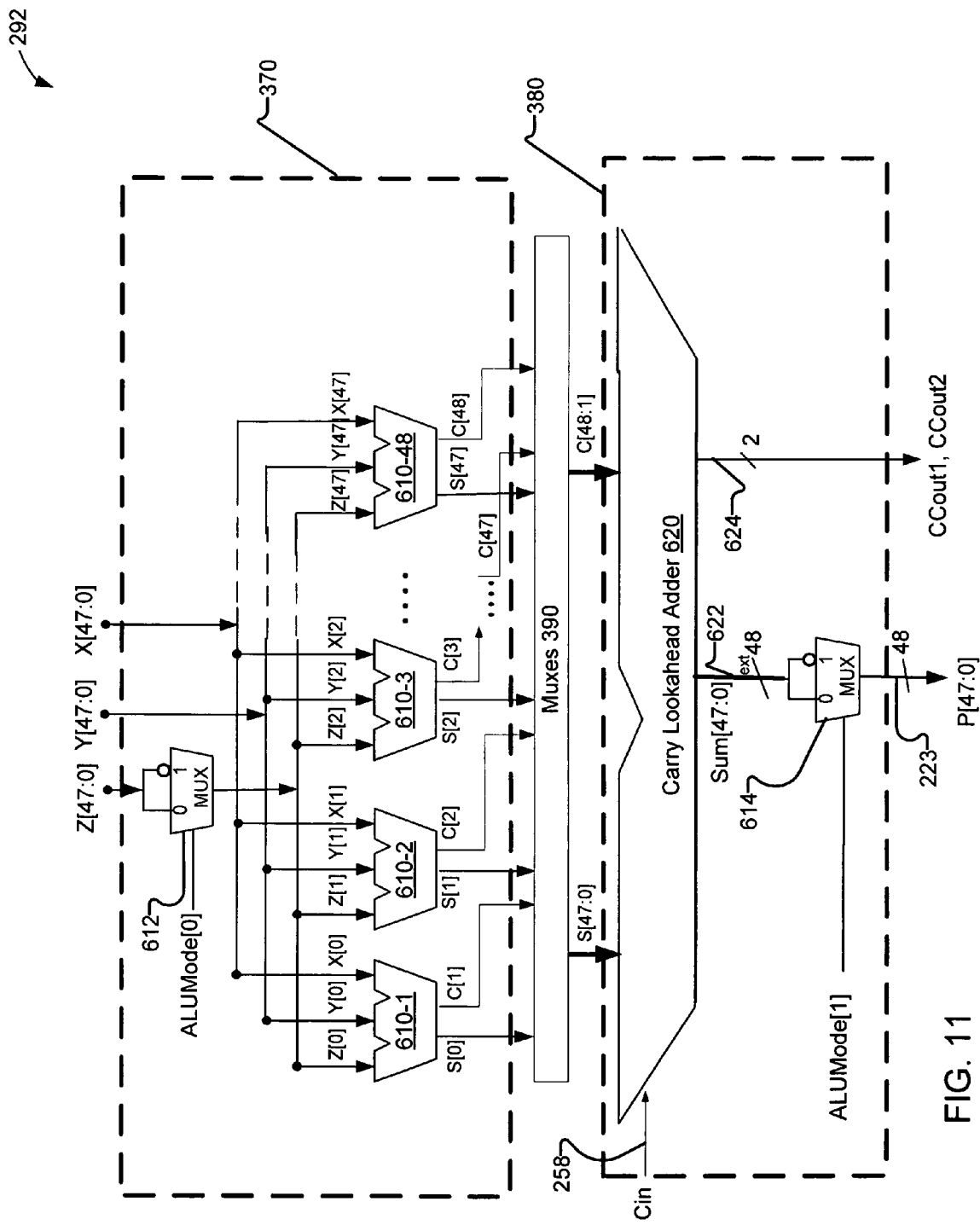
FIG. 11 is an expanded view of ALU of FIG. 10.

With reference to FIGS. 9 and 10, FIG. 11 is an expanded view of ALU 292. The bitwise add circuit 370 includes a multiplexer 612 and a plurality of three bit adders 610-1 to 610-48 that receive inputs X[47:0], Y[47:0] and Z[47:0] and produce sum and a carry bit outputs S[47:0] and C[48:1]. Z[47:0] may be inverted by Mux 612 depending upon ALU-Mode[0]. For example, adder 610-1 adds together bits Z[0]+Y[0]+X[0] to produce sum bit S[0] and carry bit C[1]. Muxes 390 is shown in more detail in FIG. 9. Adder 380 includes Carry Lookahead Adder 620 which receives inputs Cin 258 from CarryInBlock 259 (FIG. 3), S[47:0], and C[48:1] and produces the summation of the input bits Sum[47:0] 622 and carryout bits CCout1 and CCout2. The Sum[47:0] can be inverted via Mux 614 depending upon ALUMode[1] to produce P[47:0]. The Muxes 612 and 614 provide for subtraction as illustrated by equation Eqn 1 above.

Figure 12:
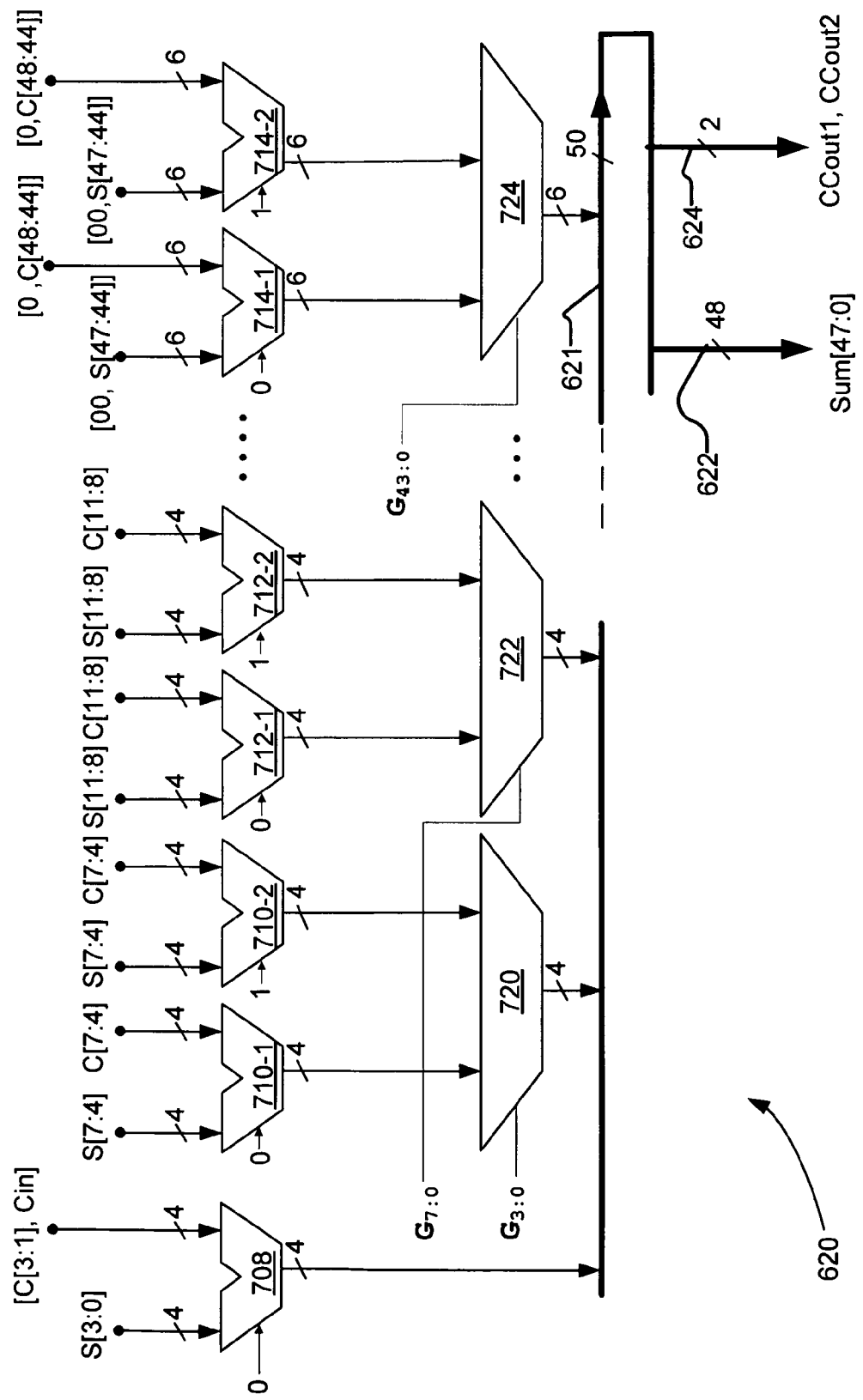
FIG. 12 is a schematic of Carry Lookahead Adder of an embodiment of the present invention.

FIG. 12 is a schematic of Carry Lookahead Adder 620 of an embodiment of the present invention. Carry Lookahead Adder 620 includes a series of four bit adders, for example 708 to 712, that add together S[3:0]+[C[3:1], Cin] to S[11:8]+C[11:8] and so forth till S[43:40]+C[43:40]. The last four sum bits S[47:44] are extended by two zeros, i.e., 00||S[47:44], and added to the last five sum bits C[48:44] extended by one zero, i.e., 0||C[48:44], in adders 714-1 and 714-2. The adders except for the first adder 708 come in pairs. For example, adder 710-1 with carry in of 0 and adder 710-2 with carry in 1, both add S[7:4] to C[7:4]. This allows parallel addition of the sum and carry bits covering the two possibilities that the carryout from adder 708 can be a 1 or 0. A multiplexer 720 then selects the output from adders 710-1 or 710-2 depending on the value of bit $G_{3:0}$, which is further explained in U.S. patent application Ser. No. 11/019,783, which is herein incorporated by reference. Likewise adder 714-1 receives a 0 carry in and adder 714-2 receives a 1 carryin. Mux 724 then selects the output from adders 714-1 or 714-2 depending on the value of bit $G_{43:0}$, which again is further explained in U.S. patent application Ser. No. 11/019, 783. The outputs of Carry Lookahead Adder 620 are the sum of two 50 bit numbers [0, C[48:1], Cin]+[00, S[47:0]], which produces a 50 bit summation: Sum[47:0] 622 plus two carryouts CCout1 (the $49^{th}$ bit) and CCout2 (the $50^{th}$ bit).

Figure 13:
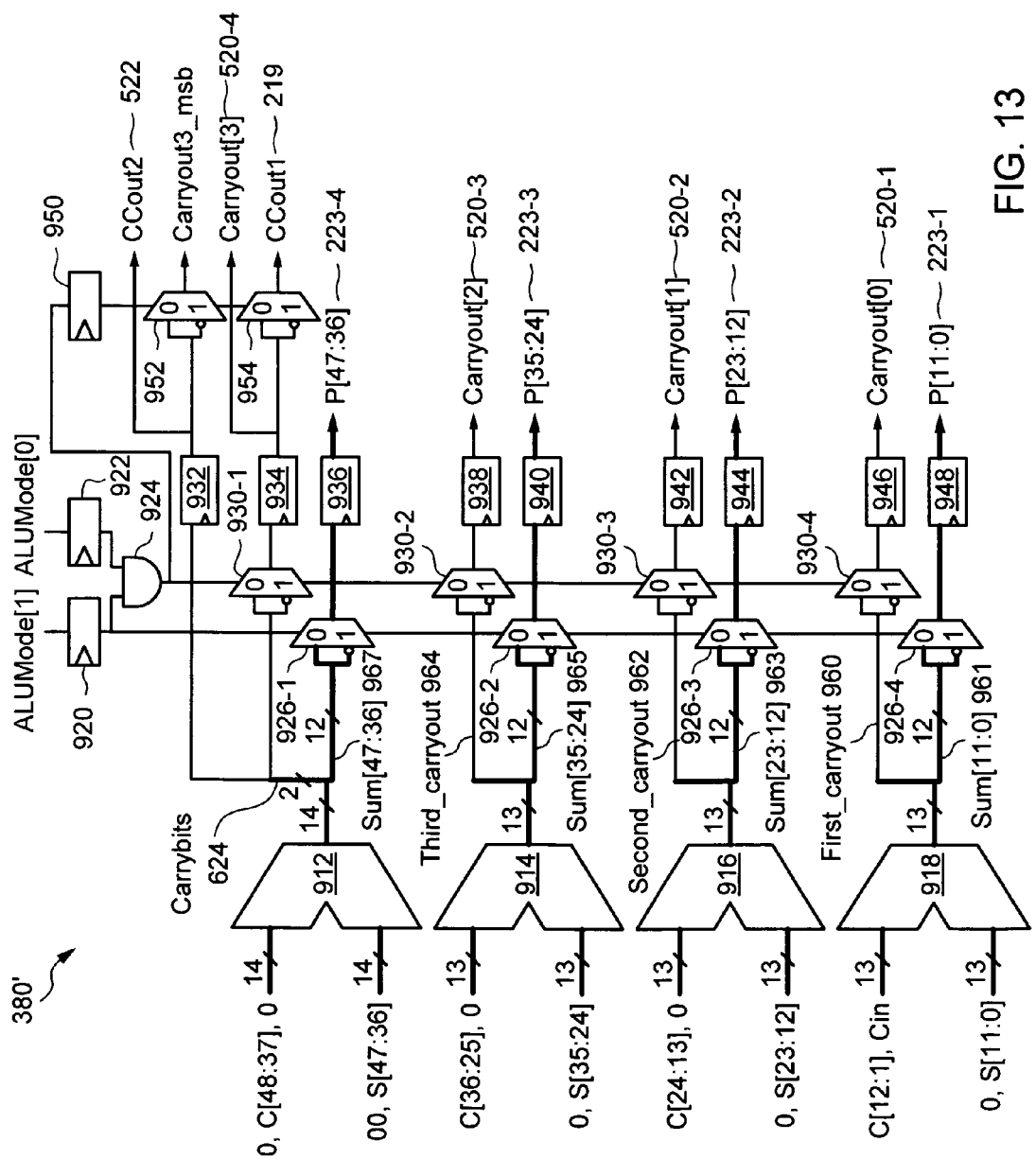
FIG. 13 is a schematic of the adder of FIG. 9 of another embodiment of the present invention.

FIG. 13 is an adder schematic 380' of adder 380 of FIG. 9 of another embodiment of the present invention. The adder embodiment 380' in FIG. 13 is different from the adder embodiment 380 shown in FIG. 11 in that the adders have been rearranged so that SIMD operations (FIGS. 15 and 16-1/2) can be performed in addition to addition as in FIG. 12. Adder 380' includes a 14 bit adder 912 adding together [00, S[47:36]]+[0,C[48:37], 0], a 13 bit adder 914 adding together [0,S[35:24]]+[C[36:25], 0], a 13 bit adder 916 adding together [0, S[23:12]]+[C[24:13], 0], and a 13 bit adder 918 adding together [0, S[11:0]]+[C[12:1],Cin].

Adder 912 is coupled to Mux 926-1, which can optionally invert the sum depending upon select control ALUMode[1] via register 920, to produce P[47:36] via register 936. Adder 912 is also coupled to Mux 930-1, which can optionally invert a first bit of Carrybits 624 depending upon select control determined by AND gate 924 to produce Carryout[3] 520-4 via register 934. AND gate 924 ANDs together ALUMode[1] via register 920 with ALUMode[0] via register 922. Carryout [3] 520-4 goes to Mux 954, which can optionally invert the Carryout[3] bit depending upon select control from the output of AND gate 924 via register 950, to produce CCout1 221. A second bit of the Carrybits 624 is sent to register 932. The output of register 932 is CCout2 552 or can be optionally inverted via Mux 952 controlled by register 950, to produce Carryout3_msb. Carryout3_msb is sent to the programmable interconnect of, for example, the PLD.

Adder 914 is coupled to Mux 926-2, which can optionally invert the sum depending upon select control ALUMode[1] via register 920, to produce P[35:24] 223-3 via register 940. Adder 914 is also coupled to Mux 930-2, which can optionally invert a carry bit depending upon the output of AND gate 924, to produce Carryout[2] 520-3 via register 938. Adder 916 is coupled to Mux 926-3, which can optionally invert the sum depending upon select control ALUMode[1] via register 920, to produce P[23:12] 223-2 via register 944. Adder 916 is also coupled to Mux 930-3, which can optionally invert a carry bit depending upon the output of AND gate 924, to produce Carryout[1] 520-2 via register 942. Adder 918 is coupled to Mux 926-4, which can optionally invert the sum depending upon select control ALUMode[1] via register 920, to produce P[11:0] via register 948. Adder 918 is also coupled to Mux 930-4, which can optionally invert First_carryout 960 bit depending upon the output of AND gate 924, to produce Carryout[0] 520-1 via register 946.

The CCout1 and Carryout[3] are the same for addition, when ALUMode[1:0]=00. Also, CCout2 and Carryout3_msb are the same for addition, when ALUMode[1:0]=00. When there is subtraction, i.e., ALUMode[1:0]=11, then CCout1= NOT(Carryout[3]) and CCout2=NOT(Carryout3_msb). Thus in the case of subtraction due to using Eqn 1, the cascade carryouts (CCout1 and CCout2) to the next DSPE are different than the typical carry outs of a subtraction (e.g., Carryout [3])]).

Figures 1, 14:
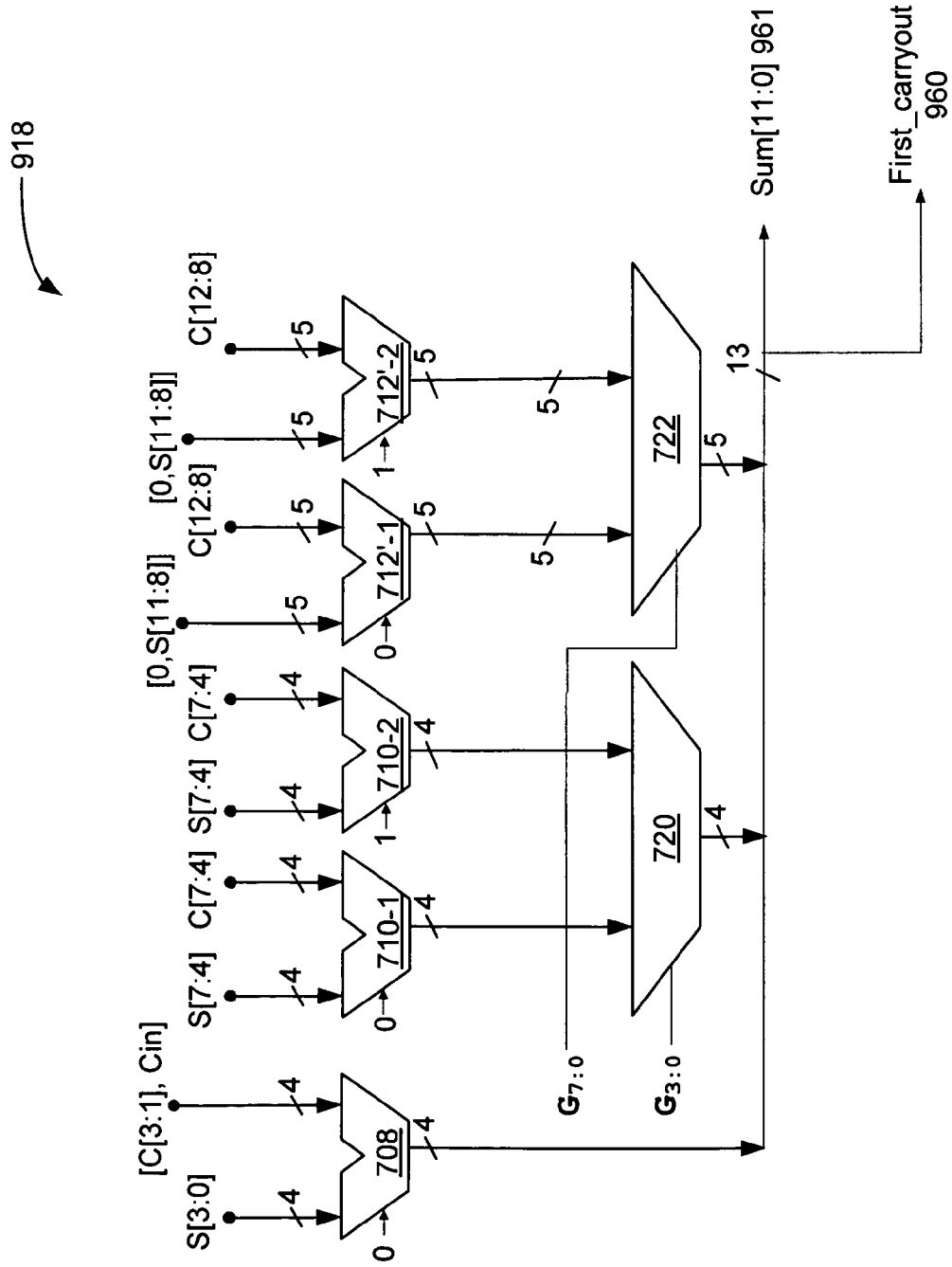
Figures 2, 14:
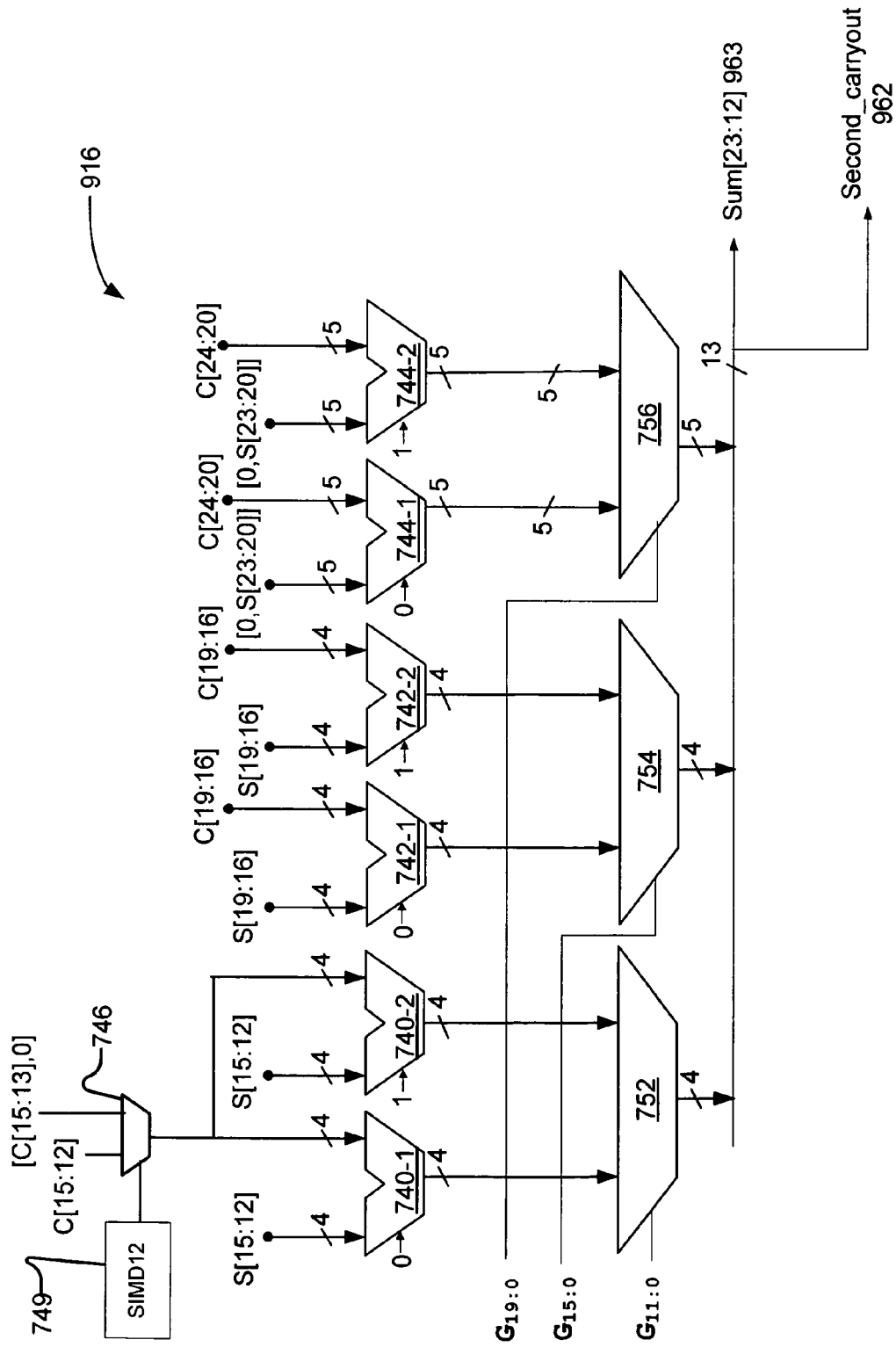
Figures 3, 14:
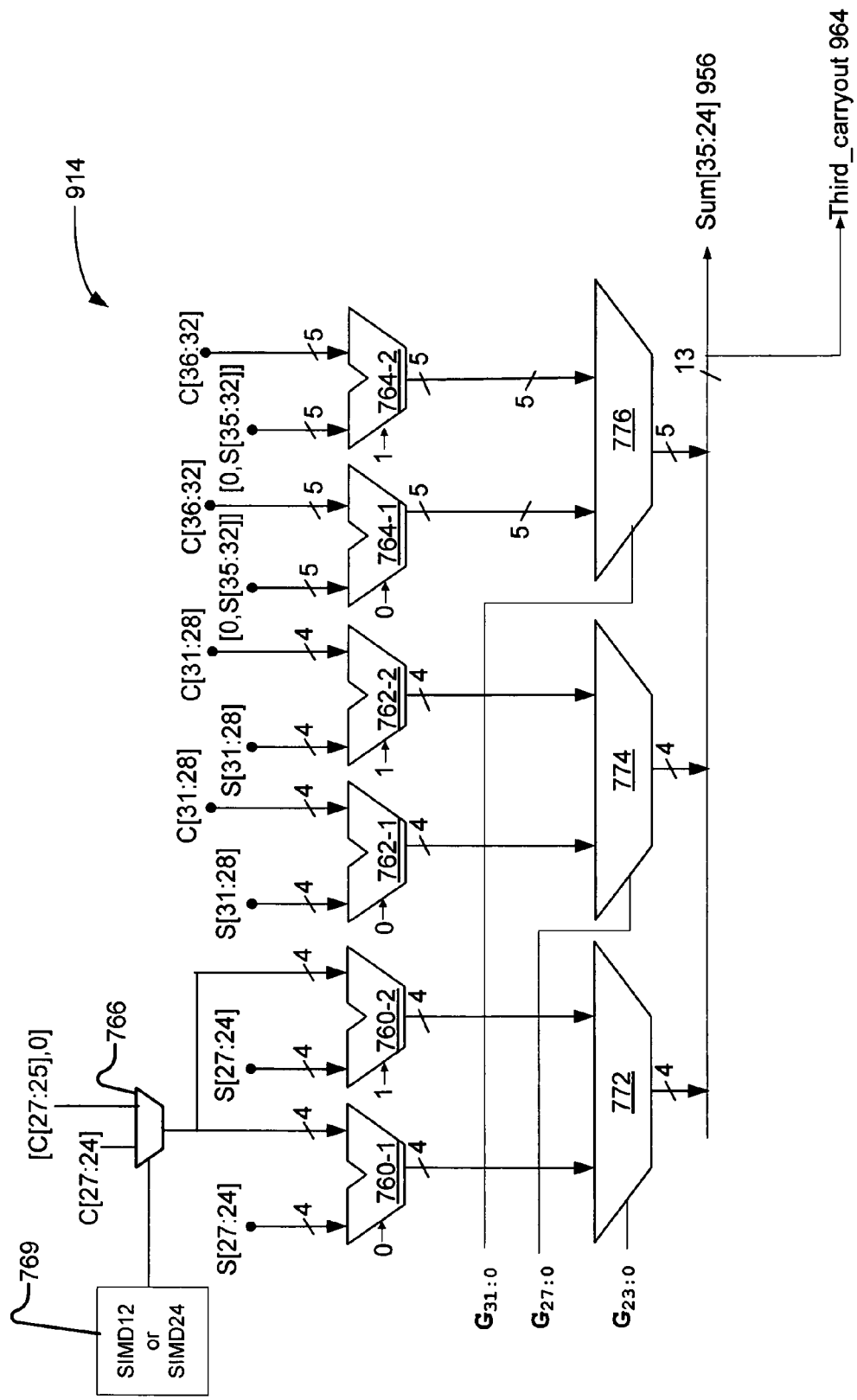
Figures 4, 14:
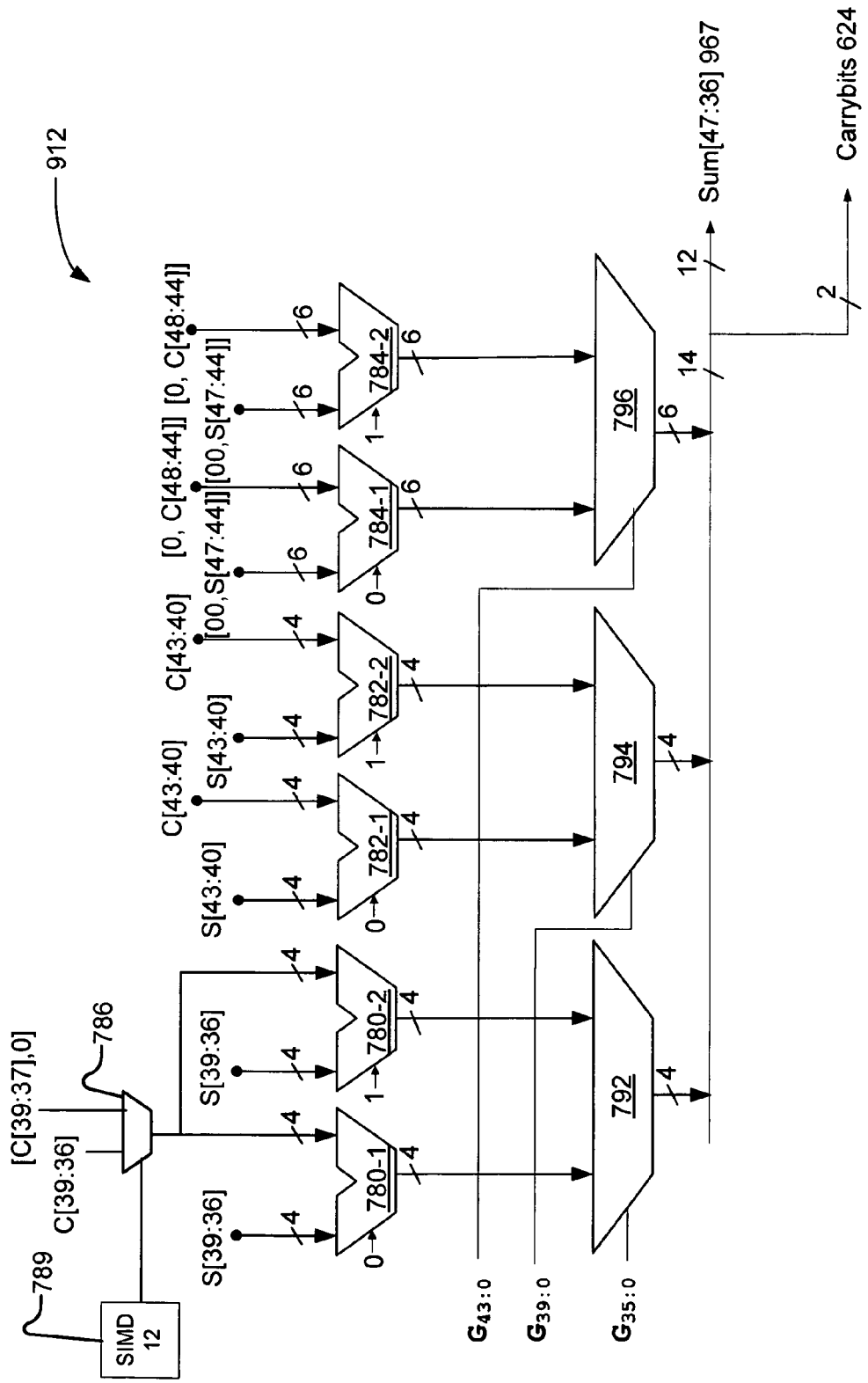

FIGS. 14-1 through 14-4 (discussed below) show four 12-bit SIMD schematics having the four ALUs 912, 914, 916, and 918 of FIG. 13 configured as adders. While FIG. 12 is a schematic for the addition of [00, S[47:0]]+[0, C[48:1], Cin] to get Sum[47:0] plus CCout1 and CCout2, FIGS. 14-1 through 14-4 show how FIG. 12 is changed for both the unmodified FIG. 12 addition (i.e., [00, S[47:0]]+[0, C[48:1], Cin]) and 12/24-bit SIMD addition (FIGS. 15 and 16-1).

Figure 15:
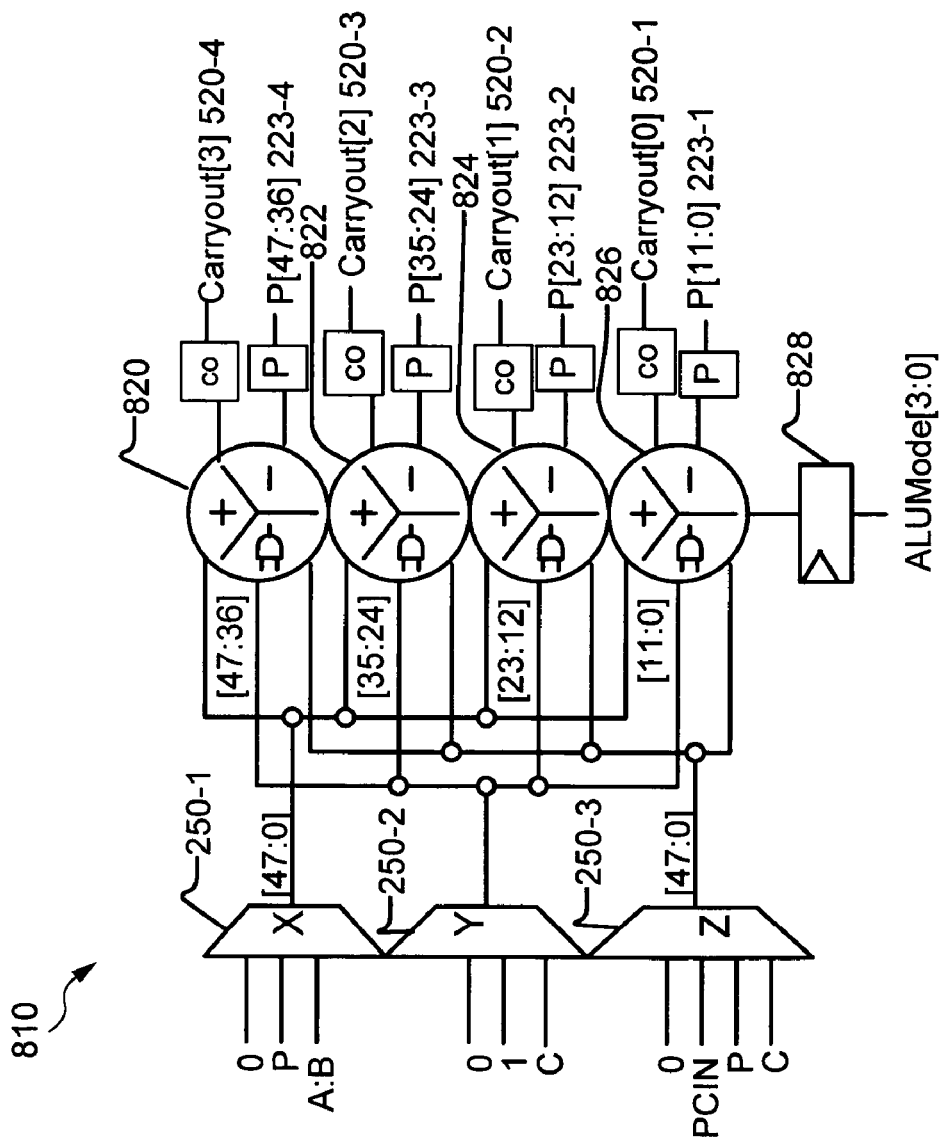
FIG. 15 is a simplified diagram of a SIMD structure for an ALU of one embodiment of the present invention.
Figures 1, 16:
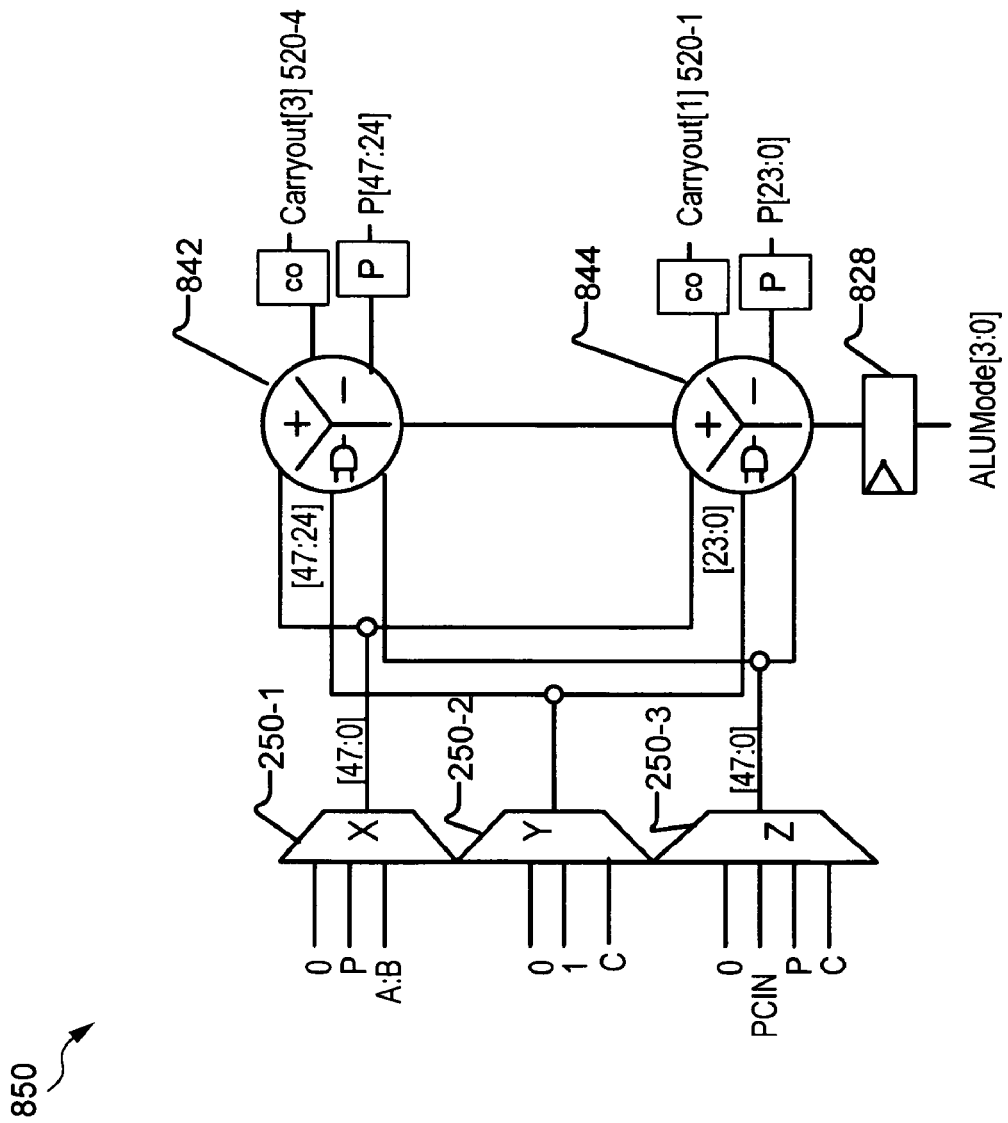
Figures 2, 16:
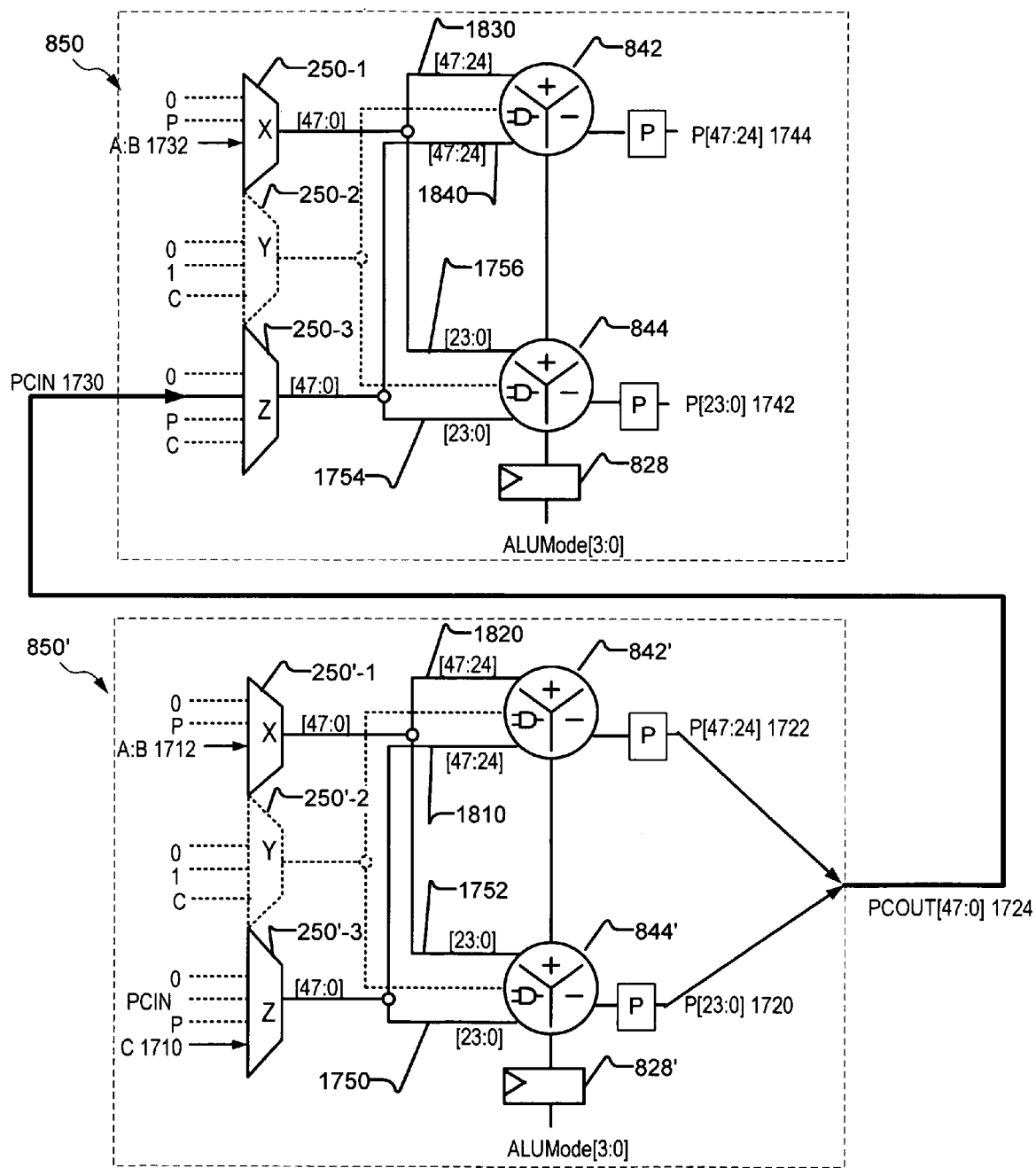

FIG. 15 is a simplified diagram of a SIMD structure 810 for ALU 292 of one embodiment of the present invention. The ALU 292 is divided into four ALUs 820, 822, 824, and 826, all of which take a common opmode from ALUMode[3:0] in register 828, hence there are four concurrent addition operations executed using a single instruction (single-instruction-multiple-data or SIMD). Thus a quad 12-bit SIMD Add/Subtract can be performed. ALU 820 adds together X[47: 36]+Z[47:36] and produces summation P[47:36] 223-4 with carry out bit Carryout[3] 520-4. ALU 822 adds together X[35: 24]+Z[35:24] and produces summation P[35:24] 223-3 with carry out bit Carryout[2] 520-3. ALU 824 adds together X[23: 12]+Z[23:12] and produces summation P[23:12] 223-2 with carry out bit Carryout[1] 520-1. ALU 826 adds together X[11: 0]+Z[11:0] and produces summation P[11:0] 223-1 with carry out bit Carryout[0] 520-1. Other binary add configurations, e.g., X+Y and Y+Z can likewise be performed. The label numbers for the P and Carryouts refer to the labels in FIG. 13. As can be seen ALU 820 includes adder 912, ALU 822 includes adder 914, ALU 824 includes adder 916, and ALU 826 includes adder 918.

In another embodiment, four ternary SIMD Add/Subtracts can be performed, e.g., X[11:0]+Y[11:0]+Z[11:0] for ALU 826 to X[47:36]+Y[47:36]+Z[47:36] for ALU 820 but the Carryouts (Carryout[2:0]) are not valid for Adders 914, 916, and 918, when all 12 bits are used. However, the Carryouts (Carryout[3] and Carryout3_msb) for Adders 912 is valid. If the numbers added/subtracted are 11 or less bits, but sign-extended to 12-bits, then the carry out (e.g., Carryout[3:0]) for each of the four ternary SIMD Add/Subtracts is valid.

The four ALUs 820-828 in FIG. 15 in one embodiment can be smaller bit width versions of ALU 292 in FIG. 3. In another embodiment with reference to FIGS. 9-13, ALU 292 is divided into four slices conceptually represented by FIG. 15. Each of the four slices operates concurrently using the same instruction having the opcode, for example, ALUMode[3:0]. Each slice represents a portion of FIG. 9. Generally, slice 826 inputs X[11:0], Y[11:0], Z[11:0], and Cin, performs an arithmetic (e.g., addition or subtraction) operation(s) or logic (e.g., AND, OR, NOT, etc.) operation(s) on the inputs depending upon the ALUMode[3:0] and outputs P[11:0] and a Carryout[0] 520-1. Similarly, slice 824 inputs X[23:12], Y[23:12], and Z[23:12], performs an arithmetic (e.g., addition or subtraction) operation(s) or logic (e.g., AND, OR, NOT, etc.) operation(s) on the inputs depending upon the ALUMode[3:0] and outputs P[23:12] and a Carryout[1] 520-2. An so forth for slices 822 and 820.

As a detailed illustration, the slice 826 associated with inputs X[11:0], Y[11:0], and Z[11:0], and outputs P[11:0] and Carryout[0] in FIG. 15, are discussed with reference to FIGS. 9, 11, 13, 14-1/2/3/4, and 15. As shown by FIGS. 9, 11, and 15, the inputs into bitwise add 370 are X[11:0]+Y[11:0]+Z [11:0]. From FIG. 11, the outputs of the first slice of the bitwise add 370 are sum and carry arrays S[11:0] and C[12:1], respectively. As shown by FIGS. 9 and 11, S[11:0] is input to Mux 372 controlled by ALUMode[3] and C[12:1] is input to Mux 374 controlled by ALUmode[2]. For addition and subtraction ALUMode[3:2]="00" so S[11:0] and C[12:1] are output by Muxes 390 to adder/subtracter 380. Adder/subtracter 380 includes a carrylookahead adder 620 (FIG. 11), which in turn includes the four adders 912, 914, 916, 918 of FIG. 13. FIG. 14-1 shows a blow up of adder 918, which receives S[11:0], C[12:1] and a carry-in Cin 258 and produces a summation Sum[11:0]=S[11:0]+C[12:1]+Cin and a carry-out First_carryout 960. The Sum[11:0] is a 12 bit slice of Sum[47:0] 622 of FIG. 11, which is the sent via Mux 614 of FIG. 1 (e.g., Mux 614 includes mux 926-4 of FIG. 13) to give P[11:0] 223-1. As shown by FIG. 13 First_carryout 960 is sent via mux 930-4 to give Carryout[0] 520-1.

As another detailed illustration, the slice 824 associated with inputs X[23:12], Y[23:12], and Z[23:12], and outputs P[23:12] and Carryout[1] in FIG. 15, are discussed with reference to FIGS. 9, 11, 12-1, 13, 14-1/2/3/4, and 15. As shown by FIGS. 9, 11, and 15, the inputs into bitwise add 370 are X[23:12]+Y[23:12]+Z[23:12]. From FIG. 11, the outputs of the second slice of the bitwise add 370 are sum and carry arrays S[23:12] and C[24:13], respectively. As shown by FIGS. 9 and 11, S[23:12] is input to Mux 372 controlled by ALUMode[3] and C[24:13] is input to Mux 374 controlled by ALUmode[2]. For addition and subtraction ALUMode[3:2]= "00" so S[23:12] and C[24:13] are output by Muxes 390 to adder/subtracter 380. Adder 916, receives S[23:12] and C[24:13] and produces a summation Sum[23:12] 963 (Sum[23:12]=S[23:12]+C[24:13]) and a Second_carryout 962 (see FIGS. 13 and 14-2). The Sum[23:12] is a 12 bit slice of Sum[47:0] 622 of FIG. 11, which is sent via Mux 614 of FIG. 11 (e.g., Mux 614 includes mux 926-3 of FIG. 13) to give P[23:12] 223-2. As shown by FIG. 13 Second_carryout 962 is sent via mux 930-3 to give Carryout[1] 520-2.

FIG. 14-1 is a SIMD schematic having a first adder 918 of FIG. 13. FIG. 14-1 is a modified part of FIG. 12 with the adders 712'-1 and 712'-2 being increased in width from 712-1/2 of FIG. 12 to include a zero bit and C[12]. The 12 bit sum Sum[11:0] 961 in FIG. 14-1 is the same as the first 12 bits of S[47:0 622] in FIG. 12. The 13th bit is the carry out, if any, of [0, S[11:0]]+[C[12:1], Cin] and is set equal to First_carryout 960. FIG. 14-1, in one embodiment, is the same for 12-bit SIMD such as in FIG. 15, 24-bit SIMD such as in FIG. 16-1, or no SIMD such as in FIG. 12.

More specifically, adder 712'-1 is configured to add [0,S[11:8]]+C[12:8]+0 and adder 712'-2 is configured to add [0,S[11:8]]+C[12:8]+1. Mux 722 is controlled by $G_{7:0}$ and selects from the output of adders 712'-1 and 712'2 to produce Sum[11:8] and First-carryout 960. Adder 710-1 is configured to add S[7:4]+C[7:4]+0 and adder 712'-2 is configured to add S[7:4]+C[7:4]+1. Mux 720 is controlled by $G_{3:0}$ and selects from the output of adders 710-1 and 710-2 to produce Sum[7:4]. Adder 708 is configured to add S[3:0]+[C[3:1], Cin]+0 and produces Sum[3:0]. These G carry look ahead parameters are described in US patent application Ser. No. 11/019,783, which is incorporated by reference.

FIG. 14-2 is a SIMD schematic having a second adder 916 of FIG. 13. In FIG. 14-2 there are three pairs of carry propagate adders, 740-1/2, 742-1/2 and 744-1/2, where the first adder of the pair has Cin=0 (e.g., 740-1, 742-1, and 744-1) and the second adder of the pair has Cin=1 (e.g., 740-2, 742-2, and 744-2). Adders 744-1/2 adds together [0,S[23:20]] and C[24:20] to produce Sum[23:20] and Second_carry_out 962. Adders 742-1/2 adds together S[19:12] and C[19:16] to produce Sum[19:16]. Adders 740-1/2 adds together input S[15:12] and the output of multiplexer 746 to give Sum[15:12]. Mux 746 selects from inputs C[15:12] and [C[15:13],0] depending on the SIMD12 bit stored in a configuration memory cell or a register 749. When there is 12 bit SIMD operation of 916 as shown in FIG. 15 (see ALU 824), then SIMD12=1 (selecting [C[15:13],0]), otherwise (e.g., no SIMD or 24 bit SIMD), SIMD12=0, hence selecting C[15:12]. The selection of which adder output of the pair to pick is done by multiplexers 752, 754, and 756, which are controlled by the G carry look ahead parameters, $G_{11:0}$, $G_{15:0}$, and $G_{19:0}$, respectively. These G carry look ahead parameters are derived from S[23:0], C[24:1], and Cin as described in U.S. patent application Ser. No. 11/019,783.

Adder 916 (FIG. 14-2) is operated independently of adder 918 (FIG. 14-1) for SIMD operations. As the G carry look ahead parameters are recursively related, setting $G_{11:0}=0$ (and C[12]=0) will insure that adder 916 is decoupled from adder 918. In one embodiment, setting S[11:8] and C[12:8] to zeros causes $G_{11:0}=0$ and G15:0 and G19:0 to decouple from adder 918 (so setting S[11:8] and C[11:8] to zeros causes G11:0=0, but in order to decouple G15:0 and G19:0 from previous carry generation, C[12] must be set to zero as well. Note, while C[12] is set to zero in the G carry look ahead generation of adder 916, the actual C[12] value, which may not be zero, is still used in adder 918 (FIG. 14-1)). In another embodiment setting the S[11], C[12] and C[11] to zeros is sufficient to cause $G_{11:0}=0$ and G15:0 and G19:0 to decouple from adder 918. When $G_{11:0}=0$, multiplexer 752 chooses the output of multiplexer 740-1.

Figure 24:
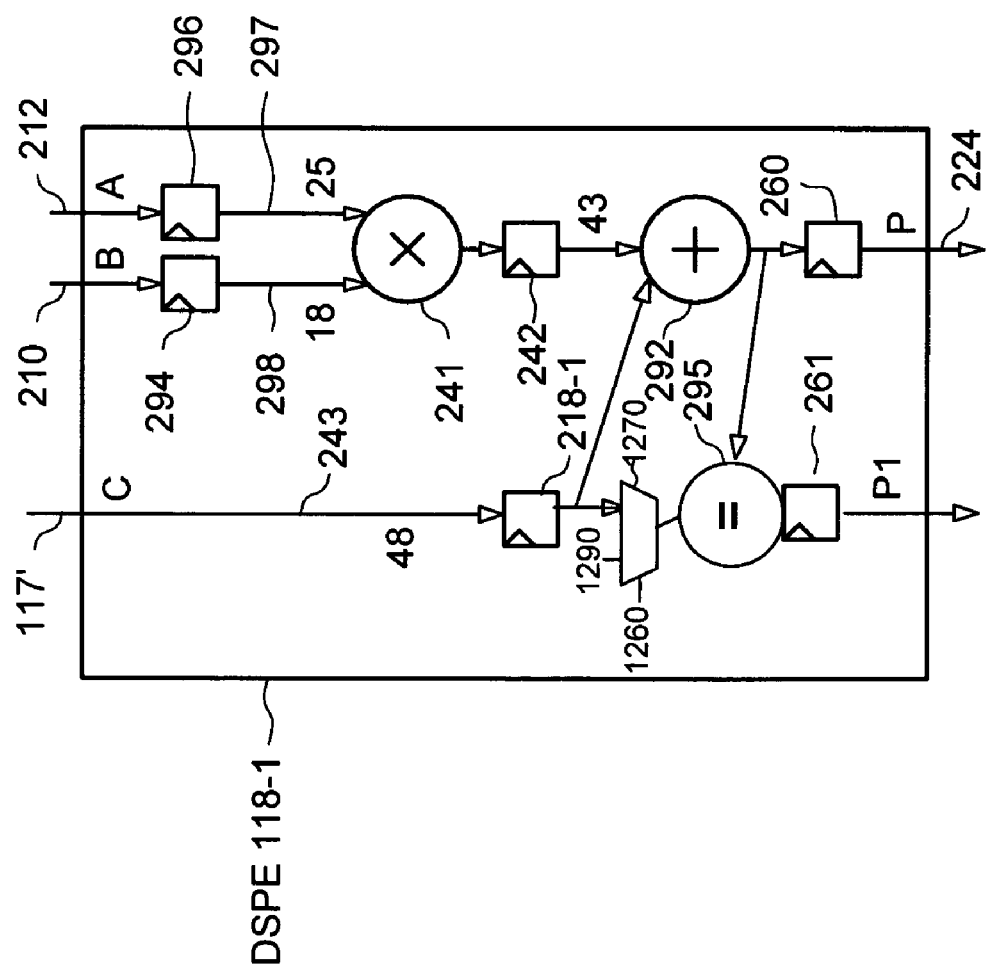
FIG. 24 shows an example of a configuration of a DSPE used for convergent rounding of an embodiment of the present invention.

FIG. 14-3 is a SIMD schematic having a third adder 914 of FIG. 13. In FIG. 14-3 there are three pairs of carry propagate adders, 760-1/2, 762-1/2 and 764-1/2, where the first adder of the pair has Cin=0 (e.g., 760-1, 762-1, and 764-1) and the second adder of the pair has Cin=1 (e.g., 760-2, 762-2, and 764-2).]. Adders 764-1/2 adds together [0,S[35:32]] and C[35:32] to produce Sum[35:32] and Third_carry_out 964. Adders 762-1/2 adds together S[31:28] and C[31:28] and produces Sum[31:28]. Adders 760-1/2 adds together input S[27:24] and the output of multiplexer 766 to give Sum[27:24]. Mux 766 selects from inputs C[27:24] and [C[27:25],0] depending on the [SIMD12 or SIMD24] bit stored in a configuration memory cell or a register 769. When there is 12 bit SIMD operation of 916 as shown in FIG. 15 or 24 bit SIMD operation as shown in FIG. 16-1, then the [SIMD12 or SIMD24] bit=1 (selecting [C[27:25],0]), otherwise (e.g., no SIMD), the [SIMD12 or SIMD24] bit=0, hence selecting C[27:24]. The selection of which adder output of the pair to pick is done by multiplexers 772, 774, and 776, which are controlled by the G carry look ahead parameters, $G_{23:0}$, $G_{27:0}$, and $G_{31:0}$, respectively.

Adder 914 (FIG. 14-3) is operated independently of adder 916 (FIG. 14-2) for SIMD operations. As the G carry look ahead parameters are recursively related, setting $G_{23:0}=0$ (and C[24]=0) will insure that adder 914 is decoupled from adder 916. When $G_{23:0}=0$ multiplexer 772 chooses the output of multiplexer 760-1.

FIG. 14-4 is a SIMD schematic having fourth adder 912 of FIG. 13. In FIG. 14-4 there are three pairs of carry propagate adders, 780-1/2, 782-1/2 and 784-1/2, where the first adder of the pair has Cin=0 (e.g., 780-1, 782-1, and 784-1) and the second adder of the pair has Cin=1 (e.g., 780-2, 782-2, and 784-2). Adders 784-1/2 add together [0,C[48:44]]+[00,S[47:44]] which gives a Sum[47:44] plus two carryout bits carrybits 624. Adders 782-1/2 add together C[43:40]+S[43:40] which gives a Sum[43:40]. Adders 780-1/2 adds together input S[39:36] and the output of multiplexer 786 to give Sum[39:36]. Mux 786 selects from inputs C[39:36] and [C[39:37],0] depending on the SIMD12 bit in a configuration memory cell or a register 789. When there is 12 bit SIMD operation of 916 as shown in FIG. 15, then SIMD12=1 (selecting [C[39:37],0]), otherwise (e.g., 24-bit SIMD or no SIMD) SIMD12=0, hence selecting C[39:36]. The selection of which adder output of the pair to pick is done by multiplexers 792, 794, and 796, which are controlled by the G carry look ahead parameters, $G_{35:0}$, $G_{39:0}$, and $G_{43:0}$, respectively.

Adder 912 (FIG. 14-4) is operated independently of adder 914 (FIG. 14-3) for SIMD operations. As the G carry look ahead parameters are recursively related, setting $G_{35:0}=0$ (and C[36]=0) will insure that adder 912 is decoupled from adder 914. When $G_{35:0}=0$ multiplexer 792 chooses the output of multiplexer 780-1.

Thus in one embodiment an integrated circuit (IC) includes many single instruction multiple data (SIMD) circuits, and the collection of SIMD circuits forms a MIMD (multiple-instruction-multiple-data) array. The SIMD circuit includes first multiplexers, for example, 250-1, 250-2, and 250-3 (see FIG. 9), receiving a first set (X), second set(Y), and third set (Z) of input data bits, where the first multiplexers are controlled by at least part of a first opcode, such as an opmode; a bitwise adder, e.g., 370, coupled to the first multiplexers for generating a sum set of bits, e.g., S[47:0] 388, and a carry set of bits, e.g., C[48:1] 389, from bitwise adding together the first, second, and third set of input data bits; a carry look ahead adder, e.g., 380, coupled to the bitwise adder, e.g., 370, for adding together the sum set of bits and the carry set of bits to produce a summation set of bits, e.g., Sum[47:0], and a carry-out set of bits (see FIG. 13, the carry-out set includes, but is not limited to, for example, carrybits 624, third_carryout 964, second_carry_out 962, and first_carryout 960); wherein the carry look ahead adder includes a carry look ahead circuit elements formed into K groups, where K is a positive integer (for example, K=4 in FIG. 15 and K=2 in FIG. 16-1) and where each of the K groups, produces a subset of the summation set of bits (for example, Sum[11:0] or Sum[47:36] in FIG. 13) and a subset of the carry-out set of bits(for example, First_carryout 960 or carrybits 624 in FIG. 13); and second multiplexers (e.g., 926 and 930) coupled to the K groups and controlled by at least part of a second opcode, for example, ALUMode.

The carry look ahead circuit element of the carry look ahead circuit elements in a first group of the K groups can include in one embodiment: 1) a first m-bit carry look ahead adder (for example, m=4, in FIG. 14-1 for 708, where m is a positive number) adding together a zero carry-in (Cin=0), a m-bit subset of the sum set of bits (e.g., S[3:0]), and a m-bit subset of the carry set of bits (e.g., C[3:1]∥Cin); 2) a second m-bit carry look ahead adder (for example, 710-1) adding together a zero carry-in (Cin=0), a m-bit subset of the sum set of bits (e.g., S[7:4]), and a m-bit subset of the carry set of bits (e.g., C[7:4]); 3) a third m-bit carry look ahead adder (e.g., 710-2) adding together a one carry-in (Cin=1), the m-bit subset of the sum set of bits (e.g., S[7:4]), and the m-bit subset of the carry set of bits (e.g., C[7:4]); 4) and a multiplexer (e.g., 720) coupled to the first and second m-bit carry look ahead adders; 5) a fourth m-bit carry look ahead adder (for example, 712'-1) adding together a zero carry-in (Cin=0), a (m+1)-bit subset of the sum set of bits (e.g., 0∥S[11:8]), and a (m+1)-bit subset of the carry set of bits (e.g., C[12:8]); 6) a third (m+1)-bit carry look ahead adder (e.g., 712'-2) adding together a one carry-in (Cin=1), the (m+1)-bit subset of the sum set of bits (e.g., 0∥S[11:8]), and the (m+1)-bit subset of the carry set of bits (e.g., C[12:8]); 7) and a multiplexer (e.g., 722) coupled to the first and second m-bit carry look ahead adders.

The carry look ahead circuit element of the carry look ahead circuit elements in the last group of the K groups can include at least in one embodiment a next to last m-bit carry look ahead adder (for example, m=4, in FIG. 12 for 714-1) adding together a zero carry-in (Cin=0), a first m-bit subset of the sum set of bits plus at least two zero bits (e.g., 00∥S[47:44]), and a second (m+1)-bit (e.g., m+1=5 bit) subset of the carry set of bits plus at least one zero bit (e.g., 0∥C[48:44]); a last m-bit carry look ahead adder (e.g., 714-2) adding together a one carry-in (Cin=1), the first m-bit subset of the sum set of bits plus at least two zero bits, and the second (m+1)-bit subset of the carry set of bits plus at least one zero bit; and a multiplexer (e.g., 724) coupled to the m-bit carry look ahead adders 714-1 and 714-2.

FIG. 16-1 is a simplified diagram of a SIMD circuit 850 for ALU 292 of another embodiment of the present invention. The ALU 292 is divided into two ALUs 842 and 844, all of which take a common opmode from ALUMode[3:0] in register 828, hence there are two concurrent addition/subtraction operations executed using a single instruction. Thus a dual 24-bit SIMD Add/Subtract can be performed. ALU 842 adds together X[47:24]+Z[47:24] and produces summation P[47:24] with carry out bit Carryout[3] 520-4. From FIG. 13 P[47:24] is the concatenation of P[35:24] 223-3 with P[47:36] 223-4. ALU 844 adds together X[23:0]+Z[23:0] and produces summation P[23:0] with carry out bit Carryout[1] 520-1. From FIG. 13 P[23:0] is the concatenation of P[11:0] 223-1 with P[23:12] 223-2. Other binary add configurations, e.g., X+Y and Y+Z can likewise be performed. As can be seen ALU 842 includes adders 912 and 914 and ALU 844 includes adders 916 and 918 in FIG. 13. Two ternary SIMD Add/Subtract, e.g., X[23:0]+Y[23:0]+Z[23:0] for ALU 844 and X[47:24]+Y[47:24]+Z[47:24] for ALU 842, can be performed. For use of all 24 bits the Carryout[1] for ALU 844 is not valid. However, the two carryouts for ALU 842 are valid. If the numbers used are 23 or less bits, but sign extended to 24-bits, then the carry out (e.g., Carryout[3] and Carryout[0]) for each of the two ternary SIMD Add/Subtracts is valid.

Thus FIGS. 15 and 16-1 illustrate another embodiment that includes an IC having a SIMD circuit. The SIMD circuit includes first and second multiplexers coupled to arithmetic unit elements (e.g., ALU elements 820-826 in FIG. 15 and 842-844 in FIG. 16-1 used in the arithmetic mode, i.e., addition or subtraction), where the function of the plurality of arithmetic unit elements is determined by an instruction, which includes, for example, ALUMode[3:0] in FIGS. 15 and 16-1; a first output of the first multiplexer (e.g., 250-1) comprising a first plurality of data slices (e.g., A:B[23:0] and A:B[47:24] in FIG. 16-1); a second output of the second multiplexer comprising a second plurality of data slices (e.g., Y[23:0] and Y[47:24] or Z[23:0] and Z[47:24] in FIG. 16-1); a first output slice (e.g., P[23:0]) of a first arithmetic unit element (e.g., 844), where the first output slice (e.g., P[23:0]) is produced from inputting a first slice (e.g., A:B[23:0]) from the first plurality of data slices and a first slice (e.g., Z[23:0]) from the second plurality of data slices into the first arithmetic unit element (e.g., ALU 844); and a second output slice (e.g., P[47:24]) of a second arithmetic unit element (e.g., 842), where the second output slice is produced from at least inputting a second slice (e.g., A:B[47:24]) from the first plurality of data slices and a second slice (e.g., Z[47:24]) from the second plurality of data slices into the second arithmetic unit element (e.g., ALU 842). In addition, the first arithmetic unit element (e.g., 844) outputs a first carry out bit (e.g., Carryout[1] 520-1) in response to adding together at least the first slice from the first plurality of data slices and the first slice from the second plurality of data slices. Also the second arithmetic unit element (e.g., 842) outputs a second carry out bit (e.g., Carryout[3] 520-4) in response to at least adding together the second slice from the first plurality of data slices and the second slice from the second plurality of data slices.

FIG. 16-2 is a block diagram of two cascaded SIMD circuits 850 and 850'. In one embodiment SIMD circuit 850' is in DSPE 118-2 and SIMD circuit 850 (see FIG. 16-1) is in DSPE 118-1 (see FIG. 3). PCOUT[47:0] 1724 is PCOUT 278 of FIG. 3. PCOUT[47:0] 1724 is connected to PCIN 1730, which is PCIN 226 of FIG. 3. The two cascaded SIMD circuits allow cascaded SIMD operation or MIMD operation; i.e., the second DSPE can be a subtract operation while the first DSPE is an add operation. For example, A:B[23:0] 1752 is added to C[23:0] 1750 via ALU 844' in SIMD 850', the output P[23:0] 1720 becomes PCIN[23:0] 1754, which is added to A:B[23:0] 1756 via ALU 844 in SIMD 850. The output P[23:0] 1742=A:B[23:0] 1752+C[23:0] 1750+A:B [23:0] 1756, which is a cascaded summation of the first 24 bits.

Similarly, A:B[47:24] is added to C[47:24] via ALU 842' in SIMD 850', the output P[47:24] 1722 becomes PCIN[47:24] 1840, which is added to A:B[47:24] via ALU 842 in SIMD 850 to give P[47:24] 1744, which is a cascaded summation of the second 24 bits (P[47:24] 1744=A:B[47:24] 1820+C[47:24] 1810+A:B[47:24] 1830). In FIG. 16-2 the dotted lines are for illustration purposes only in order to better show the cascaded SIMD addition. Also P[23:0] 1720 and P[23:47] 1722 are concatenated to form PCOUT[47:0] 1724 which is directly connected (no programmable interconnect in one embodiment) to PCIN 1730.

Thus the first SIMD circuit 850' is coupled to a second SIMD circuit 850 in an embodiment of the present invention. The first SIMD circuit 850' includes first and second multiplexers coupled to arithmetic unit elements (e.g., ALU 842' and 844' used in the arithmetic mode, i.e., addition or subtraction), where the function of the plurality of arithmetic unit elements is determined by an instruction, which includes, for example, ALUMode[3:0] in 16-1; a first output of the first multiplexer (e.g., 250'-1) comprising a first plurality of data slices (e.g., A:B[23:0] and A:B[47:24]); a second output of the second multiplexer comprising a second plurality of data slices (e.g., C[23:0] and C[47:24]); a first output slice (e.g., P[23:0] 1720) of a first arithmetic unit element (e.g., 844'), where the first output slice is produced from inputting a first slice (e.g., A:B[23:0] 1752) from the first plurality of data slices and a first slice (e.g., C[23:0] 1750) from the second plurality of data slices into the first arithmetic unit element (e.g. 844'); and a second output slice (e.g., P[47:24] 1722) of a second arithmetic unit element (e.g., 842'), where the second output slice is produced from at least inputting a second slice (e.g., A:B[47:24]) from the first plurality of data slices (e.g., A:B[47:0]) and a second slice (e.g., C[47:24]) from the second plurality of data slices (e.g., C[47:0]) into the second arithmetic unit element (e.g., 842').

The second SIMD circuit (e.g., 850) includes: third and fourth multiplexers (e.g., 250-1 and 250-3) coupled to a second plurality of arithmetic unit elements (e.g., ALU 842 and ALU 844 used in the arithmetic mode, i.e., addition or subtraction); an output of the third multiplexer (e.g., 250-1) comprising a third plurality of data slices (e.g., A:B[23:0] 1756 and A:B[47:24] 1830); an output of the fourth configurable multiplexer (e.g., 250-3) comprising a fourth plurality of data slices (e.g., PCIN[23:0] 1730, PCIN[23:47] 1840), where the fourth plurality of data slices comprises the first output slice (e.g., P[23:0] 1720) of the first arithmetic unit element (e.g., ALU 844') and the second output slice (e.g., P[47:24] 1722) of the second arithmetic unit element (e.g., ALU 842'); a third output slice (e.g., P[47:24] 1744) of a third arithmetic unit element (e.g., ALU 842) of the second plurality of arithmetic unit elements, the third output slice (e.g., P[47:24] 1744) produced from at least inputting a first slice (e.g., A:B[47:24] 1830) from the third plurality of data slices (e.g., A:B[47:0] 1732) and a first slice (e.g., PCIN[47:24] 1840, i.e., P[47:24] 1722) of the fourth plurality of data slices (e.g., PCIN[47:0] 1730) into the third arithmetic unit element (e.g., ALU 842); and a fourth output slice (e.g., P[23:0] 1742) of a fourth arithmetic logic unit element (e.g., 844) of the second plurality of arithmetic unit elements, the fourth output slice (e.g., P[23:0] 1742) produced from at least inputting a second slice (e.g., A:B[23:0] 1756) from the third plurality of data slices (e.g., A:B[47:0] 1732) and a second slice (e.g., PCIN[23:0] 1754, i.e., P[23:0] 1720) from the fourth plurality of data slices (e.g., PCIN[47:0] 1730) into the fourth arithmetic unit element (e.g., ALU 844). While FIG. 16-2 illustrates the cascading of two DSPEs 850' and 850, as FIGS. 1B and 3 show, there can be many more than two cascaded DSPE's in a column of DSP blocks. For example, PCIN of Z Mux 250-3 can receive a PCOUT[47:0] from a slice downstream of DSPE 850' (not shown) and PCOUT (i.e., P[47:24] 1744||P[23:0] 1742) of DSPE 850 can be sent to a slice upstream (not shown). Hence a whole column of DSPE may form a cascade of SIMD circuits.

As seen in FIG. 3 the multiplier 241 does a 25×18 multiply which produces 43 bits. This may cause an overflow in ALU 292 during multiply accumulate (MACC) operations. Thus a special opmode[6:0] "1001000" allows use of an adjacent DSPE to handle the overflow and extend the MACC operation to a P output of 96 bits.

FIG. 17 is a simplified block diagram of an extended MACC operation using two digital signal processing elements (DSPE). 118-1 and 118-2 of an embodiment of the present invention. Were the elements are the same or similar to FIG. 3, the same labels are used to simplify explanation. Opmode 0100101 in opmode register of DSPE 118-2 causes DSPE 118-2 to perform the accumulate operation P=P+A*B+Cin. When ALU 1026 acting as adder overflows there are two possible carryout bits 1028 (CCout1 and CCout2) that need to be sent to ALU 292. More specifically, the multiplier 1022 receives 18 bit multiplicand 1017 and 25 bit multiplier 1019 and stores the partial products in M registers 1024 of DSPE 118-2. The partial products are added in ALU 1026 functioning as an adder. The product of the 25×18 multiplication is stored in P register 1030. DSPE 118-2 has opmode [6:0] "0100101" with ALUMode "0000". DSPE 118-1 has opmode [6:0] "1001000" with ALUMode "0000" and CarryInSel "010".

FIG. 18 is a more detailed schematic of the extended MACC of FIG. 17 of an embodiment of the present invention. Where the elements are the same or similar to FIGS. 3 and 17, the same labels are used to simplify explanation. The CCout2 in register 1111 and CCout1 in register 1113 are similar to CCout2 522 and CCout1 219 in FIG. 13 as ALU 1026 is similar to ALU 292 (see also FIG. 11). CCout1 in DSPE 118-2 is sent via CCout 279 to CCin 227 of DSPE 118-1 (see FIG. 3). CarryIn Block 259 with CarryInSel=010 selects CCin 227 for Cin 258 (see FIG. 8). The Y-Mux 250-2 inputs Y=111 . . . 11 1146 and outputs all ones for Y[47:0]. X-Mux 250-1 selects 0 for X[0] and X[47:2]. For xmux-1 1142 (i.e., X[1]), the output from AND gate 1134 is selected. One input 1122 of AND gate 1134 is CCout2 from register 1111. The other input to AND gate 1134 comes from register 1132 which is set to "1" if Opmode[6:4]=100. Thus CCout1 is added to the least significant bit in adder 292 and CCout2 is added to the next least significant bit in adder 292. X-Mux 250-1 of DSPE 118-1 zero extends X-Mux 1110 of DSPE 118-2 and Y-Mux 250-2 of DSPE 118-1 one extends Y-Mux 1112 of DSPE 118-2. (Z-Mux 250-3 of DSPE 118-2 selects P feedback when Opmode[6:4]=100.).

The Table A below shows how CCout1 1111 and CCout2 1113 at time n+1 in FIG. 18 are determined from the sign of the accumulated sum P 1030 at times n and n+1 and the sign of the product of A 1019 times B 1017 at time n in one embodiment of the present invention, where n is an integer. From the first row of table A, when P 1030 is positive at time n and positive at time n+1, i.e., adding A*B to P does not change the sign of P, then CCout1=1 and CCout2=0. From the second row of table A, when P 1030 is negative at time n and negative at time n+1, i.e., adding A*B to P does not change the sign of P, then CCout1=1 and CCout2=0. The third to sixth rows of Table A covers when P 1030 wraps due to adding A*B to P.

TABLE A

| $P_n$ | $(A * B)_n$ | $P_{n+1} = P_n + (A * B)_n$ | $CCout1_{n+1}$ | $CCout2_{n+1}$ |
|---|---|---|---|---|
| pos | X | pos | 1 | 0 |
| neg | X | neg | 1 | 0 |
| pos | pos | neg (wrap) | 1 | 0 |
| pos | neg | neg (wrap) | 0 | 0 |
| neg | pos | pos (wrap) | 0 | 1 |
| neg | neg | pos (wrap) | 1 | 0 |

Thus an aspect of the invention includes an IC having a plurality of digital signal processing (DSP) circuits for performing an extended multiply accumulate (MACC) operation. The IC includes: 1) a first DSP circuit (e.g., 118-2) having: a multiplier (e.g., 1022) coupled to a first set of multiplexers (e.g., 1110, 1112, 1114); and a first adder (e.g., 1026) coupled to the first set of multiplexers, the first adder producing a first set of sum bits and a first and a second carry-out bit (e.g., CCout1 1112 and CCout2 1110), the first set of sum bits stored in a first output register (e.g., 1030), the first output register coupled to a multiplexer (e.g., 1114) of the first set of multiplexers; and 2) a second DSP circuit (e.g., 118-1) having: a second set of multiplexers ( e.g., 250-1, 250-2, 250-3) coupled to a second adder (e.g., 292'), the second adder coupled to a second output register (e.g., 260) and the first carry-out bit (CCout1 1112), the second output register (e.g., P 260) coupled to a first subset of multiplexers (Z 250-3) of the second set of multiplexers; a second subset of multiplexers (e.g., Y 250-2) of the second set of multiplexers receiving a first constant input (e.g., all 1's); and a third subset of multiplexers (e.g., X 250-1) of the second set of multiplexers, wherein a multiplexer (e.g., xmux_1 1142) of the third subset of multiplexers is coupled to an AND gate (e.g. 1134), the AND gate receiving a special opmode (e.g., Opmode[6:4]=100 1130) and the second carry-out bit (e.g., CCout2 1110), and the other multiplexers of the third subset receiving a second constant input (e.g., 0's).

While FIGS. 17 and 18 show two DSPEs, in another embodiment the MACC can be extended using more than 2 DSPEs. For example, a first DSPE 118-2 is in MACC mode (opmode [6:0] "0100101"), the second DSPE 118-1 in MACC extend mode (opmode [6:0]=1001000 and CarryIn-Sel=010), and third DSPE (not shown, but above DSPE 118-1) in MACC extend mode (opmode [6:0]=1001000 and CarryInSel=010). These three DSPEs give a 144-bit MACC. Using 4 DSPEs, a 192-bit MACC can be created. There can be input and/or output registers added as needed in the FPGA fabric, as known to one of ordinary skill in the arts, to insure that the data is properly aligned.

Figure 19:
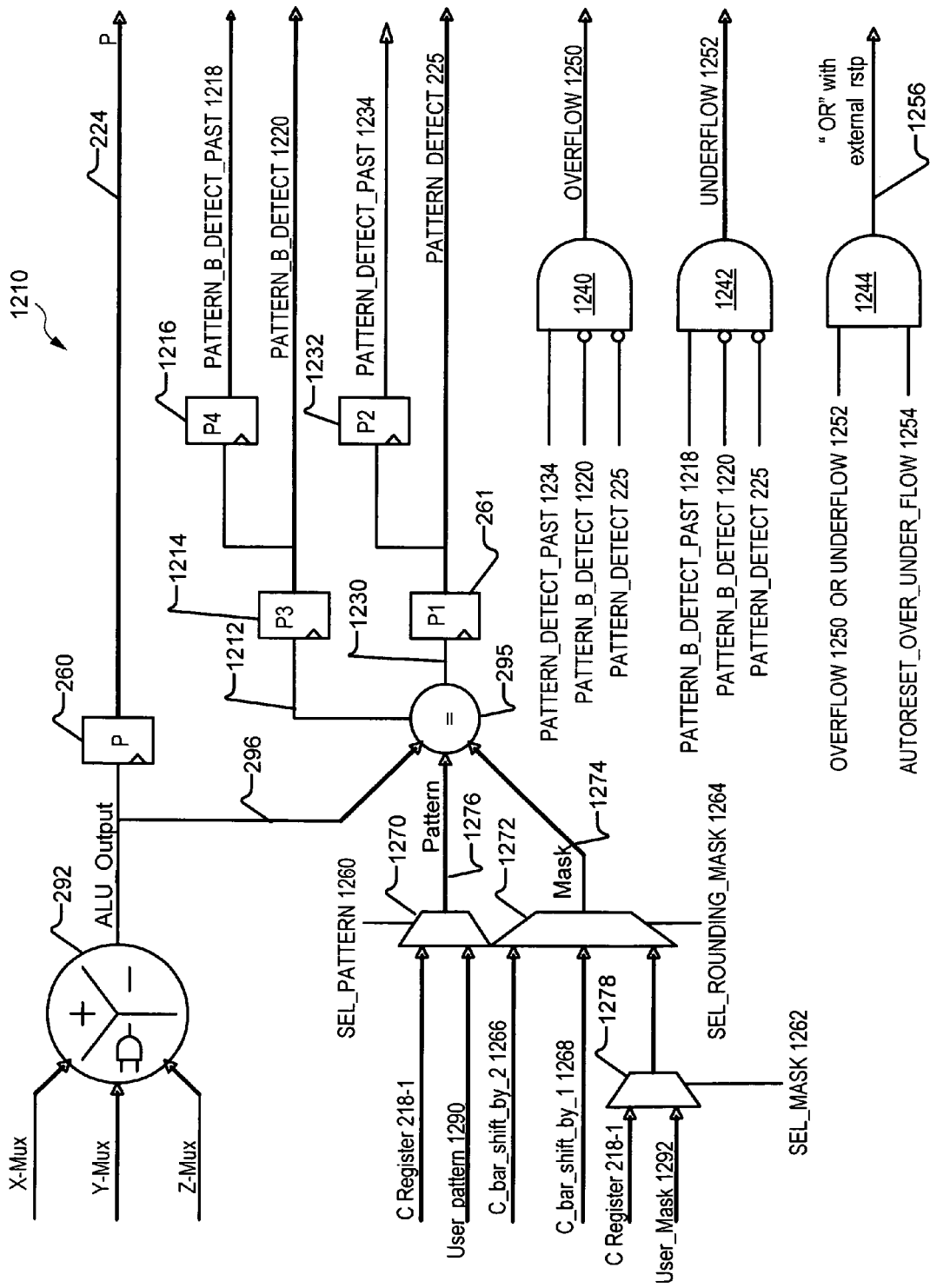
FIG. 19 is a schematic of a pattern detector of one embodiment of the present invention.

FIG. 19 is a schematic of a pattern detector 1210 of one embodiment of the present invention. With reference to FIGS. 3 and 19, in one aspect the pattern detector 1210 compares a 48 bit pattern 1276 with the output 296 of the ALU 292. The comparison is then masked using Mask 1274. The C register 218-1 can either be used as a dynamic pattern along with a predetermined static user_mask 1292 or as a dynamic mask along with a predetermined static user_pattern 1290. In one embodiment the user_mask 1292 and user_pattern 1290 are set using configuration memory cells of an FPGA. In another embodiment the user_mask 1292 and user_pattern 1290 are set in one or more registers, so that user_mask and user_pattern are both dynamic at the same time. The 48 bit output 296 of ALU 292 can be stored in P register 260 and is also sent to comparator 295 (see FIG. 3). Comparator 295 bitwise XNORs the 48 bit output 296 of ALU 292 with the 48 bit Pattern 1276. Hence if the there is a match in a bit ALU_output[i] with a bit Pattern[i] then the XNOR_result[i] for that bit is 1. The 48 bit pattern matching results are then bitwised OR'd with the 48 bit Mask 1274, i.e., ((Pattern[i] XNOR ALU_output[i]) OR Mask[i], for i=0 to 47). The 48 bits of the masked pattern matching results are then AND'd together via an "AND tree" to get the comparator result 1230 which is stored in P1 register 261 to produce the PATTERN_DETECT 225 value, which is normally "1" when, after masking, the pattern 1276 matches the ALU output 292 and "0" when the pattern does not match.

Thus letting "i" be a positive integer value from 1 to L, where in this example L=48, the formula for determining the pattern detect bit 225 is:

$$((\text{ALU\_Output}[1] \, XNOR \, \text{Pattern}[1]) \, \text{OR Mask}[1]) \quad \text{[Eqn 2]}$$
$$\text{AND}$$
$$((\text{ALU\_Output}[2] \, XNOR \, \text{Pattern}[2]) \, \text{OR Mask}[2])$$
$$\text{AND}$$
$$\ldots$$
$$((\text{ALU\_Output}[i] \, XNOR \, \text{Pattern}[i]) \, \text{OR Mask}[i])$$
$$\text{AND}$$
$$\ldots$$
$$((\text{ALU\_Output}[L] \, XNOR \, \text{Pattern}[L]) \, \text{OR Mask}[L])$$

The PATTERN_B_DETECT 1220 value, is normally "1" when, after masking, the inverse of pattern 1276 matches the ALU output 296. The formula for detecting the pattern_b detect bit 1220 is:

$$(\text{ALU\_Output}[1] \, XNOR \, \overline{\text{NOT}(\text{Pattern}[1])}) \quad \text{[Eqn 3]}$$
$$\text{OR Mask}[1])$$
$$\text{AND}$$
$$((\text{ALU\_Output}[2] \, XNOR \, \overline{\text{NOT}(\text{Pattern}[2])})$$
$$\text{OR Mask}[2])$$
$$\text{AND}$$
$$\ldots$$
$$((\text{ALU\_Output}[i] \, XNOR \, \overline{\text{NOT}(\text{Pattern}[i])}) \, \text{OR Mask}[i])$$
$$\text{AND}$$
$$\ldots$$
$$((\text{ALU\_Output}[L] \, XNOR \, \overline{\text{NOT}(\text{Pattern}[L])}) \, \text{OR Mask}[L])$$

In another embodiment the formula for detecting the pattern_b detect bit 1220 is:

$$((\text{ALU\_Output}[1] \, XOR \, \text{Pattern}[1]) \, \text{OR Mask}[1]) \quad \text{[Eqn 4]}$$
$$\text{AND}$$
$$((\text{ALU\_Output}[2] \, XOR \, \text{Pattern}[2]) \, \text{OR Mask}[2])$$
$$\text{AND}$$
$$\ldots$$

-continued ((ALU_Output[$i$] $XOR$ Pattern[$i$])OR Mask[$i$])

AND

...

((ALU_Output[$L$] $XOR$ Pattern[$L$])OR Mask[$L$])

The first masked comparison (1 means all bits match) 1230 is stored in the P1 register 261 and then output from DSPE 118-1 as Pattern_Detect 225. A P2 register 1232 stores a first masked comparison output bit of a past clock cycle and outputs from DSPE 118-1 a Pattern_Detect_Past 1234. Comparator 295 also compares the data output of the ALU 296 with an inverted selected pattern 1276 (Pattern_bar). The second equality output bit (1 means all bits match) 1212 is stored in the P3 register 1214 and then output from DSPE 118-1 as Pattern_B_Detect 1220. A P4 register 1216 stores a second equality output bit of a past clock cycle and outputs from DSPE 118-1 a Pattern_B_Detect_Past 1218. While the comparator 295 is a masked equality comparison of the ALU output 296 with the pattern 1276, in other embodiments the comparator 295 can have other comparison functions such as partially equal, a computation of the number of bits in the field that are equal and the like. The existing equality comparison in conjunction with the ALU subtracter can also be used to implement a>, >=, < or <= function.

The selected pattern 1276 sent to comparator 295 is selected by multiplexer 1270 by sel_pattern 1260 and is either a dynamic pattern in the C register 218-1 or a static pattern 1290 formed in a plurality of configuration memory cells in one embodiment of the present invention. The sel_pattern control 1260 is also set in configuration memory cells. In other embodiments either the pattern 1290 or the sel_pattern 1260 or both can be set using one or more registers or configuration memory cells or a combination thereof.

The selected mask 1274 sent to comparator 295 is selected by multiplexer 1272 by sel_rounding_mask 1264. Multiplexer 1272 receives input from multiplexer 1278 which selects via control sel_mask 1262 either a dynamic mask in the C register 218-1 or a static mask 1292 formed in a plurality of configuration memory cells in one embodiment of the present invention. The multiplexer's controls sel_mask 1262 and sel_rounding_mask 1264 are also set in configuration memory cells. In addition to the output of multiplexer 1278, multiplexer 1272 can select between C_bar_shift_by_2 1266 (the contents of the C register 218-1 are inverted and then shifted left by 2 bits) and C_bar_shift_by_1 1268 (the contents of the C register 218-1 are inverted and then shifted left by 1 bit). The contents of the C register 218-1 in one embodiment can be inverted and left shifted (0's are shifted in) in the programmable logic and restored in the C register. In another embodiment where the 17-bit shifter 246 in FIG. 3 is replaced by a configurable n-bit shifter (where n is a positive integer, and the shifter can be a left or right shifter), the ALU 292 and n-bit shifter 246 can be used to invert and shift the contents of the C register 218-1. In other embodiments either the mask. 1292 or the sel_mask 1262 or the sel_rounding_mask 1264 or a combination thereof can be set using one or more registers or configuration memory cells or a combination thereof.

Thus, one embodiment of the present invention includes an integrated circuit (IC) for pattern detection. The IC includes; programmable logic coupled together by programmable interconnect elements; an arithmetic logic unit (ALU), e.g., 292 (see FIG. 19), coupled to a comparison circuit, e.g. 295, where the ALU is programmed by an opcode and configured to produce an ALU output, e.g., 296. The ALU output may be coupled to the programmable logic; The IC further includes a selected mask (e.g., Mask 1274 of FIG. 19) of a plurality of masks selected by a first multiplexer (e.g., 272), where the first multiplexer is coupled to the comparison circuit; and a selected pattern (e.g., Pattern 1276) of a plurality of patterns selected by a second multiplexer (e.g., 1270), where the second multiplexer is coupled to the comparison circuit. The comparison circuit (e.g. 295) is configured to concurrently compare the ALU output (e.g., 296) to the selected pattern (e.g., 1276) and the inverse of the selected pattern. Both comparison results are then masked using a mask (e.g., mask 1274) and combined in a combining circuit such as an AND tree (not shown) in order to generate a first and a second comparison signal (e.g., 1230 and 1212).

FIG. 19 also shows that a method for detecting a pattern from an arithmetic logic unit (ALU) in an integrated circuit can be implemented. First, responsive to an instruction, such as an opcode or opmode, an output, e.g., 296 from an ALU, e.g., 292, can be generated. Next the output is compared to a pattern (e.g., pattern 1276) and then masked to produce an first output comparison bit (e.g., 1230). Also the output, e.g., 296, can be compared to an inverted pattern (e.g., pattern_bar) and then masked to produce a second output comparison bit (e.g., 1212). And the first and second output comparison bits can be stored in a memory (for example, registers 261, 1232, 1214, and 1216).

Pattern detector 1210 has AND gates 1240 and 1242 which are used to detect overflow or underflow of the P register 260. AND gate 1240 receives pattern_detect_past 1234, an inverted pattern_b_detect 1220, and an inverted pattern_detect 225 and produces overflow bit 1250. AND gate 1242 receives pattern_b_detect_past 1218, an inverted pattern_b_detect 1220, and an inverted pattern_detect 225 and produces underflow bit 1252.

For example when the Pattern detector 1210 is set to detect a pattern 1290 of "48'b00000 ... 0" with a mask 1292 of "48'b0011111 ... 1" (the default settings), the overflow bit 1250 will be set to 1 when there is an overflow beyond P="00111 ... 1". Because in equations 2-4 above the mask is bitwised OR'd with each of the comparisons, the pattern that is being detected for PATTERN_DETECT 225 in the ALU output 292 (the value stored in P register 260) is P="00"XXX ... XX, where X is "don't care". The inverted pattern is "11111 ... 1", and the inverted pattern that is being detected for PATTERN_B_DETECT 225 in the ALU output 292 (the value stored in P register 260) is P="11"XXX ... XX, where X is "don't care".

As an illustration let P="00111 ... 1" on a first clock cycle and then change to P="01000 ... 0", i.e., P[47]=0 and P[46]= 1, on a second clock cycle. On the first clock cycle as P="00111 ... 1" matches the pattern "00"XXX ... XX, Pattern_Detect 225 is 1. As P="00111 ... 1" does not match the pattern "11"XXX ... XX, Pattern_B_Detect 1220 is 0. Thus for the first clock cycle Overflow 1250 is 0. On the second clock cycle, a "1" is added to P 260 via ALU 292 to give P="01000 ... 0", which does not match the pattern "00"XXX ... XX, and Pattern_Detect 225 is 0. As P= "01000 ... 0" does not match the pattern "11"XXX ... XX, Pattern_B_Detect 1220 is 0. Thus for the second clock cycle, PATTERN_DETECT_PAST 1234 is "1", PATTERN_B_ DETECT 1220 is "0" and PATTERN_DETECT 225 is "0". From FIG. 19, Overflow 1250 is "1" for the second clock cycle. In this embodiment Overflow 1250 is only "1" for one clock cycle, as in a third clock cycle PATTERN_DETECT_ PAST 1234 is "0". In another embodiment circuitry can be added as known to one of ordinary skill in the arts to capture the overflow 1250 and saturate the DSP output. In one embodiment the DSP output can be saturated to the mask value for overflow and the mask_b value for underflow—using output registers with both set and reset capability, as well as logic to force the DSP output to the mask or mask_b when the overflow/underflow signal is high.

As another illustration let P="110000...0" on a first clock cycle and then change to P="100111...1", i.e., P[47]=1 and P[46]=0, on a second clock cycle. On the first clock cycle as P="110000...0" does not match the pattern "00"XXX... XX, and Pattern_Detect 225 is 0. As P="110000...0" does match the pattern "11"XXX...XX, Pattern_B_Detect 1220 is 1. Thus for the first clock cycle Underflow 1252 is 0. On the second clock cycle, a "1" is subtracted from P 260 via ALU 292 to give P="10111...1", which does not match the pattern "00"XXX...XX, and Pattern_Detect 225 is 0. As P= "10111...1" does not match the pattern "11"XXX...XX, Pattern_B_Detect 1220 is 0. Thus for the second clock cycle, PATTERN_B_DETECT_PAST 1218 is "1", PATTERN_B DETECT 1220 is "0" and PATTERN_DETECT 225 is "0". From FIG. 19, Underflow 1252 is "1" for the second clock cycle. In this embodiment Underflow 1252 is only "1" for one clock cycle, as in a third clock cycle PATTERN_B_DETECT_PAST 1218 is "0". In another embodiment circuitry can be added as known to one of ordinary skill in the arts to capture the underflow 1252 for future clock cycles until a reset is received.

By setting the mask 1292 to other values, e.g., "48'b0000111...", the bit value P(N) at which overflow is detected can be changed (in this illustration, N can be 0 to 46). Note that this logic supports saturation to a positive number of $2^M-1$ and a negative number of $2^M$ in two's complement, where M is the number of 1's in the mask field. The overflow flag 1250 and underflow flag 1252 will only remain high for one cycle and so the values need to be captured in fabric and used as needed.

FIG. 19 also shows an AND gate 1244 which can be used to generate an overflow/underflow auto reset. The output of overflow bit 1250 OR'd with underflow bit 1252 is AND'd with a autoreset_over_under_flow flag 1254 set in a configuration memory cell to produce a signal 1256 which is OR'd with an external power-on reset (rstp) signal to produce the auto reset signal for at least part of the PLD.

The overflow/underflow detection as shown by FIG. 19 can be used to adjust the operands of a multiply-accumulate operation to keep the result within a valid range. For example, if the valid range is 00111111 to 11000000, then the pattern_detect bit 225 and pattern_b_detect bit 1220 can detect an overflowed P 224 result 01000000. This result can then be shifted right J bits and used as a floating number with exponent J, where J is an integer.

Figure 20:
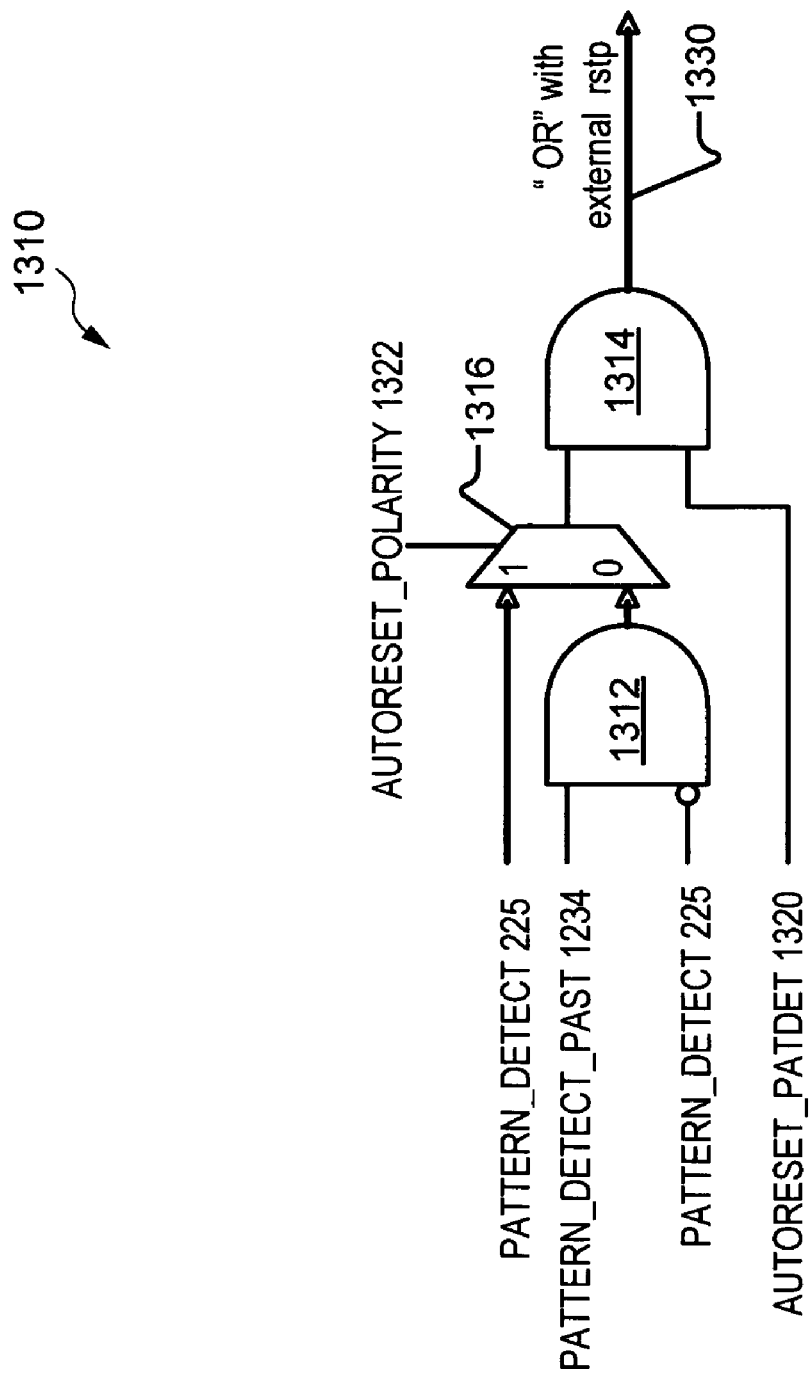
FIG. 20 is a schematic for a counter auto-reset of an embodiment of the present invention.

FIG. 20 is a schematic for a counter auto-reset of an embodiment of the present invention. The P register 260 and/or the P1 register 261 and/or including the P2-P4 registers in FIG. 19 can be reset from reset signal 1330. For example, a reset can occur after a total K-bit count value from ALU 292 is reached, where the ALU 292 is used as a 48-bit counter (e.g., opmode "0001110" and ALUmode "0000"). This can be useful in building large K-bit counters for Finite State Machines, cycling filter coefficients, etc., where K is a positive integer. With reference to FIGS. 19 and 20, AND gate 1312 receives an inverted pattern_detect bit 225 and pattern_detect_past bit 1234. Multiplexer 1316 selects between the output of AND gate 1312 and inverted pattern_detect bit 225 depending on the select value of autoreset_polarity 1322 which is set by a configuration memory cell. The output of multiplexer 1316 is AND'ed together in AND gate 1314 with an autoreset_patdet flag 1320 set by another configuration memory cell. The output of AND gate 1314 may be OR'd with an external reset to reset the P and P1-P4 registers.

If the autoreset_pattern_detect flag 1320 is set to 1, and the autoreset_polarity is set to 1 then the signal 1330 automatically resets the P register 260 one clock cycle after a Pattern has been detected (pattern_detect=1). For example, a repeating 9-state counter (counts 0 to 8) will reset after the pattern 00001000 is detected.

If the autoreset_polarity is set to 0 then the P register 260 will autoreset on the next clock cycle only if a pattern was detected, but is now no longer detected (AND gate 1312). For example, P register 260 will reset if 00000XXX is no longer detected in the 9-state counter. This mode of counter is useful if different numbers are added on every cycle and a reset is triggered every time a threshold is crossed.

Figure 21:
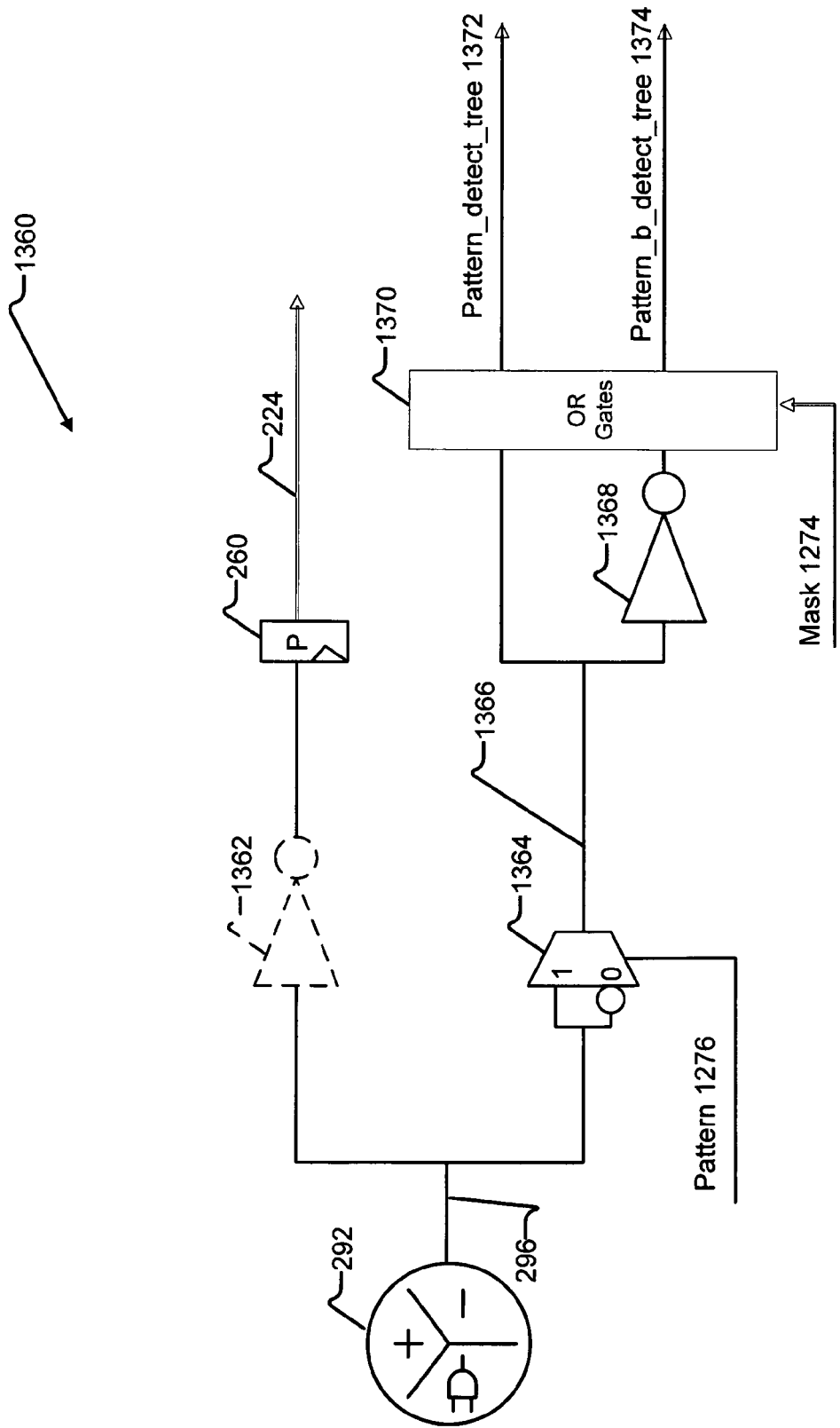
FIG. 21 is a schematic of part of the comparison circuit of FIG. 19 of one embodiment of the present invention.
Figure 22:
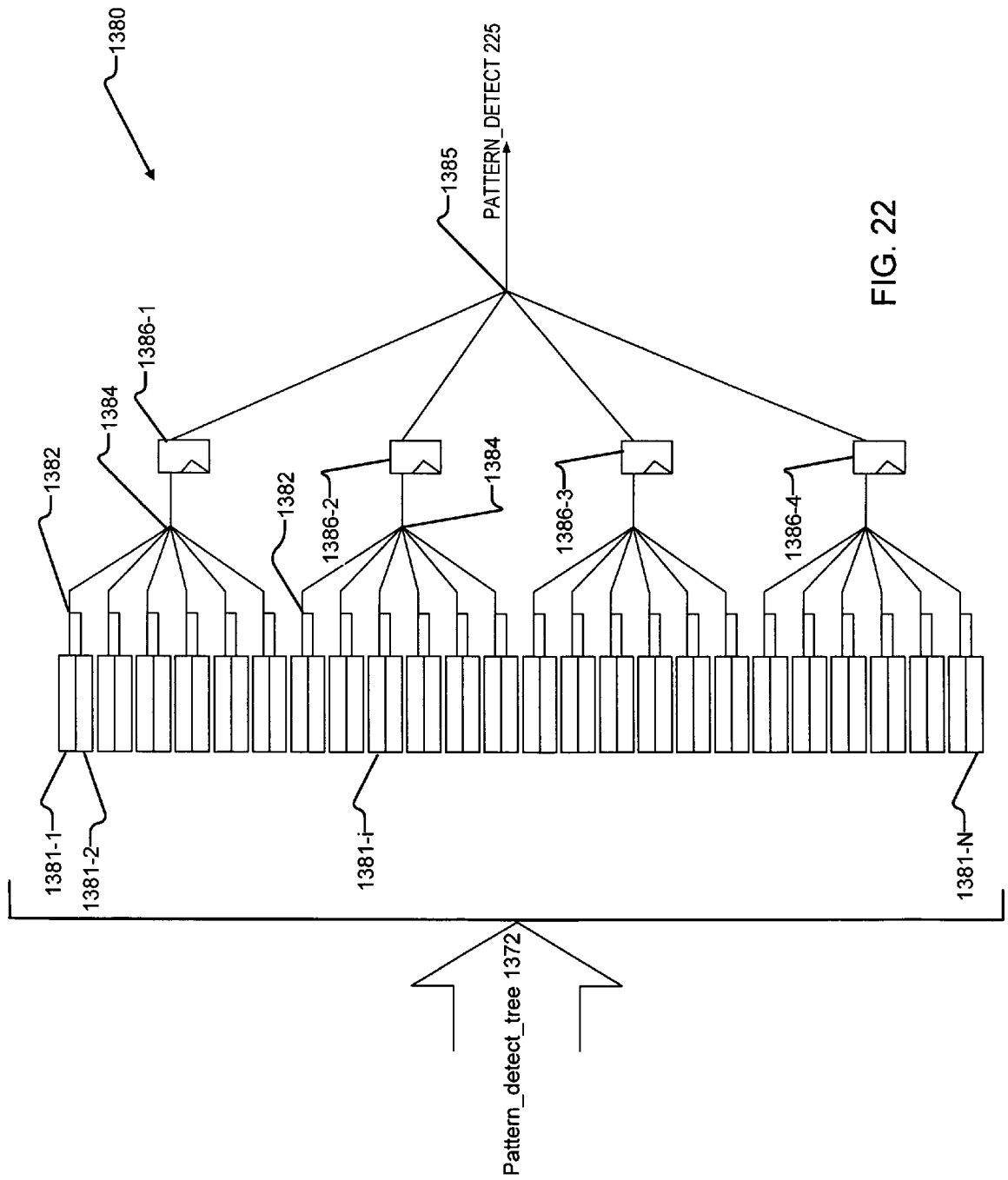
FIG. 22 is a schematic of an AND tree that produces the pattern_detect bit of an embodiment of the present invention.

FIGS. 21 and 22 show one implementation of part of comparison circuit 295 in FIG. 19 of one embodiment of the present invention. Generally, the 48 bit P output 296 of ALU 292 is equality compared (i.e., "==") with the 48 bit pattern 1276 via multiplexer 1364 to produce 48 bit output 1366. Output 1366 is masked using 48 bit mask 1274 which is input to 48 OR gates 1370 to produce a 48 bit output pattern_detect_tree 1372. When the mask bit is "1" the pattern bit is masked via the corresponding OR gate to produce a "1" for the corresponding pattern_detect_tree output bit. Concurrently, output 1366 is inverted via inverter 1368 and then masked using 48 bit mask 1274 which is input to the 48 OR gates 1370 to produce a 48 bit output pattern_b_detect_tree 1374. When the mask bit is "1" the pattern bit is masked via the corresponding OR gate to produce a "1" for the corresponding pattern_b_detect_tree output bit.

In more detail FIG. 21 is a schematic of part of the comparison circuit of FIG. 19 of one embodiment of the present invention. The output 296 of ALU 292 is coupled to multiplexer 1364 and to P register 260 via optional inverter 1362. Multiplexer 1364 selects between output 296 and an inverted output 296 as determined by pattern 1276. The output 1366 of multiplexer 1364 is coupled to OR gates 1370 and to inverter 1368, where inverter 1368 is coupled to OR gates 1370. A mask 1274 is coupled to a first part of OR gates 1370 associated with output 1366 to produce a masked output pattern_detect_tree 1372. The mask 1274 is also coupled to a second part of OR gates 1370 associated with the output of inverter 1368 to produce a masked output pattern_b_detect_tree 1374.

FIG. 22 is a schematic of an AND tree 1380 that produces the pattern_detect bit 225 of an embodiment of the present invention. The 48-bit pattern_detect_tree 1372 output of FIG. 22 is received by the N leaves of the AND tree 1380 (1381-1 to 1381-N), where N=48 in this example. Each pair of bits is AND'd together via logic equivalent ANDs 1382. Next each 6 pairs are AND'd together via logic equivalent ANDs 1384 and the outputs stored in four registers 1368-1 to 1386-4, for the example when N=48. With reference to FIG. 19 register P1 261 in this embodiment has been split into four registers 1368-1 to 1386-4 in FIG. 22. The outputs of the four registers 1368-1 to 1386-4 are logic equivalent AND'd 1385 to produce pattern_detect 225. An AND tree structure similar to AND tree 1380 receives the 48 bit pattern_b_detect_tree output 1374 from FIG. 21 and produces the output bit pattern_b_detect 1220 of FIG.19.

Figure 23:
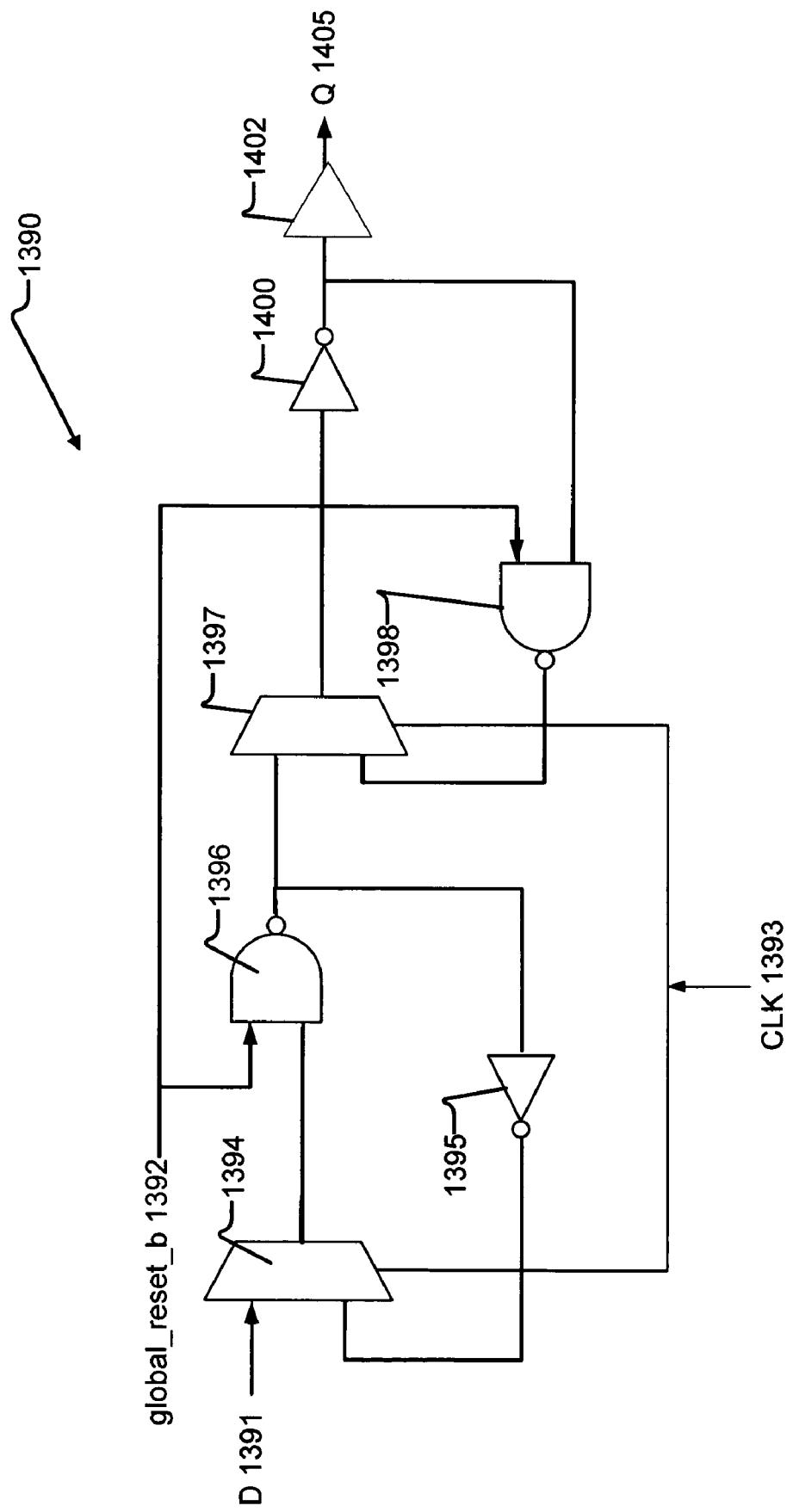
FIG. 23 is a schematic for a D flip-flop of one aspect of the present invention.

FIG. 23 is a schematic for a D flip-flop 1390 of one aspect of the present invention. Any of the P registers such as P register 260, P1 261, P2 1232, P3 1214, P4 1216, and/or registers 1386-1 to 1386-4 can include D flip-flop 1390. The D input 1391 is coupled to a multiplexer 1394 which also receives the output of NAND gate 1396 via inverter 1395. The output of multiplexer 1394 is input along with a global_reset_b signal 1392 to NAND gate 1396. The output of NAND gate 1396 is coupled to inverter 1395 and to multiplexer 1397. Multiplexer 1397 also receives input from NAND gate 1398. The output of multiplexer 1397 is coupled to inverter 1400 which is turn coupled to buffer 1402. Buffer 1402 produces the Q output 1405. The output of inverter 1400 and global_reset_b signal 1392 are input to NAND gate 1398. Multiplexers 1394 and 1397 are controlled by CLK 1393. In another embodiment (not shown) pass gates after the Q output 1405 and a bypass circuit having bidirectional pass gates and connected from the D input 1391 to the output of the pass gates after the Q output 1405 allows bypass of the D flip-flop 1390. A further description is given in co-pending, commonly assigned U.S. patent application Ser. No. 11/059,967, filed Feb. 17, 2005, and entitled "Efficient Implementation of a Bypassable Flip-Flop with a Clock Enable" by Vasisht M. Vadi, which is herein incorporated by reference.

Thus disclosed above in one embodiment of the present invention is a programmable Logic Device (PLD) having pattern detection. The PLD includes: (a) an arithmetic logic unit (ALU) configured to produce an ALU output;
(b) a selected mask of a plurality of masks selected by a first multiplexer, where the first multiplexer is coupled to the comparison circuit and controlled by one or more configuration memory cells;
(c) a selected pattern of a plurality of patterns selected by a second multiplexer, where the second multiplexer is coupled to the comparison circuit and controlled by one or more configuration memory cells;
(d) a comparison circuit which includes: (i) an equality circuit for comparing the ALU output with the selected pattern and producing a comparison output; (ii) one or more inverters coupled to the equality circuit for producing an inverted comparison output; (iii) a masking circuit coupled to the comparison output and the inverted comparison output for generating a first and second plurality of comparison bits; and (iv) one or more trees of AND functions for combining the first and second plurality of comparison bits into a first comparison signal and a second comparison signal;
(e) a first set of registers coupled in series for storing the first comparison signal and a previous first comparison signal associated with a prior clock cycle; and
(f) a second set of registers coupled in series for storing the second comparison signal and a previous second comparison signal associated with the prior clock cycle.

In another embodiment the PLD circuit can further include a first AND gate inputting the previous first comparison signal, an inverted second comparison signal, and an inverted first comparison signal and outputting an overflow signal. In addition the PLD can include a second AND gate inputting the previous second comparison signal, the inverted second comparison signal, and the inverted first comparison signal and outputting an underflow signal.

In yet another embodiment the PLD circuit can further include: a first AND gate receiving the previous first comparison signal and an inverted first comparison signal; a third multiplexer selecting an output from the first AND gate or the first comparison signal, using one or more configuration memory cells; and a second AND gate coupled to the third multiplexer and a predetermined autoreset pattern detect signal and outputting an auto-reset signal.

Different styles of rounding can be done efficiently in the DSP block (e.g., DSPE 118-1 in FIG. 3). The C register 218-1 in the DSPE 118-1 can be used to mark the location of the binary point. For example, if C=000 ... 00111, this indicates that there are four digits after the binary point. In other words, the number of continuous ones in the C input 217' plus '1' indicates the number of decimal places in the original number. The Cin input 258 into ALU 292 can be used to determine which rounding technique is implemented. If Cin is 1, then C+Cin=0.5 in decimal or 0.1000 in binary. If Cin is 0, then C+Cin=0.4999 ... in decimal or 0.0111 in binary. Thus, the Cin bit 258 determines whether the number is rounded up or rounded down if it falls at the mid point. The Cin bit 258 and the contents of C register 218-1 can change dynamically. After the round is performed by adding C and Cin to the result, the bits to the left of the binary point should be discarded. For convergent rounding, the pattern detector can be used to determine whether a midpoint number is rounded up or down. Truncation is performed after adding C and Cin to the data.

There are different factors to consider while implementing a rounding function: 1) dynamic or static binary point rounding; 2) symmetric or random or convergent rounding; and 3) least significant bit (LSB) correction or carrybit (e.g., Cin) correction (if convergent rounding was chosen in 2) above.

In static binary point arithmetic, the binary point is fixed in every computation. In dynamic binary point arithmetic, the binary point moves in different computations. Most of the rounding techniques described below are for dynamically moving binary points. However, these techniques can easily be used for static binary point cases.

Symmetric Rounding can be explained with reference to FIG. 8. In symmetric rounding towards infinity, the Cin bit 258 is set to the inverted sign bit of the result, e.g., inverted P[47] 420 with CarrySel 410 be set to "101" in FIG. 8. This ensures that the midpoint negative and positive numbers are both rounded away from zero. For example, 2.5 rounds to 3 and −2.5 rounds to −3. Table 5 below shows examples of round to infinity with the decimal places=4. The Multiplier output is the output optionally stored in M registers 242 of multiplier 241 (see FIG. 3). C is the C port 217' optionally stored in C register 218-1. P 224 is the output of the ALU 292 optionally stored in P register 260, after the ALU has performed the operation [(Multiplier 241 Output)+(C 217')+(Sign Bit Complement 420)].

TABLE 5

| Multiplier Output (M 242) | C 217' | Cin 258 = Sign Bit Complement | P 224 = Multiplier Output + C + Sign Bit Complement |
|---|---|---|---|
| 0010.1000 (2.5) | 0000.0111 | 1 | 0011.1111 (3 after Truncation) |
| 1101.1000 (−2.5) | 0000.0111 | 0 | 1101.1111 (−3 after Truncation) |
| 0011.1000 (3.5) | 0000.0111 | 1 | 0100.0000 (4 after Truncation) |

In symmetric rounding towards zero, the Cin bit is set to the sign bit of the result e.g., inverted P[47] 420 with CarrySel 410 set to "111" in FIG. 8. Positive and negative numbers at the midpoint are rounded towards zero. For example, 2.5 rounds to 2 and −2.5 rounds to −2. Although the round towards infinity is the conventional simulation tool round, the round towards zero has the advantage of never causing overflow, yet has the disadvantage of rounding weak signals 0.5 and −0.5 to 0. Table 6 shows examples of round to zero with the binary places=4.

TABLE 6

| Multiplier Output | C | Cin = Sign bit | P 224 = Multiplier Output + C + Sign Bit |
|---|---|---|---|
| 0010.1000(2.5) | 0000.0111 | 0 | 0010.1111 (2 after Truncation) |
| 1101.1000(−2.5) | 0000.0111 | 1 | 1110.0000 (−2 after Truncation) |
| 0011.1000(3.5) | 0000.0111 | 0 | 0011.1111 (3 after Truncation) |

The rounding toward infinity of the output of ALU 292 for multiply-accumulate and add-accumulate operations can be done by setting CarryinSel 410 to "110" in FIG. 8. Since in these cases it is difficult to determine the sign of the output ahead of time, the round might cost an extra clock cycle. This extra cycle can be eliminated by adding the C input on the very first cycle using the dynamic opmode. The sign bit of the last but one cycle of the accumulator can be used for the final rounding operation done in the final accumulate cycle. This implementation is a practical way to save a clock cycle.

In random rounding, the result is rounded up or down. In order to randomize the error due to rounding, one can dynamically alternate between symmetric rounding towards infinity and symmetric rounding towards zero by toggling the Cin bit pseudo-randomly. The Cin bit in this case is a random number. The ALU adds either a number slightly smaller than 0.50 (e.g., 0.4999 . . . ) or 0.50 to the result before truncation. For example, 2.5 can round to 2 or to 3, randomly. Repeatability depends on how the pseudo-random number is generated. If an LFSR is used and the seed is always the same, then results can be repeatable. Otherwise, the results might not be exactly repeatable.

In convergent rounding, the final result is rounded to the nearest even number (or odd number). In conventional implementations, if the midpoint is detected, then the units-placed bit before the round needs to be examined in order to determine whether the number is going to be rounded up or down. The original number before the round can change between even/odd from cycle to cycle, so the Cin value cannot be determined ahead of time.

In convergent rounding towards even, the final result is rounded toward the closest even number, for example: 2.5 rounds to 2 and −2.5 rounds to −2, but 1.5 rounds to 2 and −1.5 rounds to −2. In convergent rounding towards odd, the final result is rounded toward the closest odd number, for example: 2.5 rounds to 3 and −2.5 rounds to −3, but 1.5 rounds to 1 and −1.5 rounds to −1. The convergent rounding techniques require additional logic such as configurable logic in the FPGA fabric in addition to the DSPE.

FIG. 24 shows an example of a configuration of a BSPE 118-1 used for convergent rounding of an embodiment of the present invention. The two types of convergent rounding: convergent rounding towards even (2.5→2, 1.5→2) and towards odd (2.5→3, 1.5→1) can be done using FIG. 24. With reference to FIG. 3, an 18-bit B input 210 is multiplied with a 25-bit A input 212 via multiplier 241 to give two partial products stored in M registers 242. The two partial products are equivalent to a 43 bit product when added together in ALU 292 (opmode "01101101", ALUMode "0000"). The two partial products are added to the 48-bit C register 218-1 by ALU 292 functioning as an adder. The 48 bit summation of ALU 292 is stored in P register 260 and input to comparator 295. Either the C input stored in register 218-1 or a predetermined user pattern 1290 is input to comparator circuit 295 via multiplexer 1270. The output comparison bit of comparator circuit 295 is stored in P1 register 261.

Thus one embodiment with reference to FIG. 24 includes a circuit for convergent rounding including; a multiplier 241 multiplying two numbers 294 and 296 together to produce a product 242; an adder 292 adding the product, a carry-in bit, and a data input 218-1 to produce a summation 260; a multiplexer 1260 for selecting an input pattern; another multiplexer (not shown) for selecting a mask (not shown); a comparator 295 for comparing the summation with the input pattern, masking the comparison using the mask, and combining the masked comparison to produce a comparison bit 261; and a rounding circuitry (not shown) for convergent rounding, where the summation 224 is rounded at least in part on the comparison bit 261. The rounding circuitry can include programmable logic, an adder circuit in the PLD, the same DSPE, or another DSPE.

There are two ways of implementing a convergent rounding scheme: 1) a LSB Correction Technique, where a logic gate is needed in fabric to compute the final LSB after rounding; and 2) a Carry Correction Technique where an extra bit is produced by the pattern detector that needs to be added to the truncated output of the DSPE in order to determine the final rounded number. If a series of computations are being performed, then this carry bit can be added in a subsequent fabric add or using another DSPE add.

First, the convergent rounding, LSB correction technique, of an embodiment of the present invention is disclosed. For dynamic convergent rounding, the Pattern Detector can be used to detect the midpoint case with C=0000.0111 for both Round-to-Odd and Round-to-even cases. Round to odd should use Cin="0" and check for PATTERN_B_DETECT "XXXX.1111" (where the "X" means that these bits have been masked and hence are don't care bits) in the ALU output 296 of FIG. 19 and then replace the P register 260 LSB bit with 1, if the pattern is matched. Round to even should use Cin="1," and check for PATTERN_DETECT "XXXX.0000," and replace the P register 260 LSB bit with 0, if the pattern is matched. Dynamically changing from round-to-even and round-to-odd does not require changing the pattern-detector pattern, only modifying the Cin input from one to zero and choosing PATTERN_DETECT output for round-to-even, and choosing PATTERN_B_DETECT output for round-to-odd.

For dynamic convergent rounding, the SEL_PATTERN 1260 (see FIG. 19) should be set to select user_pattern 1290 with the user_pattern 1290 set to all zeros for both round-to-even and round-to-odd cases. The SEL_ROUNDING_MASK 1264 should be set to select the mask to left shift by 1, C one's complement 1268. This makes the mask 1274 change dynamically with the C input binary point. So when the C input is 0000.0111, the mask is 1111.0000. If the Cin bit is set to a '1', dynamic convergent round to even can be performed by forcing the LSB of the final P value 224 to '0' whenever the PATTERN_DETECT 225 output is 1. If the Cin bit is set to a '0', dynamic convergent round to odd can be performed by forcing the LSB of the final P value 224 to '1' whenever the PATTERN_B_DETECT 1220 output is 1.

Note that while the PATTERN_DETECT searches for XXXX.0000, the PATTERN_B_DETECT searches for a match with XXXX.1111. The Pattern Detector is used here to detect the midpoint. In the case of round-to-even, xxxx.0000 is the midpoint given that C=0000.0111 and Cin=1. In the case of round-to-odd, xxxx.1111 is the midpoint given that C=0000.0111 and Cin=0. Examples of Dynamic Round to Even and Round to Odd are shown in Table 7 and Table 8, respectively.

TABLE 7

Round to Even (Pattern_Detect = xxxx.0000, Binary Places = 4)

| Multiplier Output (or the X-Mux plus Y/Z-Mux output) | C 217' | Cin 258 | Multiplier Output + C + Cin (or the X-Mux plus Y/Z-Mux output + C + Cin) | Pattern_Detect 225 | P 224 LSB replaced by 0 |
|---|---|---|---|---|---|
| 0010.1000 (2.5) | 0000.0111 | 1 | 0011.0000 | 1 | 0010.0000 (2 after Truncation) |
| 1101.1000 (−2.5) | 0000.0111 | 1 | 1110.0000 | 1 | 1110.0000 (−2 after Truncation) |
| 0011.1000 (3.5) | 0000.0111 | 1 | 0100.0000 | 1 | 0100.0000 (4 after Truncation) |
| 1110.1000 (−1.5) | 0000.0111 | 1 | 1111.0000 | 1 | 1110.0000 (−2 after Truncation) |

TABLE 8

Round to Odd (Pattern_B_Detect = xxxx.1111, Binary Place = 4)

| Multiplier Output (or the X-Mux plus Y/Z-Mux output) | C | Cin | Multiplier Output + C + Cin (or the X-Mux plus Y/Z-Mux output + C + Cin) | Pattern_B_Detect | P 224 LSB replaced by 1 |
|---|---|---|---|---|---|
| 0010.1000 (2.5) | 0000.0111 | 0 | 0010.1111 | 1 | 0011.1111 (3 after Truncation) |
| 1101.1000 (−2.5) | 0000.0111 | 0 | 1101.1111 | 1 | 1101.1111 (−3 after Truncation) |
| 0011.1000 (3.5) | 0000.0111 | 0 | 0011.1111 | 1 | 0011.1111 (3 after Truncation) |
| 1100.1000 (−3.5) | 0000.0111 | 0 | 1100.1111 | 1 | 1101.1111 (−3 after Truncation) |

Second, the dynamic convergent rounding carry correction technique of an embodiment of the present invention is disclosed. Convergent rounding using carry correction technique requires a check on the ALU output 296 LSB as well as the binary fraction in order to make the correct decision. The Pattern Detector is set to detect XXXX0.1111 for the round to odd case. For round to even, the Pattern Detector detects XXXX1.1111. Whenever a pattern is detected, a '1' should be added to the P output 224 of the DSPE. This addition can be done in the fabric or another DSPE. If the user has a chain of computations to be done on the data stream, the carry correction style might fit into the flow better than the LSB correction style.

For dynamic rounding using carry correction, the implementation is different for round to odd and round to even. In the dynamic round to even case, when XXX1.1111 is detected, a carry should be generated. The SEL_ROUNDING_MASK 1264 should be set select mask 1274 to left shift by 2 C complement 1266. This makes the mask 1274 change dynamically with the C input decimal point. So when the C input is 0000.0111, the mask is 1110.0000. If the Pattern 1276 is all 1's by setting a User_Pattern 1290 set to all ones, then the PATTERN_DETECT 225 is a '1' whenever XXX1.1111 pattern is detected in ALU output 296. The carry correction bit is the PATTERN_DETECT output 225. The PATTERN_DETECT should be added to the truncated P output in the FPGA fabric in order to complete the rounding operation.

Examples of dynamic round to even are shown in Table 9.

TABLE 9

Round to Even (Pattern = xxx1.1111, Binary Place = 4)

| Multiplier Output (or the X-Mux plus Y/Z-Mux output) | C | P 224 = Multiplier Output + C | Pattern_Detect 225 | P 224 + Pattern_Detect bit 225 (done in fabric) |
|---|---|---|---|---|
| 0010.1000 (2.5) | 0000.0111 | 0010.1111 | 0 | 0010.1111 (2 after truncation) |
| 1101.1000 (−2.5) | 0000.0111 | 1101.1111 | 1 | 1110.0000 (−2 after truncation) |
| 0001.1000 (1.5) | 0000.0111 | 0001.1111 | 1 | 0010.0000 (2 after truncation) |
| 1110.1000 (−1.5) | 0000.0111 | 1110.1111 | 0 | 1110.1111 (−2 after truncation) |

In the dynamic round to odd case, a carry should be generated whenever XXX0.1111 is detected. SEL_ROUNDING_MASK 1264 is set to select the mask 1274 to left shift by 1 C complement 1268. This makes the mask change dynamically with the C input decimal point. So when the C input is 0000.0111, the mask is 1111.0000. If the PATTERN 1276 is set to all ones, then the PATTERN_DETECT 225 is a '1' whenever XXXX.1111 is detected. The carry correction bit needs to be computed in fabric, depending on the LSB of the truncated DSPE output P 224 and the PATTERN_DETECT signal 225. The LSB of P 224 after truncation should be a '0' and the PATTERN_DETECT 225 should be a '1' in order for the carry correction bit to be a '1'. This carry correction bit should then be added to the truncated P output of the DSPE in the FPGA fabric in order to complete the round. Examples of dynamic round to odd are shown in Table 10.

TABLE 10

Round to Odd (Pattern = xxx0.1111, Binary Place = 4)

| Multiplier Output(or the X-Mux plus Y/Z-Mux output) | C | P 224 = Multiplier Output + C | Pattern_Detect 225 | Carry Correction | P + Carry Correction (done in fabric) |
|---|---|---|---|---|---|
| 0010.1000 (2.5) | 0000.0111 | 0010.1111 | 1 | 1 | 0011.1111 (3 after Truncation) |
| 1101.1000 (−2.5) | 0000.0111 | 1101.1111 | 1 | 0 | 1101.1111 (−3 after Truncation) |
| 0011.1000 (3.5) | 0000.0111 | 0011.1111 | 1 | 0 | 0011.1111 (3 after Truncation) |
| 1100.1000 (−3.5) | 0000.0111 | 1100.1111 | 1 | 1 | 1101.1111 (−3 after Truncation) |

In another embodiment this scheme can be used with adder circuits to round add or accumulate operations, such as A:B+P (+C), where the C port is used for rounding the add operation using any of the schemes mentioned. In yet another embodiment both adds and multiplies or general computation operations can be rounded in this manner.

Figure 25:
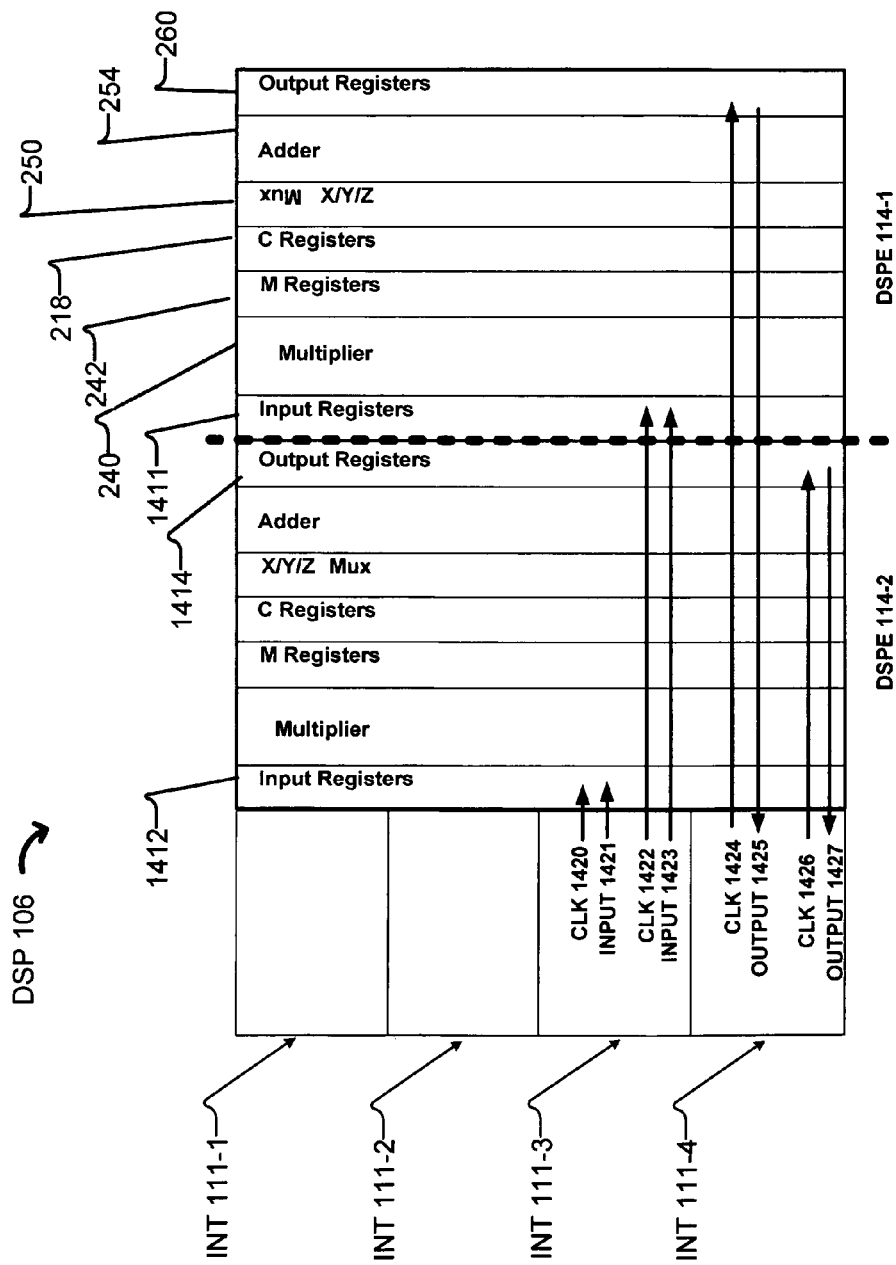
FIG. 25 is a simplified layout of a DSP of FIG. 1A of one embodiment of the present invention.

FIG. 25 is a simplified layout of a DSP 106 of FIG. 1A of one embodiment of the present invention. With reference to FIG. 2, DSP 106 has a column of four interconnect elements INT 111-1 to 111-4 (collectively, INT 111) adjacent to a first DSPE 114-2, which in turn is adjacent to DSPE 114-1, i.e., DSPE 114-2 is interposed between the interconnects INT 111 and the DSPE 114-1. For illustration purposes the labels in FIG. 2 are duplicated in FIG. 25 to show where some of the elements are physically laid out. For example, the input registers 1411 include the A registers 236 and 238 and the B registers 232 and 234 of DSPE 114-1. The input registers clock 1422 and the A and B data input 1423 goes to the input registers 1411 of DSPE 114-1. The output registers clock 1424 and the P data outputs 1425 goes to and comes from, the output registers 260 of DSPE 114-1. Similarly, the input registers clock 1420 and the A and B data input 1421 goes to the input registers 1412 of DSPE 114-2. The output registers clock 1426 and the P data outputs 1427 goes to and comes from, the output registers 1414 of DSPE 114-2. The location of the clock, input data, and output data lines are shown for ease of illustration in explaining the set-up time ($T_{set}$), hold time ($T_{hold}$), and clock-to-out time ($T_{cko}$) for the DSPE and are not necessarily located where shown.

The set-up time and hold time for the input data is proportional to the input clock time ($T_{clk\_in}$) minus the input data time ($T_{data-in}$), i.e., $$T_{hold} \alpha (T_{clk\_in} - T_{data\_in})$$

$$T_{set} \alpha - (T_{clk\_in} - T_{data\_in})$$

For example, one $T_{hold}$ is the clk 1420 time minus input 1421 time and a second $T_{hold}$ is the clk 1422 time minus input 1423 time. Because the delay for a clock 1422 to reach, for example, input registers 1411 from the interconnects INT 111 is substantially similar to the delay for input data 1423 to reach input registers 1411 from the interconnects INT 111, the $T_{hold}$ (also $T_{set}$)is small. Similarly, the $T_{hold}$ (also $T_{set}$)for the delay of clk 1420 minus the delay for input 1421 is small.

However, the clock-to-out time is proportional to the output clock time plus the output data time, i.e., $$T_{cko} \alpha (T_{clk\_out} + T_{data\_out})$$

Thus for example, in determining, in part, the DSPE 114-1 clock-to-out time, the time clk 1424 takes to reach output registers 260 from the interconnects INT 111 is added to the time it takes the output data 1425 to go from the output registers 260 to the interconnects INT 111. As another example, the DSPE 114-2 clock-to-out time is determined, in part, from adding the time clk 1426 takes to reach output registers 1414 from the interconnects INT 111 to the time it takes the output data 1427 to go from the output registers 1414 to the interconnects INT 111. As can be seen the clock-to-out time for DSPE 114-1 can be substantial.

FIG. 26 is a simplified layout of a DSP 117 of FIG. 1B of another embodiment of the present invention. With reference to FIG. 3 DSP 117 has a column of five interconnect elements INT 111'-1 to 111'-5 (collectively referred to as INT 111') adjacent to a first DSPE 118-1 and to DSPE 118-2, where DSPE 118-1 is placed on top of DSPE 118-2. For illustration purposes the labels in FIG. 3 are duplicated in FIG. 26 to show where some of the elements are physically laid out. The input registers 1450 include the A register block, e.g., 296, and the B register block, e.g., 294. The input registers 1456 include the A register block and the B register block of DSPE 118-2. The input registers clock 1461 and the A and B data input 1462 for both DSPE 118-1 go to the input registers 1450 of DSPE 118-1 from INT 111'. The input registers clock 1467 and the A and B data input 1468 for both DSPE 118-2 go to the input registers 1456 of DSPE 118-2 from INT 111'. The output registers clock 1463 and the P data output 1464 for DSPE 118-1 start/end at INT 111' and go to and come from the output registers 1452 of DSPE 118-1. The output registers clock 1465 and the P data output 1466 for DSPE 118-2 go to and come from the output registers 1454 of DSPE 118-2. The location of the clock, input data, and output data lines is for ease of illustration in explaining the set-up, hold, and clock-to-out timing for the DSPE and are not necessarily located where shown.

As illustrated by FIG. 26, the clk 1461 delay time and input data 1462 delay time are relatively the same and so the set-up time and hold time ($T_{set}$ and $T_{hold}$) for DSPE 118-1 is relatively small. Similarly, the clk 1467 delay time and input data 1468 delay time are relatively the same and so the set-up time and hold time ($T_{set}$ and $T_{hold}$) for DSPE 118-2 is also relatively small. The substantial difference between FIGS. 25 and 26 is the clock-to-out timing ($T_{cko}$) for a DSPE. As the output registers 1452 and 1454 are adjacent to the interconnect tiles INT 111', the sum of the output clock time, e.g., 1463/1465, plus the output data delay, e.g., 1464/1466, ($T_{clk\_out}$+ $T_{data\_out}$), gives a substantially smaller sum than the corresponding delays in FIG. 25, hence a substantially smaller clock-to-out time ($T_{cko}$) for both DSPE 118-1 and DSPE 118-2 than DSPE 114-1 and DSPE 114-2, respectively.

Thus one embodiment of the invention includes a physical layout for a digital signal processing (DSP) block 117 in an integrated circuit. With reference to FIG. 26 in this embodiment the physical layout may include: an interconnect column comprising a plurality of programmable interconnect elements 111'-1 to 111'-5; a first column adjacent to the interconnect column and comprising a first portion having first output registers, e.g., P 1452 and a second portion having second output registers, e.g., P 1454; a second column adjacent to the first column and comprising a first portion having a first arithmetic logic unit circuit, e.g., ALU 292, and a second portion having a second arithmetic logic unit circuit, e.g., ALU 1610; a third column adjacent to the second column and comprising a first portion having a first plurality of multiplexer circuits, e.g., X/Y/Z Muxs 250, and a second portion having a second plurality of multiplexer circuits, e.g., X/Y/Z Muxs 1612; a fourth column adjacent to the third column and comprising a first portion having a first input register, e.g., C 218-1, and a second portion having a second input register, e.g. C 1614; a fifth column adjacent to the fourth column and comprising a first portion having a first product registers, e.g., M 242, and a second portion having a second product registers, e.g., M 1618; a sixth column adjacent to the fifth column and comprising a first portion having a first multiplier, e.g., multiplier 241, and a second portion having a second multiplier 1620; and a seventh column adjacent to the sixth column and comprising a first portion having a first plurality of input registers 1450, and a second portion having a second plurality of input registers 1456. The first portions of the columns are part of DSPE 118-1 and the second portions of the columns are part of DSPE 118-2.

Figure 27:
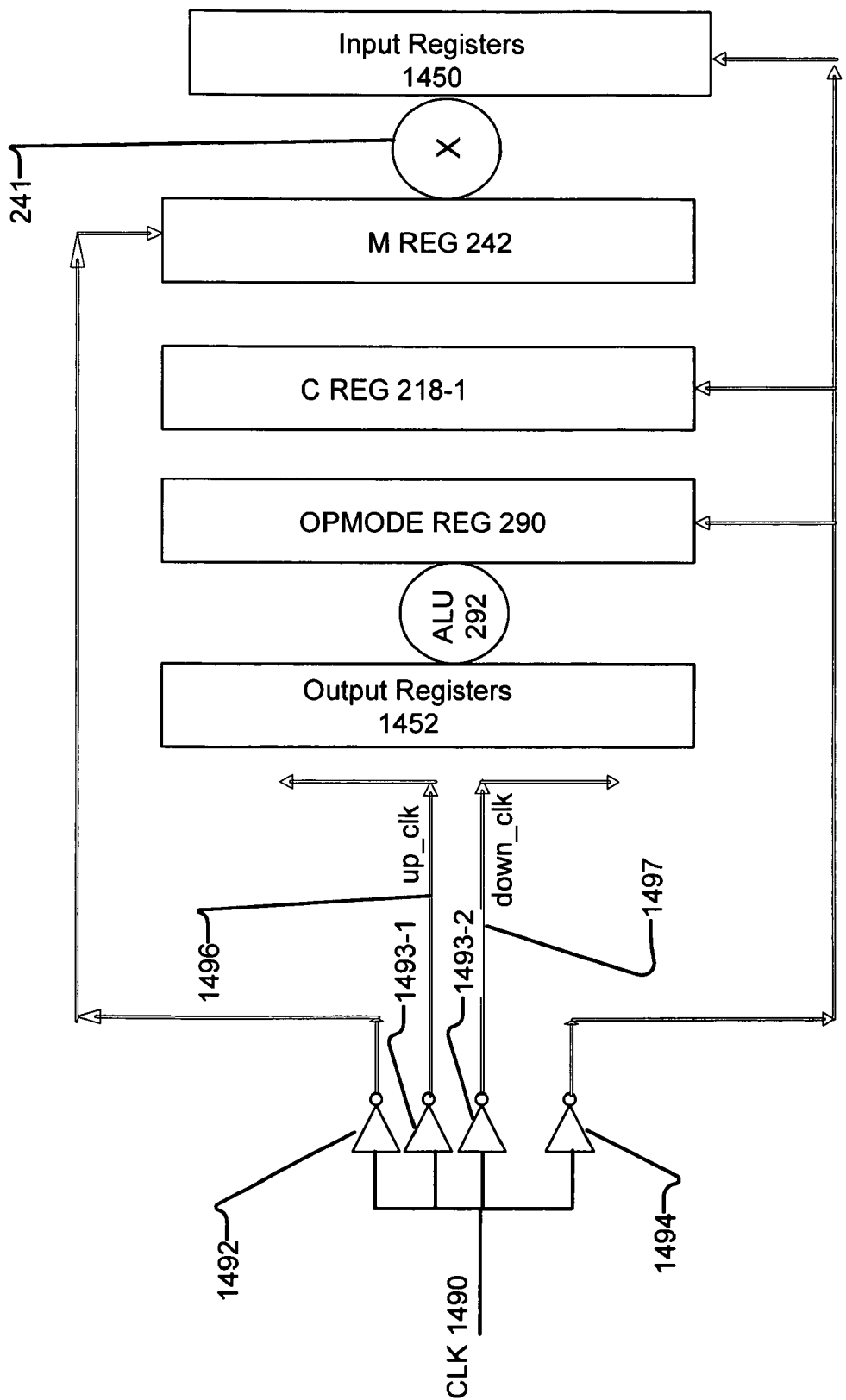
FIG. 27 shows some of the clock distribution for the DSPE of FIG. 26 of one embodiment of the present invention.

FIG. 27 shows some of the clock distribution for DSPE 118-1 of FIG. 26 of one embodiment of the present invention. The clock CLK 1490 includes both 1461 and 1463 of FIG. 26. The CLK 1490 is connected to several optional inverters 1492, 1493-1, 1493-2, and 1494. Optional inverters 1493-1 and 1493-2 can be combined in one embodiment. M registers 242 are coupled to optional inverter 1492 (which in one embodiment can be a programmable inverter configured to invert or to not invert). Output registers 1452 which include the P and P1-P4 registers have an up_clock 1496 from inverter 1493-1 providing an inverted CLK 1490 to the upper portion of output registers 1452 and a down_clock 1497 from inverter 1493-2 providing an inverted CLK 1490 to the lower portion of output registers 1452. Inverter 1494 is coupled to opmode register 290 (although not shown, inverter 1494 is also coupled to the carryin block 259 and ALUMode register 290), C register 218-1, and input registers 1450 (which include the A and B registers). A test feature (e.g., bypassing inverter 1492 or setting a programmable inverter 1492 not to invert) allows the M registers 242 to be triggered on the opposite clock edge than the clock edge of the input registers 1450 and the output registers 1452.

FIG. 28 is a schematic of a DSPE 1510 having a pre-adder block 1520 of an embodiment of the present invention. With reference to FIG. 3, the DSPE 1510 is similar to DSPE 118-1, except for the pre-adder block 1520. Also C signal line 243 in FIG. 3 is split into two parts: C' line 1522 which couples Mux 322-1 to pre-adder block 1520 and signal line 1524 which couples pre-adder block 1520 to Y-mux 250-2 and Z-mux 250-3 (C goes into pattern detect as well). One of the functions of the pre-adder block 1520 is to perform an initial addition or subtraction of the 30-bit A' 213-1 and the 48-bit C' 1522. Some of the other functions are similar or the same as Register A block 296 of FIG. 3. While pre-adder block 1520 is shown in FIG. 28 as replacing the Register A Block 296, in another embodiment a pre-adder block can replace the register B block 294 instead. In yet another embodiment pre-adder blocks can replace both the Register A block 296 and register B block 294.

Thus one embodiment of the present invention includes a Programmable Logic Device (PLD) having two cascaded DSP circuits. The first DSP circuit includes: a first pre-adder circuit (e.g., 1520) coupled to a first multiplier circuit (e.g., 241) and to a first set of multiplexers (e.g., 250), where the first set of multiplexers is controlled by a first opmode; and a first arithmetic logic unit (ALU) (e.g., 292) having a first adder circuit; and wherein the pre-adder circuit (e.g., 1520) has a second adder circuit. The second DSP circuit includes: a second pre-adder circuit coupled to a second multiplier circuit and to a second set of multiplexers, where the second set of multiplexers is controlled by a second opmode; and a second arithmetic logic unit (ALU) having a third adder circuit; and wherein the second pre-adder circuit comprises a fourth adder circuit and is coupled to the first pre-adder circuit (e.g., 1520).

FIG. 29 is a schematic of a pre-adder block 1520-1 of an embodiment of the present invention. Pre-adder block 1520-1 is one implementation of pre-adder block 1520 of FIG. 28. The 30 bit A input 212 is input via A' 213-1 along with the 48-bit C' 1522 into pre-adder block 1520-1. A' 213-1 is sent to flip-flop 1540, multiplexer 1542 and multiplexer 1546. C' 1522 is sent to adder/subtracter 1530 (similar to ALU 292 in adder mode) and multiplexer 1532. In another embodiment adder/subtracter 1530 can be implemented using adder/subtracter 254 of FIG. 2 as described in U.S. patent application Ser. No. 11/019,518, entitled "Applications of Cascading DSP Slices", by James M. Simkins, et al., filed Dec. 21, 2004, which is herein incorporated by reference. The output of multiplexer 1542 is sent to adder/subtracter 1530, multiplexer 1550 and flip-flop 1544. Adder/subtracter 1530 adds or subtracts C' 1522 from the output of multiplexer 1542 and sends the result to multiplexer 1532. The output of multiplexer 1532 goes to flip-flop 1534, which in turn goes to output signal 1524 and to multiplexer 1536. The output of multiplexer 1546 goes to multiplexer 1550 and multiplexer 1536. The output of multiplexer 1550 is ACOUT 221. The output of multiplexer 1536 is QA 297. The select lines for multiplexers 1534, 1536, 1540, 1544, and 1550 are set by configuration memory cells in one embodiment. In another embodiment they are dynamically set via one or more registers. In yet another embodiment the flip-flops 1540, 1544, and 1534 are registers.

FIG. 30 is a schematic of a pre-adder block 1520-2 of another embodiment of the present invention. Pre-adder block 1520-2 is a second implementation of pre-adder block 1520 of FIG. 28. The 30 bit A input 212 is input via A' 213-1 along with the 48-bit C' 1522 into pre-adder block 1520-1. A'

213-1 is sent to flip-flop 1540, multiplexer 1542 and multiplexer 1546. C' 1522 is sent to adder/subtracter 1530 (similar to ALU 292 in adder mode), flip-flop 1558, and multiplexer 1556. The output of multiplexer 1542 is sent to adder/subtracter 1530, multiplexer 1550, and multiplexer 1560. Adder/subtracter 1530 adds or subtracts C' 1522 from the output of multiplexer 1542 and sends the result to multiplexer 1560. The output of multiplexer 1560 goes to flip-flop 1554, which in turn goes to multiplexer 1546. The output of multiplexer 1546 goes to multiplexer 1550 and QA 297. The output of multiplexer 1550 is ACOUT 221. The output of multiplexer 1556 is signal 1524. The select lines for multiplexers 1542, 1546, 1550, 1554, and 1556 are set by configuration memory cells in one embodiment. In another embodiment they are dynamically set via one or more registers. In yet another embodiment the flip-flops 1540, 1554, and 1558 are registers.

Figure 31:
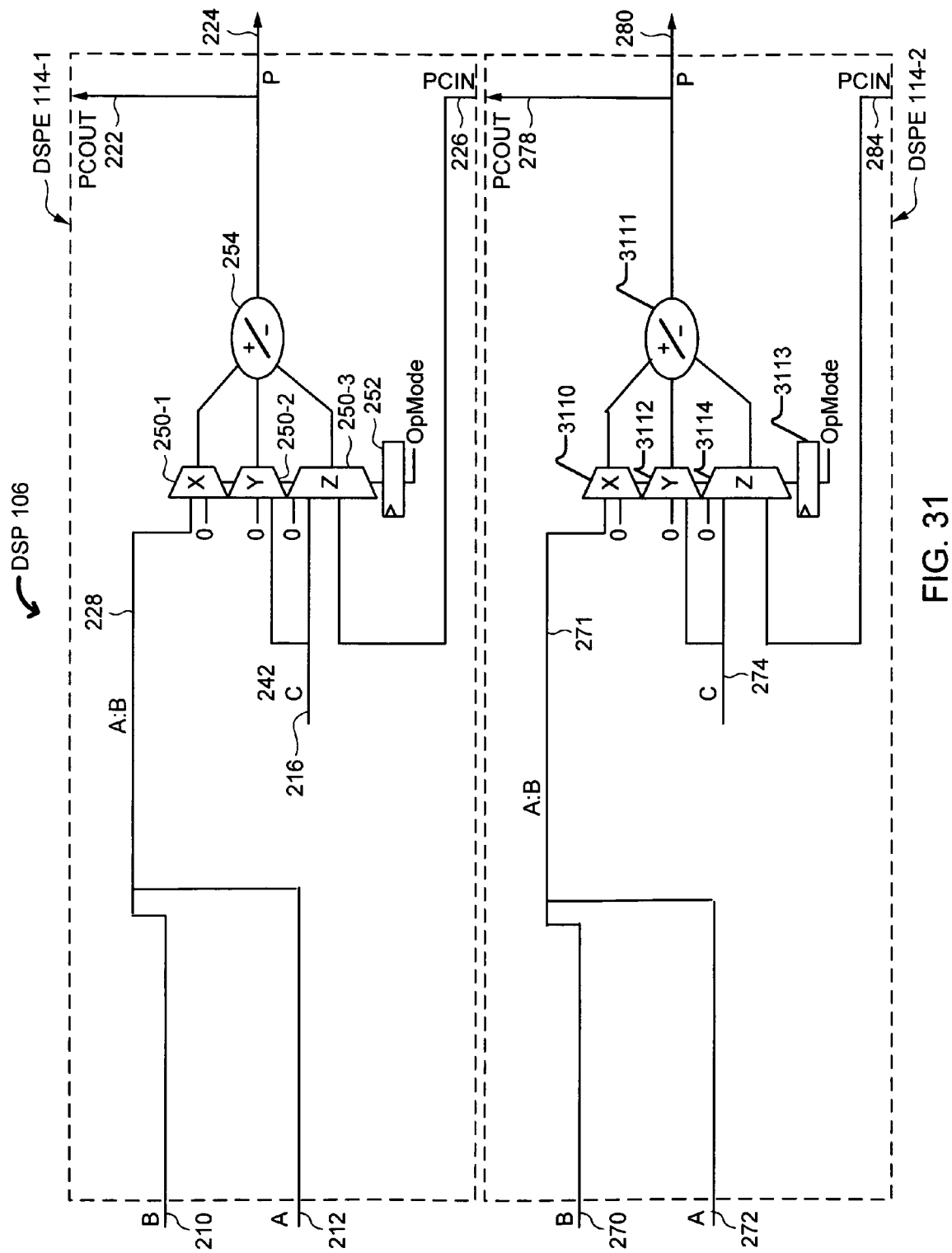
FIG. 31 is a substantially simplified FIG. 2 to illustrate a wide multiplexer formed from two DSPE.

FIG. 31 is a substantially simplified FIG. 2 to illustrate a wide multiplexer formed from two DSPEs (114-1 and 114-2). Inputs A 212 and B 210 are concatenated to form A:B 228. Inputs A 272 and B 270 are concatenated to form A:B 271. From FIGS. 2 and 10, Opmode OM[1:0] selects one of four inputs to X-Mux 250-1, Opmode OM[3:2] selects one of four inputs to Y-Mux 250-2, Opmode OM[6:4] selects one of six inputs to Z-Mux 250-3. For DSPE 114-1 used as a multiplexer, X-Mux 250-1 selects between A:B 228 and 0 using Opmode[1:0], Y-Mux 250-2 selects between C 242 and 0 using Opmode[3:2], and Z-Mux 250-3 selects between C 242, PCIN 226 (the multiplexer output P 280 of DSPE 114-2) and 0 using Opmode[6:4], where Opmode[6:0] is stored in Opmode register 252.

One example of a use of DSP 106 as a wide multiplexer is X-mux 3110 selecting A:B 271 (Opmode[1:0]=11), Y-Mux 3112 selecting 0 (Opmode[3:2]=00, and Z-Mux 3114 selecting 0 (Opmode[6:4]=000), where Opmode[6:0] for DSPE 114-2 is stored in Opmode register 3113. The output P 280 of adder 3111 (A:B+0+0) is A:B, which is input via PCIN 226 (coupled to PCOUT 278) to Z-mux 250-3. The X,Y, and Z multiplexers 250 will select between inputs A:B 228, C 242, and PCIN 226 (A:B 271). From Table 2 above, when Opmode[6:0] 252 is "0010000" then PCIN 226 is selected and output as P 224; when Opmode[6:0] 252 is "0001100" then C 216 is selected and output as P 224; and when Opmode[6:0] 252 is "0000011" then A:B 228 is selected and output as P 224. Thus the wide multiplexer DSP 106 selects between A:B 271, C 216, and A:B 228. In another embodiment such as shown by FIG. 3, the C inputs 274 and 216 can be separate and the wide multiplexer can select between C 274, A:B 271, C 216, and A:B 228.

As illustrated by FIG. 31 above, one embodiment of the present invention can include a method for multiplexing a plurality of inputs (e.g., C 274, A:B 271, C 216, and A:B 228) to produce a selected final output (e.g., P 224). The method includes: selecting a first plurality of output signals from a first plurality of multiplexers (e.g., 3110, 3112, 3114), wherein the first plurality of multiplexers receives a first set of the plurality of inputs; adding (via e.g., 3111) together the first plurality of output signals to produce a summation output (e.g., P 280); selecting a second plurality of output signals from a second plurality of multiplexers (e.g., 250-1, 250-2, 250-3), wherein the second plurality of multiplexers receives a second set of the plurality of inputs and the summation output (PCIN 226); and adding together (via, e.g., adder 254) the second plurality of output signals to produce the selected final output (e.g., P 224).

Figure 32:
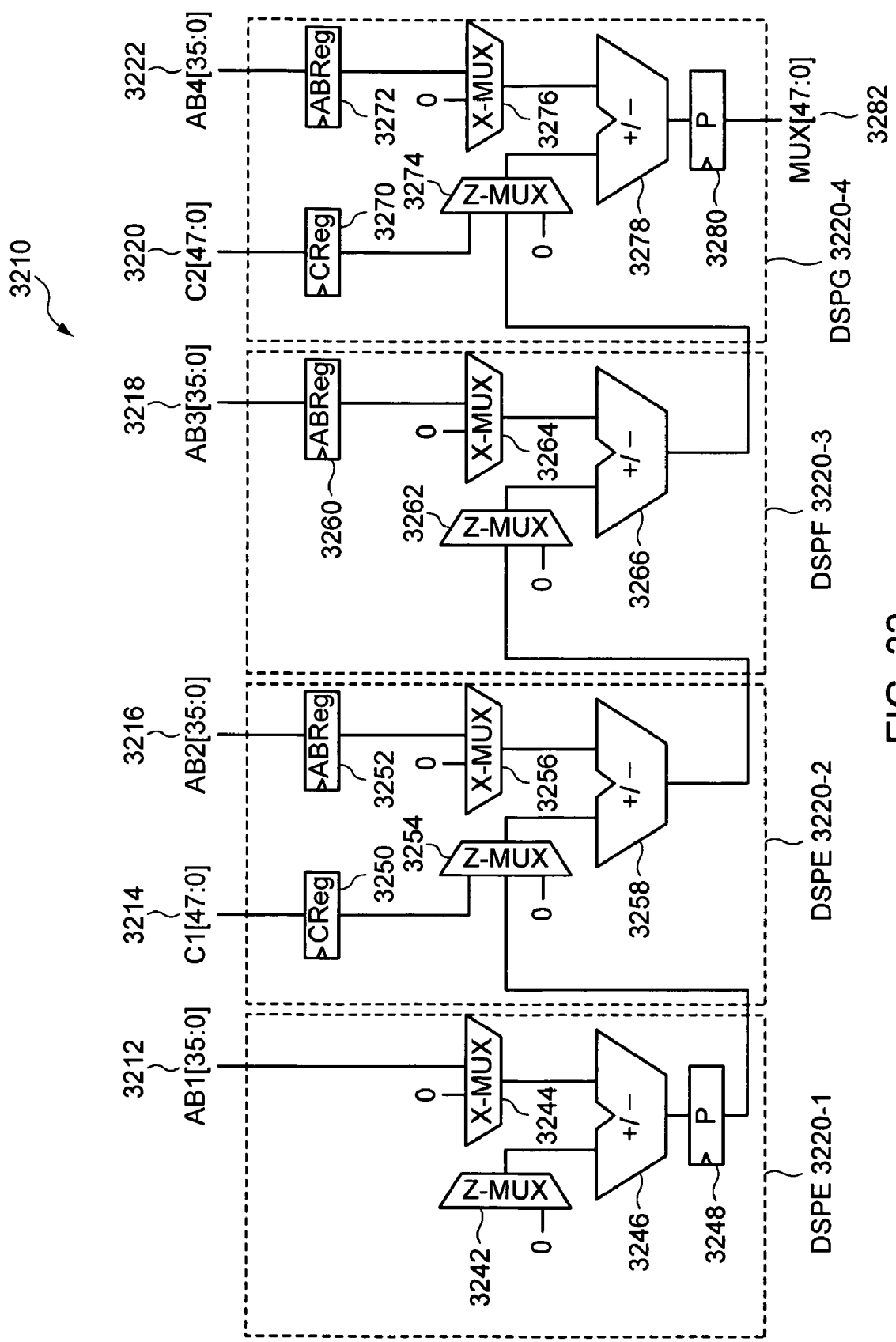
FIG. 32 is a block diagram of four DSPEs configured as a wide multiplexer.

FIG. 32 is a block diagram of four DSPEs configured as a wide multiplexer 3210. The inputs to the wide 6:1 multiplexer are AB1[35:0] 3212, C1[47:0] 3214, AB2[35:0] 3216, AB3[35:0] 3218, C2[47:0] 3220, and AB4[35:0] 3222. The output MUX[47:0] 3282 of the wide multiplexer 3210 is one of these six inputs, and may or may not, as needed, have its bits signed extended.

Each of the four DSPEs 3220-1 to 3220-4 is the same as or similar to DSPE 118-1 of FIG. 3. Each of the ALUs 3246, 3258, 3266, and 3278 are configured as adders. Z-Mux 3242 receives a 0 input and is coupled to adder 3246. X-Mux 3244 receives as input 0 and AB1 [35:0] 3212 and is coupled to adder 3246. Adder 3246 has its output stored in P register 3248. Z-Mux 3254 receives a 0 input, the value in P register 3248 and the value C1[47:0] 3214 stored in C register 3250, where Z-Mux 3254 is coupled to adder 3258. X-Mux 3256 receives as input 0 and AB2[35:0] 3216 via AB register 3252, where X-Mux 3256 is coupled to adder 3258. Adder 3258 has its output coupled to Z-Mux 3262, which also receives a 0 input. Z-Mux 3262 is coupled to adder 3266. X-Mux 3264 receives as input 0 and AB3[35:0] 3218 via AB register 3260, where X-Mux 3264 is coupled to adder 3266. Adder 3266 has its output coupled to Z-Mux 3274, which also receives a 0 input and C2[47:0] 3220 via C register 3270. Z-Mux 3274 is coupled to adder 3278. X-Mux 3276 receives as input 0 and AB4[35:0] 3222 via AB register 3272, where X-Mux 3276 is coupled to adder 3278. Adder 3278 has its output stored in P register 3280, which gives the output Mux[47:0] 3282.

One embodiment of the present invention includes a wide multiplexer circuit (e.g., FIG. 32) having a plurality of cascaded digital signal processing elements (e.g., DSPE 3220-1 to 3220-4). The wide multiplexer circuit includes: (1) a first digital signal processing element (e.g., DSPE 3220-1) comprising a first input (e.g., AB1[35:0] 3212) coupled to a first multiplexer (e.g., X-Mux 3244), the first multiplexer coupled to a first arithmetic logic unit (e.g., ALU 3246) configured as a first adder; (2) a second digital signal processing element (e.g., DSPE 3220-2) comprising a second multiplexer (e.g., Z-Mux 3254) and a third multiplexer (e.g., X-Mux 3256), the second and third multiplexers coupled to a second arithmetic logic unit (e.g., ALU 3258) configured as a second adder, the first adder (e.g., 3246) coupled to the second multiplexer (e.g., Z-Mux 3254); and (3) a second input (e.g., AB2[35:0] 3216) coupled to the third multiplexer (e.g., X-Mux 3256); and (4) wherein an output of the second adder (e.g., ALU 3258) is selected from at least the first input (e.g., AB1[35:0] 3212) and the second input (e.g., AB2[35:0] 3216). The wide multiplexer circuit may further have the second multiplexer coupled to a third input (e.g., C1[47:0]) and wherein the output of the second adder is selected from the first input, the second input, and the third input. Optionally, the first, second, and third inputs may be registered inputs (for example, ABreg (not shown) for AB1 3212, CReg 3250 for C1 3214, and ABReg 3252 for AB2 3216).

Although the invention has been described in connection with several embodiments, it is understood that this invention is not limited to the embodiments disclosed, but is capable of various modifications, which would be apparent to one of ordinary skill in the art. Thus, the invention is limited only by the following claims.

What is claimed is:

1. An integrated circuit (IC) having a digital signal processing (DSP) circuit, the DSP circuit comprising:
a plurality of multiplexers receiving a first set, second set; and third set of input data bits, the plurality of multiplexers coupled to a first opcode register;
a first bitwise adder coupled to the plurality of multiplexers for generating a sum set of bits and a carry set of bits from bitwise adding together the first, second, and third set of input data bits; and a second adder coupled to the bitwise adder for adding together the sum set of bits and carry set of bits to produce a summation set of bits and a plurality of carry-out bits, the second adder coupled to a second opcode register.

2. The DSP circuit of claim 1 wherein the second adder comprises a carry look ahead adder.

3. The DSP circuit of claim 2 wherein the sum set of bits have two zero bits appended and the carry set of bits have one zero appended before being sent to the carry look ahead adder for addition.

4. The DSP circuit of claim 1 wherein the carry set of bits includes a carry-in bit to the second adder.

5. The DSP circuit of claim 4 further comprising a multiplier circuit coupled to the plurality of multiplexers, the multiplier circuit multiplying a multiplicand operand with a multiplier operand to produce a product.

6. The DSP circuit of claim 5 further comprising a carry-in multiplexer coupled to the second adder for producing the carry-in bit, the carry-in multiplexer controlled by a set of carry-in select bits.

7. The DSP circuit of claim 6 wherein the set of carry-in select bits is programmed by one or more configuration memory cells or registers.

8. The DSP circuit of claim 6 wherein the carry-in multiplexer selects the carry-in bit from a group consisting of an external carry-in bit, a carry-out from an adder in an another DSP circuit, a carry-out bit of the plurality of carry-out bits, a most significant bit (MSB) of the summation set of bits, a MSB of a summation set of bits from the adder in the another DSP circuit, and a result of a MSB of the multiplicand operand XNOR a MSB of the multiplier operand.

9. The DSP circuit of claim 8 wherein the external carry-in bit is from the programmable logic of a field programmable gate array.

10. The IC of claim 1 further comprising a second DSP circuit, the second DSP circuit comprising:
a third bitwise adder producing a second sum set of bits and a second carry set of bits; and
a fourth adder adding together the second sum set of bits and the second carry set of bits to produce a second summation set of bits and a second plurality of carry-out bits; and
wherein the second carry set of bits includes a bit from the plurality of carry-out bits from the second adder.

11. The IC of claim 10 wherein the fourth adder is coupled to a third opcode register.

12. An integrated circuit (IC) having two cascaded digital signal processing elements (DSPEs) comprising:
a first DSPE comprising:
a first set of multiplexers controlled by a first opcode; and
a first arithmetic logic unit (ALU) coupled to the first set of multiplexers and controlled by a second opcode, the first ALU comprising a first adder that generates a first set of sum bits and a first set of carry-out bits; and a second DSPE comprising:
a second set of multiplexers controlled by a third opcode; and
a second arithmetic logic unit (ALU) coupled to the second set of multiplexers and controlled by a fourth opcode, the second ALU comprising a second adder configured to receive at least one carry-out bit of the first set of carry-out bits and to generate a second set of sum bits and a second set of carry-out bits.

13. The integrated circuit (IC) of claim 12 further comprising a multiplier coupled to the first set of multiplexers.

14. The integrated circuit (IC) of claim 13 wherein an output of the first adder is coupled to a multiplexer of the first set of multiplexers and an output of the second adder is coupled to a multiplexer of the second set of multiplexers.

15. An integrated circuit (IC) having a plurality of digital signal processing (DSP) circuits for performing an extended multiply accumulate operation, the IC comprising:
a first DSP circuit comprising:
a multiplier coupled to a first set of multiplexers; and
a first adder coupled to the first set of multiplexers, the first adder producing a first set of sum bits and a first and a second carry-out bit, the first set of sum bits stored in a first output register, the first output register coupled to a multiplexer of the first set of multiplexers; and
a second DSP circuit comprising:
a second set of multiplexers coupled to a second adder, the second adder coupled to a second output register and the first carry-out bit, the second out put register coupled to a first subset of multiplexers of the second set of multiplexers;
a second subset of multiplexers of the second set of multiplexers receiving a first constant input; and
a third subset of multiplexers of the second set of multiplexers, wherein a multiplexer of the third subset of multiplexers is coupled to an AND gate, the AND gate receiving a special opmode and the second carry-out bit, and the other multiplexers of the third subset receiving a second constant input.

16. The IC of claim 15 wherein the first constant input includes a one and the second constant input includes a zero.

17. The IC of claim 15 wherein the multiplexer of the third subset of multiplexers provides the second least significant bit of the data provided by the third set to the adder.

18. The integrated circuit (IC) of claim 15 wherein the first set of multiplexers is controlled by a first opmode and the second set of multiplexers is controlled by a second opmode, the second opmode including the special opmode.

19. The integrated circuit (IC) of claim 15 wherein the first carry-out bit is stored in a third register and the second carry-out bit is stored in a fourth register.

20. The integrated circuit (IC) of claim 15 wherein the first adder is controlled by a first ALUmode register and the second adder is controlled by a second ALUmode register.

* * * * *